United States Patent
Ooshima et al.

(10) Patent No.: US 11,704,218 B2
(45) Date of Patent: Jul. 18, 2023

(54) INFORMATION PROCESSING APPARATUS AND INFORMATION PROCESSING METHOD TO ANALYZE A STATE OF DYNAMIC RANDOM ACCESS MEMORY (DRAM)

(71) Applicant: CANON KABUSHIKI KAISHA, Tokyo (JP)

(72) Inventors: Hiroyoshi Ooshima, Yokohama (JP); Tetsuo Uchiyama, Chiba (JP)

(73) Assignee: Canon Kabushiki Kaisha, Tokyo (JP)

( * ) Notice: Subject to any disclaimer, the term of this patent is extended or adjusted under 35 U.S.C. 154(b) by 589 days.

(21) Appl. No.: 16/852,246

(22) Filed: Apr. 17, 2020

(65) Prior Publication Data
US 2020/0341879 A1    Oct. 29, 2020

(30) Foreign Application Priority Data
Apr. 24, 2019    (JP) .................. 2019-083241

(51) Int. Cl.
G06F 11/32    (2006.01)
G06F 11/30    (2006.01)
G11C 11/4076    (2006.01)
G11C 11/406    (2006.01)

(52) U.S. Cl.
CPC ........ *G06F 11/322* (2013.01); *G06F 11/3027* (2013.01); *G06F 11/3037* (2013.01); *G11C 11/4076* (2013.01); *G11C 11/40622* (2013.01)

(58) Field of Classification Search
CPC . G06F 11/322; G06F 11/3027; G06F 11/3037
USPC .......................................................... 714/46
See application file for complete search history.

(56) References Cited

U.S. PATENT DOCUMENTS

2019/0146694 A1*    5/2019    Parikh .............. G11C 11/4096
                                                    711/105

FOREIGN PATENT DOCUMENTS

JP    2009-266237 A    11/2009

\* cited by examiner

*Primary Examiner* — Yair Leibovich
(74) *Attorney, Agent, or Firm* — Canon U.S.A., Inc. I.P. Divison

(57) ABSTRACT

An information processing apparatus includes a detection unit and first and second classification units. The detection unit detects an event which causes a state of at least one bank constituting dynamic random access memory (DRAM) to transition. The first classification unit classifies the at least one bank state based on the detected event. The second classification unit classifies a DRAM state based on the at least one bank state. Statistical information that is based on the at least one bank or DRAM state is displayed with respect to a predetermined unit time. The at least one bank state and the DRAM state each includes at least one of the following: an operating state, in which data is being transferred, an inoperative state, in which data transfer is not possible due to a predetermined constraint, or a pause state, in which, although there is no constraint, data is not being transferred.

20 Claims, 43 Drawing Sheets

| | | | Current Command | | | | |
|---|---|---|---|---|---|---|---|
| | | | ACT | PRE | RD | WR | UNDEF |
| Pre Command | Same Bank | ACT | — | — | 30 | 30 | — |
| | | PRE | 40 | — | — | — | — |
| | | RD | — | 50 | — | 15 | — |
| | | WR | — | 60 | 10 | — | — |
| | Different Bank | ACT | 4 | — | — | — | — |
| | | PRE | — | — | — | — | — |
| | | RD | — | — | — | 15 | — |
| | | WR | — | — | 10 | — | — |
| | UNDEF | | — | — | — | — | — |

FIG.4

401 — CK  CLOCK
402 — CKE  CLOCK ENABLE
403 — CS
404 — RAS
405 — CAS
406 — WE
407 — BA[2:0]  BANK ADDRESS
408 — A[15:0]  ADDRESS

FIG. 5

| Function | Abbreviation | CKE Previous Cycle | CKE Current Cycle | CS# | RAS# | CAS# | WE# | BA0-BA2 | A13-A15 | A12-BC# | A10-AP | A0-A9,A11 |
|---|---|---|---|---|---|---|---|---|---|---|---|---|
| Mode Register Set | MRS | H | H | L | L | L | L | BA | V | V | V | OP Code |
| Refresh | REF | H | H | L | L | L | H | V | V | V | V | V |
| Self Refresh Entry | SRE | H | L | L | L | L | H | X | X | X | X | X |
| Self Refresh Exit | SRX | L | H | H | X | X | X | X | X | X | X | X |
|  |  |  |  | L | H | H | H | V | V | V | V | V |
| Single Bank Precharge | PRE | H | H | L | L | H | L | BA | V | V | L | V |
| Precharge all Banks | PREA | H | H | L | L | H | L | V | V | V | H | V |
| Bank Activate | ACT | H | H | L | L | H | H | BA | V | Row Address (RA) | | |
| Write (Fixed BL8 or BC4) | WR | H | H | L | H | L | L | BA | RFU | V | L | CA |
| Write (BC4, on the Fly) | WRS4 | H | H | L | H | L | L | BA | RFU | L | L | CA |
| Write (BL8, on the Fly) | WRS8 | H | H | L | H | L | L | BA | RFU | H | L | CA |
| Write with Auto Precharge (Fixed BL8 or BC4) | WRA | H | H | L | H | L | L | BA | RFU | V | H | CA |
| Write with Auto Precharge (BC4, on the Fly) | WRAS4 | H | H | L | H | L | L | BA | RFU | L | H | CA |
| Write with Auto Precharge (BL8, on the Fly) | WRAS8 | H | H | L | H | L | L | BA | RFU | H | H | CA |
| Read (Fixed BL8 or BC4) | RD | H | H | L | H | L | H | BA | RFU | V | L | CA |
| Read (BC4, on the Fly) | RDS4 | H | H | L | H | L | H | BA | RFU | L | L | CA |
| Read (BL8, on the Fly) | RDS8 | H | H | L | H | L | H | BA | RFU | H | L | CA |
| Read with Auto Precharge (Fixed BL8 or BC4) | RDA | H | H | L | H | L | H | BA | RFU | V | H | CA |
| Read with Auto Precharge (BC4, on the Fly) | RDAS4 | H | H | L | H | L | H | BA | RFU | L | H | CA |
| Read with Auto Precharge (BL8, on the Fly) | RDAS8 | H | H | L | H | L | H | BA | RFU | H | H | CA |
| No Operation | NOP | H | H | L | H | H | H | V | V | V | V | V |
| Device Deselected | DES | H | H | H | X | X | X | X | X | X | X | X |
| Power Down Entry | PDE | H | L | H | X | X | X | X | X | X | X | X |
|  |  |  |  | L | H | H | H | V | V | V | V | V |
| Power Down Exit | PDX | L | H | H | X | X | X | X | X | X | X | X |
|  |  |  |  | L | H | H | H | V | V | V | V | V |
| ZQ Calibration Long | ZQCL | H | H | L | H | H | L | X | X | X | H | X |
| ZQ Calibration Short | ZQCS | H | H | L | H | H | L | X | X | X | L | X |

FIG.6

| | Occurrence Time (601) | Command (602) | Bank Address (603) | Row Address (604) | Column Address (605) |
|---|---|---|---|---|---|
| 610 | 1000, | ACT, | BANK = 0, | ROW = 0100 | |
| 611 | 5000, | ACT, | BANK = 1, | ROW = 0010 | |
| 612 | 31000, | RD, | BANK = 0, | ROW = 0100, | COL = 0010 |
| 613 | 35000, | RD, | BANK = 0, | ROW = 0100, | COL = 0018 |
| 614 | 40000, | RD, | BANK = 0, | ROW = 0100, | COL = 0080 |
| 615 | 55000, | WR, | BANK = 1, | ROW = 0010, | COL = 0020 |
| 616 | 59000, | WR, | BANK = 1, | ROW = 0010, | COL = 0028 |
| 617 | 63000, | WR, | BANK = 1, | ROW = 0010, | COL = 0030 |
| 618 | 73000, | RD, | BANK = 1, | ROW = 0010, | COL = 0020 |
| 619 | 77000, | RD, | BANK = 1, | ROW = 0010, | COL = 0028 |
| 620 | 89000, | RD, | BANK = 1, | ROW = 0010, | COL = 0040 |
| 621 | 90000, | PRE, | BANK = 0 | | |
| 622 | 93000, | RD, | BANK = 1, | ROW = 0010, | COL = 0048 |
| 623 | 97000, | RD, | BANK = 1, | ROW = 0010, | COL = 0050 |
| 624 | 101000 | RD, | BANK = 1, | ROW = 0010, | COL = 0058 |
| 625 | 105000 | RD, | BANK = 1, | ROW = 0010, | COL = 0060 |
| 626 | 109000 | RD, | BANK = 1, | ROW = 0010, | COL = 0068 |
| 627 | 113000 | RD, | BANK = 1, | ROW = 0010, | COL = 0070 |
| 628 | 117000 | RD, | BANK = 1, | ROW = 0010, | COL = 0078 |
| 629 | 121000 | RD, | BANK = 1, | ROW = 0010, | COL = 0080 |
| 630 | 125000 | RD, | BANK = 1, | ROW = 0010, | COL = 0088 |
| 631 | 129000 | RD, | BANK = 1, | ROW = 0010, | COL = 0090 |
| 632 | 130000, | ACT, | BANK = 0, | ROW = 0200 | |
| 633 | 200000, | WR, | BANK = 0, | ROW = 0200, | COL = 0100 |
| 634 | 204000, | WR, | BANK = 0, | ROW = 0200, | COL = 0108 |
| 635 | 214000, | RD, | BANK = 0, | ROW = 0200, | COL = 0100 |
| 636 | 229000, | WR, | BANK = 0, | ROW = 0200, | COL = 0140 |
| 637 | 289000, | PRE, | BANK = 0 | | |
| 638 | 289000, | PRE, | BANK = 1 | | |
| 651 | 19999000, | RD, | BANK = 0, | ROW = 0400, | COL = 00c0 |
| 652 | 20003000, | RD, | BANK = 0, | ROW = 0400, | COL = 0720 |

FIG.8

| | | | Current Command | | | | |
|---|---|---|---|---|---|---|---|
| | | | ACT | PRE | RD | WR | UNDEF |
| Pre Command | Same Bank | ACT | — | — | 30 | 30 | — |
| | | PRE | 40 | — | — | — | — |
| | | RD | — | 50 | — | 15 | — |
| | | WR | — | 60 | 10 | — | — |
| | Different Bank | ACT | 4 | — | — | — | — |
| | | PRE | — | — | — | — | — |
| | | RD | — | — | — | 15 | — |
| | | WR | — | — | 10 | — | — |
| | UNDEF | | — | — | — | — | — |

FIG.11

|  | NUMBER OF OCCURRENCES | NUMBER OF OCCURRENCE CYCLES |
|---|---|---|
| OPERATING STATE | 7 TIMES | 28 CYCLES |
| INOPERATIVE STATE | 6 TIMES | 189 CYCLES |
| PAUSE STATE | 3 TIMES | 72 CYCLES |

FIG.18

| | DETAILED CLASSIFICATION | |
|---|---|---|
| OPERATING STATE | READ OPERATING STATE | ~1801 |
| | WRITE OPERATING STATE | ~1802 |
| INOPERATIVE STATE | ACTIVATE INOPERATIVE STATE | ~1803 |
| | PRECHARGE INOPERATIVE STATE | ~1804 |
| | Write-to-Precharge INOPERATIVE STATE | ~1805 |
| | Read-to-Precharge INOPERATIVE STATE | ~1806 |
| | REFRESH INOPERATIVE STATE | ~1807 |
| | Read-to-Write SWITCHING INOPERATIVE STATE | ~1808 |
| | Write-to-Read SWITCHING INOPERATIVE STATE | ~1809 |

FIG.22

2201 — aclk
2202 — araddr[31:0]
2203 — arready
2204 — arvalid
2205 — arburst[1:0]
2206 — arlen[7:0]
2207 — arsize[2;0]
2208 — awaddr[31:0]
2209 — awready
2210 — awvalid
2211 — awburst[1:0]
2212 — awlen[7:0]
2213 — awsize[2:0]

FIG.24

| | | | | |
|---|---|---|---|---|
| 2410 ~ | 3000, | mst = 0, araddr = 00080010, | arburst = INCR, | arlen = 1, arsize = 3 |
| 2411 ~ | 10000, | mst = 0, araddr = 00080080, | arburst = INCR, | arlen = 0, arsize = 3 |
| 2412 ~ | 20000, | mst = 3, awaddr = 08008020, | awburst = INCR, | awlen = 1, awsize = 3 |
| 2413 ~ | 24000, | mst = 3, awaddr = 08008030, | awburst = INCR, | awlen = 0, awsize = 3 |
| 2414 ~ | 50000, | mst = 2, araddr = 08008020, | arburst = INCR, | arlen = 0, arsize = 3 |
| 2415 ~ | 78000, | mst = 2, araddr = 08008040, | arburst = INCR, | arlen = 7, arsize = 3 |
| 2416 ~ | 92000, | mst = 2, araddr = 08008080, | arburst = INCR, | arlen = 1, arsize = 3 |
| 2417 ~ | 120000, | mst = 2, araddr = 08008090, | arburst = INCR, | arlen = 0, arsize = 3 |
| 2418 ~ | 190000, | mst = 1, awaddr = 00100100, | awburst = INCR, | awlen = 1, awsize = 3 |
| 2419 ~ | 210000, | mst = 2, araddr = 00100100, | arburst = INCR, | arlen = 1, arsize = 3 |
| 2420 ~ | 215000, | mst = 1, awaddr = 00100140, | awburst = INCR, | awlen = 0, awsize = 3 |
| 2451 ~ | 19980000, | mst = 0, araddr = 002000c0, | arburst = INCR, | arlen = 0, arsize = 3 |
| 2452 ~ | 19995000, | mst = 0, araddr = 00200720, | arburst = INCR, | arlen = 0, arsize = 3 |

FIG.25

|  | 2501 |  |  |  |  | 2502 |
|---|---|---|---|---|---|---|
|  | QUEUE NUMBER |  |  |  |  | MASTER INFORMATION |

| | | | | | |
|---|---|---|---|---|---|
| 2510 — 1. | RD, | BANK = 0, | ROW = 0100, | COL = 0010, | mst = 0 |
| 2511 — 2. | RD, | BANK = 0, | ROW = 0100, | COL = 0018, | mst = 0 |
| 2512 — 3. | RD, | BANK = 0, | ROW = 0100, | COL = 0080, | mst = 0 |
| 2513 — 4. | WR, | BANK = 1, | ROW = 0010, | COL = 0020, | mst = 3 |
| 2514 — 5. | WR, | BANK = 1, | ROW = 0010, | COL = 0028, | mst = 3 |
| 2515 — 6. | WR, | BANK = 1, | ROW = 0010, | COL = 0030, | mst = 3 |
| 2516 — 7. | RD, | BANK = 1, | ROW = 0010, | COL = 0020, | mst = 2 |
| 2517 — 8. | RD, | BANK = 1, | ROW = 0010, | COL = 0028, | mst = 2 |
| 2518 — 9. | RD, | BANK = 1, | ROW = 0010, | COL = 0040, | mst = 2 |
| 2519 — 10. | RD, | BANK = 1, | ROW = 0010, | COL = 0048, | mst = 2 |
| 2520 — 11. | RD, | BANK = 1, | ROW = 0010, | COL = 0050, | mst = 2 |
| 2521 — 12. | RD, | BANK = 1, | ROW = 0010, | COL = 0058, | mst = 2 |
| 2522 — 13. | RD, | BANK = 1, | ROW = 0010, | COL = 0060, | mst = 2 |
| 2523 — 14. | RD, | BANK = 1, | ROW = 0010, | COL = 0068, | mst = 2 |
| 2524 — 15. | RD, | BANK = 1, | ROW = 0010, | COL = 0070, | mst = 2 |
| 2525 — 16. | RD, | BANK = 1, | ROW = 0010, | COL = 0078, | mst = 2 |
| 2526 — 17. | RD, | BANK = 1, | ROW = 0010, | COL = 0080, | mst = 2 |
| 2527 — 18. | RD, | BANK = 1, | ROW = 0010, | COL = 0088, | mst = 2 |
| 2528 — 19. | RD, | BANK = 1, | ROW = 0010, | COL = 0090, | mst = 2 |
| 2529 — 20. | WR, | BANK = 0, | ROW = 0200, | COL = 0100, | mst = 1 |
| 2530 — 21. | WR, | BANK = 0, | ROW = 0200, | COL = 0108, | mst = 1 |
| 2531 — 22. | RD, | BANK = 0, | ROW = 0200, | COL = 0100, | mst = 2 |
| 2532 — 23. | WR, | BANK = 0, | ROW = 0200, | COL = 0140, | mst = 1 |
| 2551 — 500 | RD, | BANK = 0, | ROW = 0400, | COL = 00c0, | mst = 0 |
| 2552 — 501. | RD, | BANK = 0, | ROW = 0400, | COL = 0720, | mst = 0 |

FIG.26

| | | | | | |
|---|---|---|---|---|---|
| 2610 ~ 1000, | ACT, | BANK = 0, | ROW = 0100, | | mst = NO |
| 2611 ~ 5000, | ACT, | BANK = 1, | ROW = 0010, | | mst = NO |
| 2612 ~ 31000, | RD, | BANK = 0, | ROW = 0100, | COL = 0010, | mst = 0 |
| 2613 ~ 35000, | RD, | BANK = 0, | ROW = 0100, | COL = 0018, | mst = 0 |
| 2614 ~ 40000, | RD, | BANK = 0, | ROW = 0100, | COL = 0080, | mst = 0 |
| 2615 ~ 55000, | WR, | BANK = 1, | ROW = 0010, | COL = 0020, | mst = 3 |
| 2616 ~ 59000, | WR, | BANK = 1, | ROW = 0010, | COL = 0028, | mst = 3 |
| 2617 ~ 63000, | WR, | BANK = 1, | ROW = 0010, | COL = 0030, | mst = 3 |
| 2618 ~ 73000, | RD, | BANK = 1, | ROW = 0010, | COL = 0020, | mst = 2 |
| 2619 ~ 77000, | RD, | BANK = 1, | ROW = 0010, | COL = 0028, | mst = 2 |
| 2620 ~ 89000, | RD, | BANK = 1, | ROW = 0010, | COL = 0040, | mst = 2 |
| 2621 ~ 90000, | PRE, | BANK = 0, | | | mst = 0 |
| 2622 ~ 93000, | RD, | BANK = 1, | ROW = 0010, | COL = 0048, | mst = 2 |
| 2623 ~ 97000, | RD, | BANK = 1, | ROW = 0010, | COL = 0050, | mst = 2 |
| 2624 ~ 101000 | RD, | BANK = 1, | ROW = 0010, | COL = 0058, | mst = 2 |
| 2625 ~ 105000 | RD, | BANK = 1, | ROW = 0010, | COL = 0060, | mst = 2 |
| 2626 ~ 109000 | RD, | BANK = 1, | ROW = 0010, | COL = 0068, | mst = 2 |
| 2627 ~ 113000 | RD, | BANK = 1, | ROW = 0010, | COL = 0070, | mst = 2 |
| 2628 ~ 117000 | RD, | BANK = 1, | ROW = 0010, | COL = 0078, | mst = 2 |
| 2629 ~ 121000 | RD, | BANK = 1, | ROW = 0010, | COL = 0080, | mst = 2 |
| 2630 ~ 125000 | RD, | BANK = 1, | ROW = 0010, | COL = 0088, | mst = 2 |
| 2631 ~ 129000 | RD, | BANK = 1, | ROW = 0010, | COL = 0090, | mst = 2 |
| 2632 ~ 130000, | ACT, | BANK = 0, | ROW = 0200, | | mst = 0 |
| 2633 ~ 200000, | WR, | BANK = 0, | ROW = 0200, | COL = 0100, | mst = 1 |
| 2634 ~ 204000, | WR, | BANK = 0, | ROW = 0200, | COL = 0108, | mst = 1 |
| 2635 ~ 214000, | RD, | BANK = 0, | ROW = 0200, | COL = 0100, | mst = 2 |
| 2636 ~ 229000, | WR, | BANK = 0, | ROW = 0200, | COL = 0140, | mst = 1 |
| 2637 ~ 289000, | PRE, | BANK = 0, | | | mst = 1 |
| 2638 ~ 289000, | PRE, | BANK = 1, | | | mst = 2 |
| 2651 ~ 19999000, | RD, | BANK = 0, | ROW = 0400, | COL = 00c0, | mst = 0 |
| 2652 ~ 20003000, | RD, | BANK = 0, | ROW = 0400, | COL = 0720, | mst = 0 |

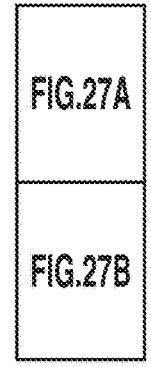
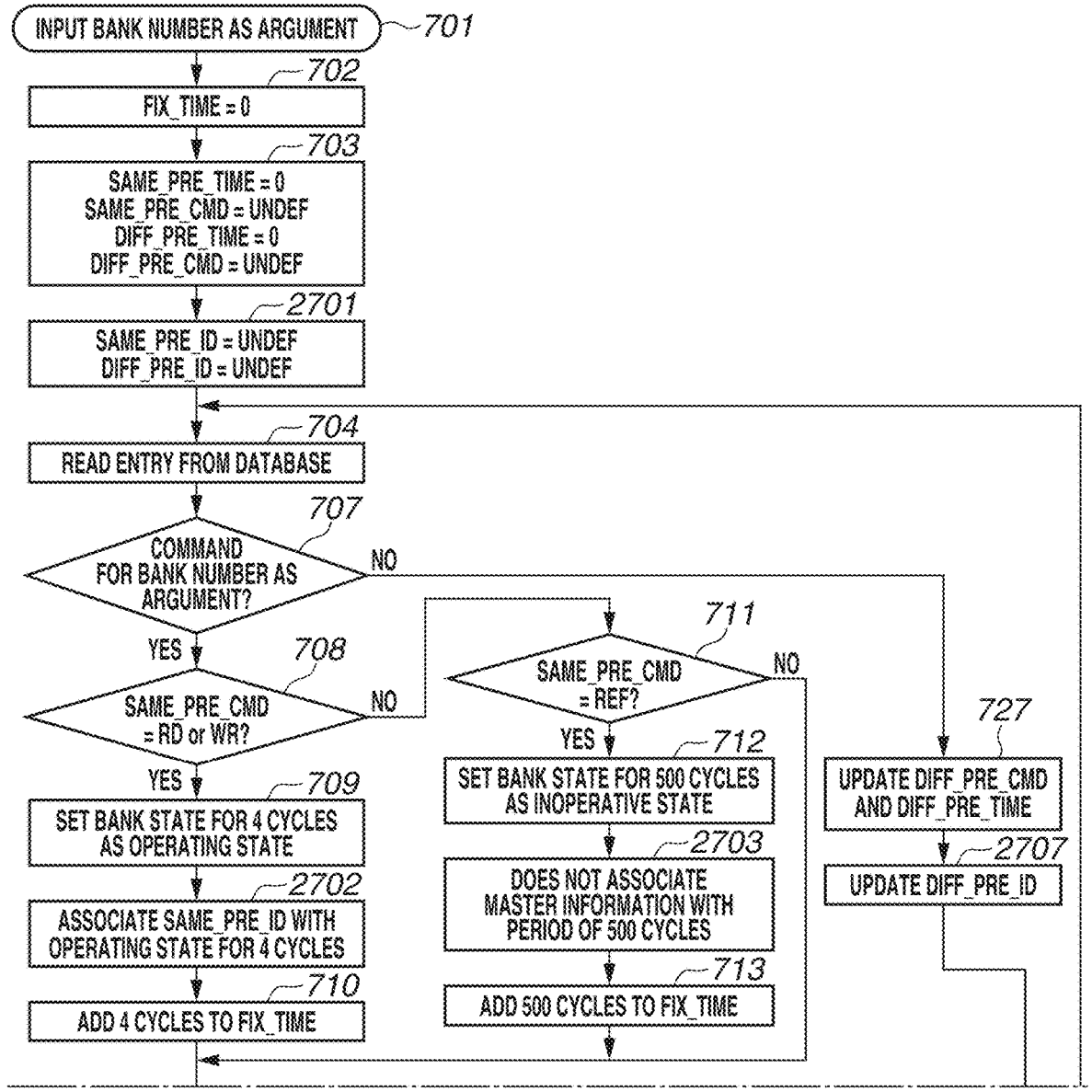
FIG.27A

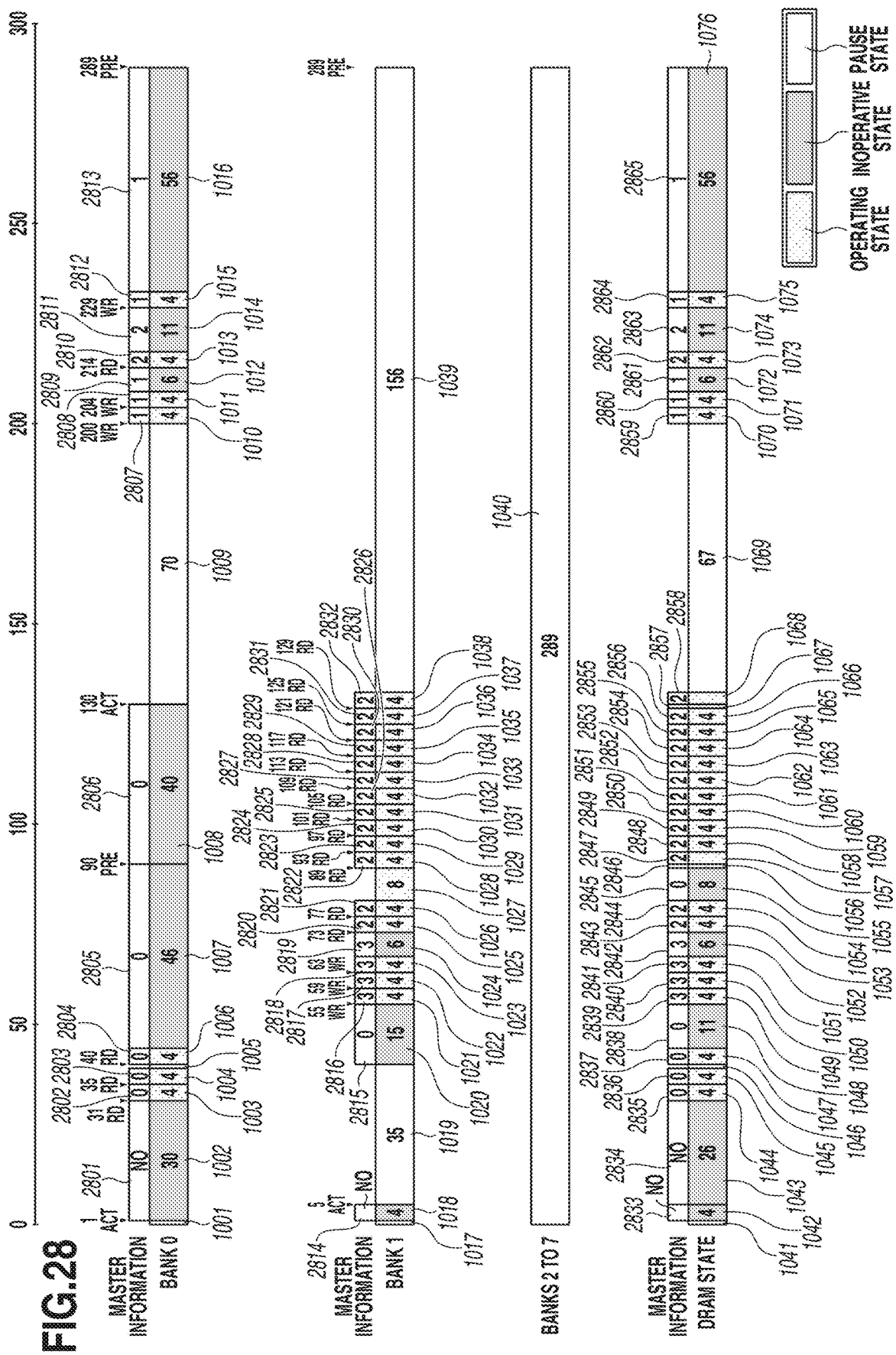

FIG.30

|  | OPERATING STATE ||  INOPERATIVE STATE ||
|---|---|---|---|---|
|  | NUMBER OF TIMES | NUMBER OF CYCLES | NUMBER OF TIMES | NUMBER OF CYCLES |
| MASTER 0 | 3 | 12 | 2 | 19 |
| MASTER 1 | 3 | 12 | 2 | 62 |
| MASTER 2 | 16 | 56 | 1 | 11 |
| MASTER 3 | 3 | 12 | 1 | 6 |
| OTHERS | 0 | 0 | 2 | 30 |

FIG.31
OPERATING STATE CYCLES
FOR EACH MASTER
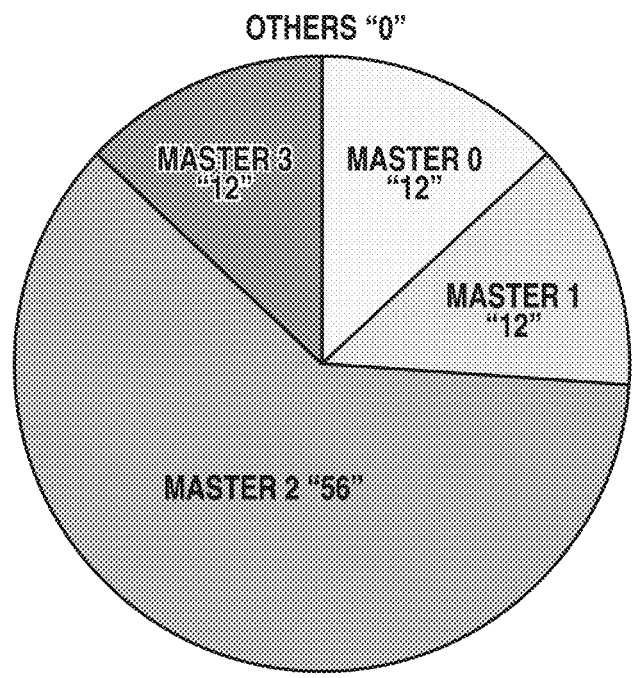
INOPERATIVE STATE CYCLES
FOR EACH MASTER
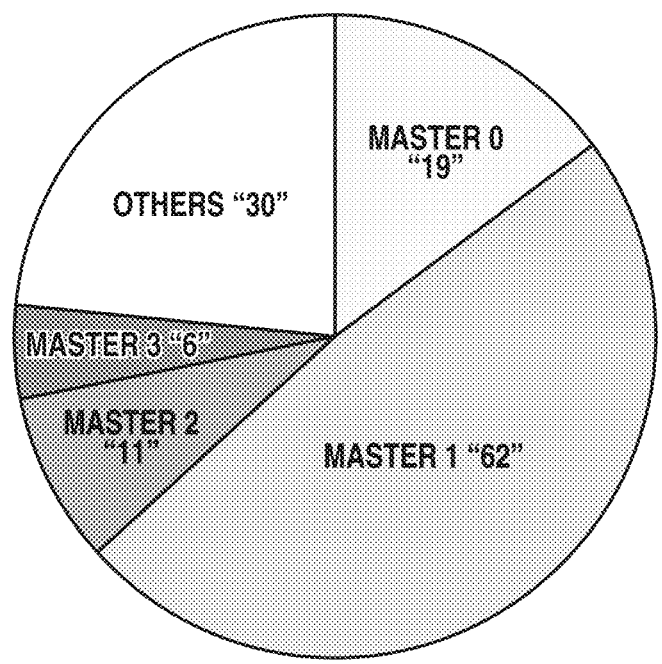

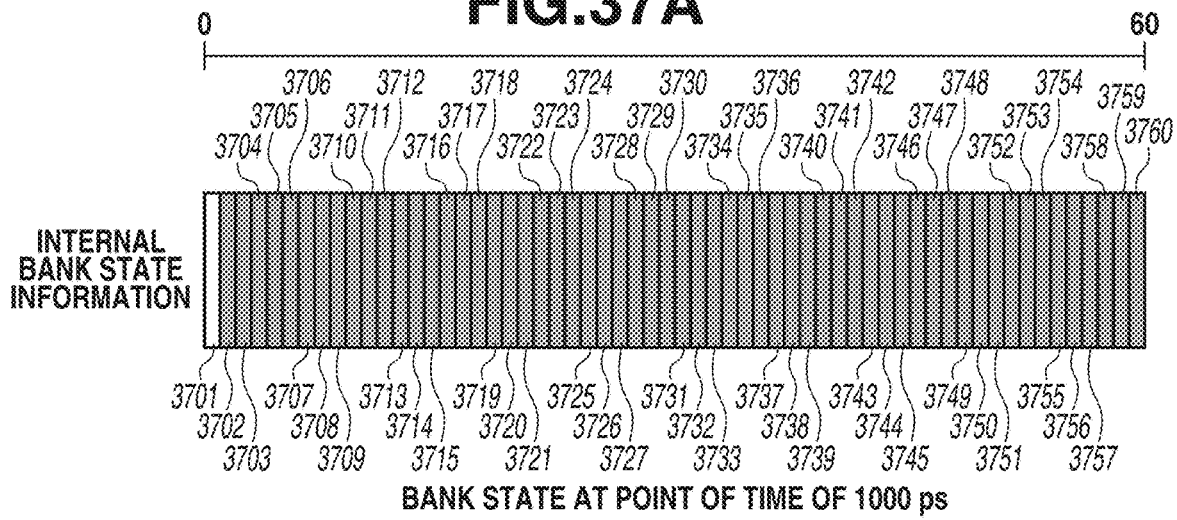
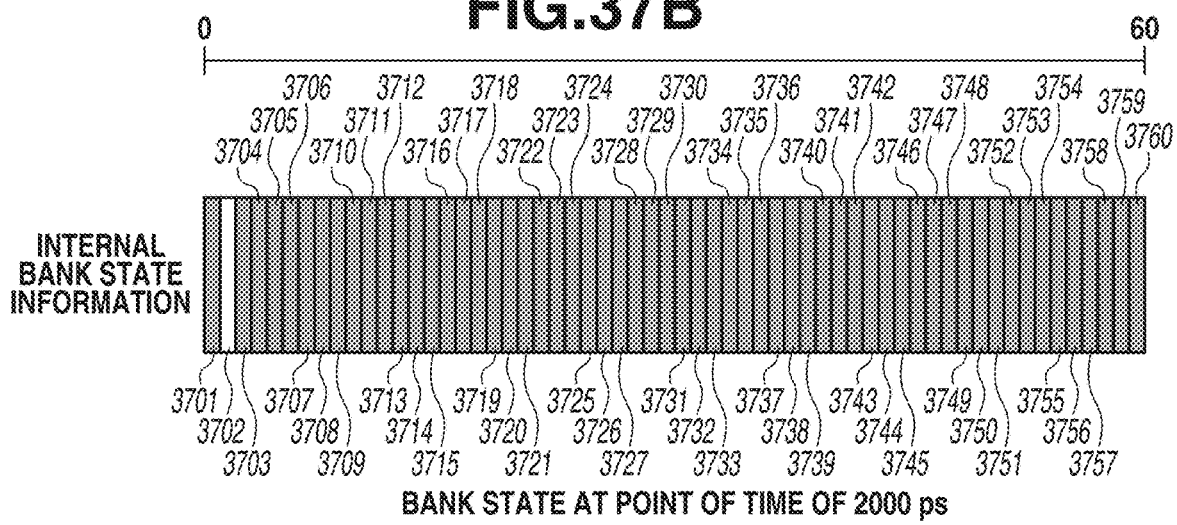
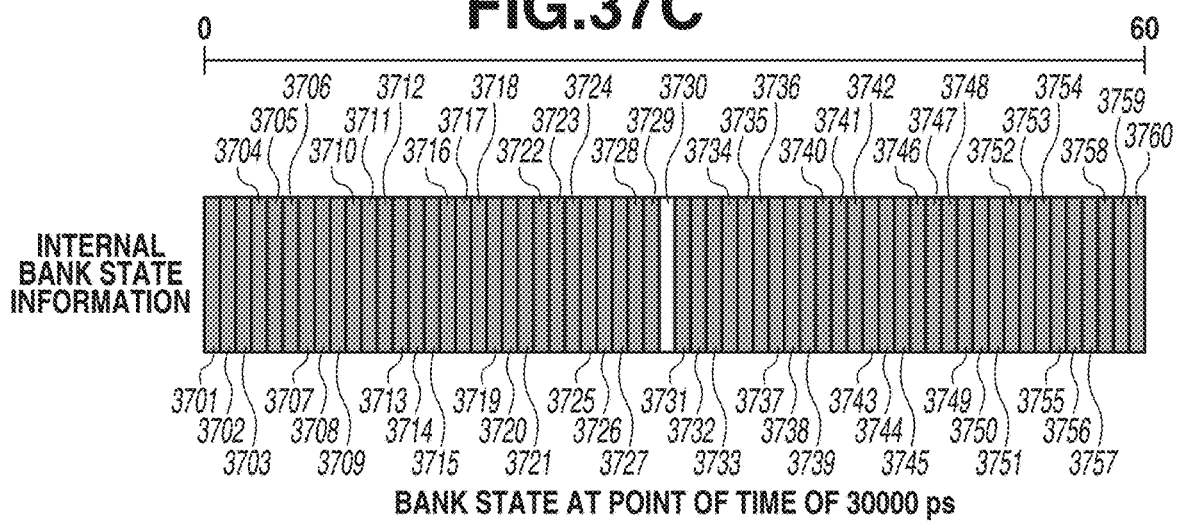

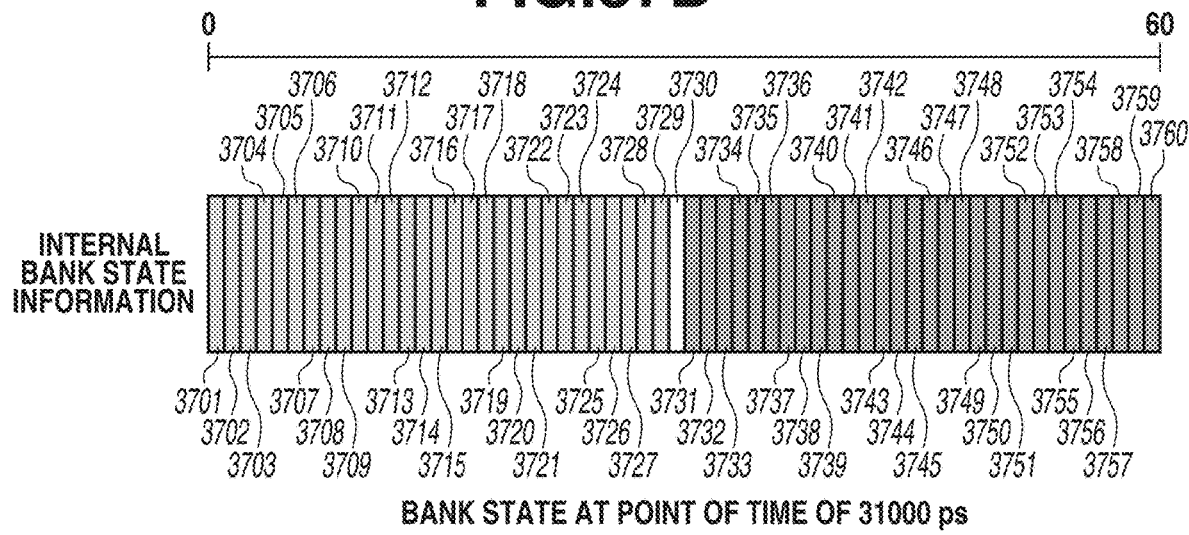
FIG.37D
BANK STATE AT POINT OF TIME OF 31000 ps
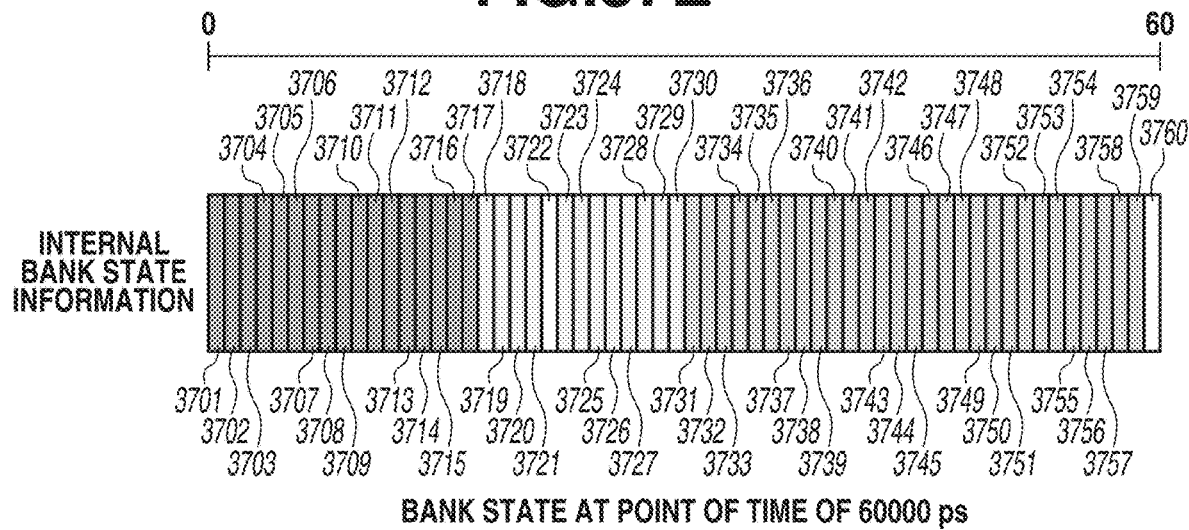
FIG.37E
BANK STATE AT POINT OF TIME OF 60000 ps
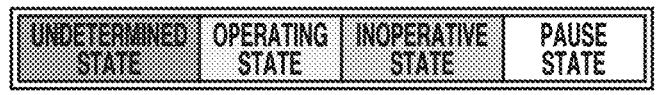

BANK STATE AT POINT OF TIME OF 61000 ps

BANK STATE AT POINT OF TIME OF 190000 ps

FIG.39

2201 — aclk
2202 — araddr[31:0]
2203 — arready
2204 — arvalid
2205 — arburst[1:0]
2206 — arlen[7:0]
2207 — arsize[2;0]
2208 — awaddr[31:0]
2209 — awready
2210 — awvalid
2211 — awburst[1:0]
2212 — awlen[7:0]
2213 — awsize[2:0]
3901 — wready
3902 — wvalid
3903 — wdata[31:0]

INFORMATION PROCESSING APPARATUS AND INFORMATION PROCESSING METHOD TO ANALYZE A STATE OF DYNAMIC RANDOM ACCESS MEMORY (DRAM)

BACKGROUND

Field

Aspects of the present disclosure generally relate to an information processing apparatus and an information processing method each of which is used for analyzing the state of dynamic random access memory (DRAM).

Description of the Related Art

Heretofore, a technique to analyze the performance of DRAM in system large-scale integration (LSI) and display an analysis result has been widely used. Prior to describing the performance analysis and performance-analysis result display technique, DRAM is described. DRAM is a type of storage device which is extensively used in recent digital equipment, such as a personal computer (PC), a smartphone, a digital television set, and a digital camera. As another type of storage device which is often compared with DRAM, there is static random access memory (SRAM). DRAM requires a periodic memory storage operation called "refresh" and is thus generally higher in power consumption compared to SRAM. On the other hand, DRAM has the advantage of being able to easily achieve high integration because of its structure and to inexpensively provide a large capacity, and, therefore, has been used as a large-capacity storage device since early times. Along with the recent advancement to higher pixel counts, such as 4K resolution (an image size of approximately horizontal 4,000 pixels× vertical 2,000 pixels) and 8K resolution (an image size of approximately horizontal 8,000 pixels×vertical 4,000 pixels), sizes of digital data about still images and moving images continue to increase, and the range of application of DRAM still shows no sign of slowing down. Thus, since DRAM is a main storage device in digital equipment, the demand of an improvement in access speed thereof is also high. To address this, DRAM has coped with such a demand by employing the evolution of structures, such as development of synchronous DRAM (SDRAM) or Rambus DRAM (RDRAM), the speed advancement caused by a clock frequency increase in the identical structure, and the various functions of achieving speeding up. Here, SDRAM is described as an example. SDRAM has evolved from single data rate (SDR), which operates in response to only rising of a clock signal, to double data rate (DDR), which operates in response to both rising and falling of a clock signal, and has expanded its access rate to theoretically two times. Additionally, SDRAM has evolved to DDR, DDR2, DDR3, and DDR4 mainly along with the improvements in clock frequency and capacity and the definition of standards. Moreover, as power-saving DDR, LPDDR2, LPDDR3, and LPDDR4, the names of which begin with "low power (LP)", have also been standardized. Standards for DRAM have been defined and standardized by the JEDEC Solid State Technology Association, so that DRAM has evolved in such a manner that companies which assume manufacturing of DRAM do not use their unique standards.

While the access performance of SDRAM has accomplished evolution, the control method therefor has basically no variation in all of the types of SDRAM, such as SDR, DDR, and LPDDR, and is performed with use of a control signal called "command". The control method using a command is described with LPDDR4 taken as an example. However, the control method does not make much difference even between SDR, DDR, DDR2, DDR3, DDR4, LPDDR2, and LPDDR3. FIG. 5 illustrates a list of commands for DDR3. In FIG. 5, columns 501 and 502 represent meanings and command expressions of commands associated when signals 503 to 513 are consistent with the respective illustrated states. ACT command is a command for selecting a row address of DRAM. This operation is referred to as activate, and is also referred to as page open because of regarding a memory space at the same row address as a page and making access preparations for the page. After selecting a row address by ACT command, the control method selects a column address by RD command and WR command to read and write data in a storage element of DRAM. The address used for selecting a storage element of DRAM includes two addresses, i.e., a row address and a column address. Basic read and write operations first select a row address by ACT command, and, next, select a column address by RD command and WR command, thus determining an address for a target storage element. In SDRAM, to speed up data access, there has been contrived a method called a page mode, which reads and writes pieces of data at the same row address and respective different column addresses one after another. This allows accessing pieces of data at high speed if the pieces of data are at the same row address even though the pieces of data are at respective different column addresses. On the other hand, if the pieces of data are at respective different row addresses, it is necessary to once return the activated row address to a non-selective state by an operation called precharge using PRE command and, then, activate the row address again. This precharge is called page close in contrast to page open for activate. This series of operations including page close (precharge) and page open (activate) is difficult to shorten in time because of the structure of DRAM and, therefore, has not been much shortened in time even by the evolution of standards. Generally, this series of operations is called a page miss. The page miss occurs inevitably when the row address changes, so that it is impossible to avoid a page miss itself. However, there has been contrived a structure which improves access efficiency by hiding such a page miss. The structure, which is merely simple, establishes the entire memory space, which is selected by a row address and a column address, with units called banks and implements hiding of a page miss by mounting a plurality of banks. More specifically, during a period in which access is impossible due to a page miss occurring in one bank, the structure performs access to another bank in parallel, thus substantially hiding the whole of or a part of a page miss penalty. However, banks share a row address, a column address, and a signal line through which data flows, so that function enhancement can be achieved without need for enhancement on substrate wiring of DRAM. FIG. 29 illustrates a penalty caused by a page miss and an operation of another bank which hides such a penalty. In FIG. 29, an RD command 2901 is provided to a bank 0. In the standard for DDR3-SDRAM, there are 4-beat access, which accesses data continuously four times, and 8-beat access, which accesses data continuously eight times. Since continuous access includes performing access once at each of rising and falling of a clock pulse, 4-beat access consumes two clock cycles and 8-beat access consumes four clock cycles. In the present example, it is assumed that only 8-beat access is issued, so that, four clock cycles after issuance of RD and WR commands, a next RD command is configured to be issued. An RD command 2902, which is provided to the bank 0, is issued at an interval of four clock cycles after the RD command 2901 and is thus issued at the shortest timing in view of 8-beat access. After that, in the bank 0, a page miss occurs, so that a PRE command 2903 and an ACT command 2904 are continuously issued, and, then, an RD command 2905 for another page is issued. Thus, it can be discriminated that a portion from four clock cycles after the RD command 2902 to the RD command 2905 is a penalty caused by a page miss. On the other hand, in a bank 1, an RD command 2906 is issued four clock cycles after the RD command 2902. Since four clock cycles can be the shortest timing irrespective of banks, a period from the RD command 2902 to the RD command 2906 signifies access having been performed at the shortest timing. Similarly, RD commands 2907, 2908, and 2909 are also issued at intervals of four clock cycles, and, during each of such periods, access has also been performed at the shortest timing. As a result, a next RD command becomes able to be issued only four clock cycles after the RD command 2909. If this is viewed only in the bank 0, a period of 18 clock cycles from four clock cycles after the RD command 2902 to the RD command 2905 is a penalty caused by a page miss. On the other hand, if this is viewed in the entire DRAM, since all of the RD commands 2902, 2906, 2907, 2908, and 2909 have been issued at the shortest timing, the occurrence of a penalty is not found. In other words, it can be regarded that, in a period of 16 clock cycles from four clock cycles after the RD command 2902 to four clock cycles after the RD command 2909, a penalty caused by a page miss has been able to be hidden. As a result, in the entire DRAM, only a period of two clock cycles from four clock cycles after the RD command 2909 to the RD command 2905 is regarded as a penalty caused by a page miss.

There is another typical control operation for DRAM. Such a control operation is a memory storage operation called refresh, which is implemented by REF command. A storage element of DRAM expresses its value by electric charge stored therein. The stored electric charge is gradually lost by a leakage of current inside the storage element and then becomes difficult to discriminate from a state in which there is no electric charge. Therefore, an operation which periodically supplements electric charge becomes necessary. This operation is called refresh. While refresh is performed basically on a bank-by-bank basis, a target bank requires a row address to be previously in a non-selective state and is thus required to be previously subjected to page close. Moreover, since a refresh operation is an operation requiring a predetermined time in terms of structure, there exists a period in which access is not able to be performed after a refresh command is issued. Besides, DRAM also has various functions such as low power consumption and calibration (periodically adjusting a phase relationship between a signal line and a clock signal), which are also implemented by commands being issued. Even in these commands, there exists a period in which access is not able to be performed for a predetermined period as with a page miss penalty or a refresh penalty.

The method of analyzing and displaying the performance, i.e., access efficiency, of DRAM includes waveform display. Waveform is a shape for time-serially displaying a change in a signal line between DRAM and a system LSI using the DRAM as a storage device, and is generally used in developing system LSIs. For example, software simulators which simulate a system LSI and its operation on a workstation including a peripheral device such as DRAM are being provided by various electronic design automation (EDA) tool vendor companies. Japanese Patent Application Laid-Open No. 2009-266237 discusses software simulators for a system LSI. A principal software simulator provides a waveform display function. The waveform display function analyzes control signals for commands on a waveform display, thus being able to identify a data access period and a period in which access is impossible for a predetermined period due to, for example, a page miss or refresh. On the other hand, in addition to detailed analysis using a waveform display, a method of, for the purpose of performing analysis in a more macro unit, performing analysis by displaying a generated data access amount as statistical data is widely used. In the statistical data, generally, access amounts issued to DRAM are displayed separately for read and for write. Additionally, access amounts for read and write are statistically analyzed for each set unit time, so that changes in the access amounts for read and write become able to be time-serially analyzed. Moreover, with regard to the statistical data, a method of to analyze a period in which access is impossible for a predetermined time due to a page miss or refresh, counting the numbers of occurrences of ACT command, PRE command, and REF command and calculating a period in which access is impossible is generally performed.

With regard to the analysis using waveform display, while detailed analysis is able to be performed, a period in which displaying is able to be performed at a time is merely about hundreds of cycles of a reference clock signal. While, naturally, zoom-in and zoom-out functions are implemented, if displaying is performed at more than thousands of cycles, the reference clock cycle becomes very fine, so that, realistically, it is difficult to perform analysis. In the case of performing performance analysis for DRAM in actual digital equipment, it is necessary to perform the performance analysis not only in a micro unit but also in a macro unit. For example, in the case of a digital television set or a digital video camera, acquisition and displaying are generally performed at 30 to 120 frames per second (fps), such as 30 fps to 120 fps. Thus, in the case of 30 fps, one frame corresponds to 33.3 milliseconds (ms), and, in the case of 120 fps, one frame corresponds to 8.33 ms. If this is considered with LPDDR4-3200 (with a data rate of 3.2 gigabits per second (Gbps)), which is the current latest standard, one cycle of the reference clock signal corresponds to 0.625 nanoseconds (ns). Since, in the case of 30 fps, one frame corresponds to 50,000,000 cycles or more and, in the case of 120 fps, one frame corresponds to 13,000,000 cycles or more, waveform display is unable to set the whole frame as an analysis object. On the other hand, the statistical analysis is able to, by adjusting a unit time, calculate the access amounts for read and write, the numbers of occurrences of commands causing a page miss or refresh, and a period in which access is impossible, regardless of an analysis time. However, the statistical analysis is unable to perform detailed analysis such as that which the waveform display is able to perform. For example, in the hidden page miss, a period in which access is impossible is limited to a specific bank and the other banks are unaffected. As a result, the whole DRAM is not affected in performance or only a part of DRAM is affected, but the numbers of occurrences of commands and calculations that are based on such numbers are not effective for detailed analysis of actual influences.

SUMMARY

According to an aspect of the present disclosure, an information processing apparatus includes a detection unit configured to detect an event which causes a state of at least one bank constituting dynamic random access memory (DRAM) to transition, a first classification unit configured to classify the state of the at least one bank based on the event detected by the detection unit, a second classification unit configured to classify a state of the DRAM based on the state of the at least one bank, and a display unit configured to cause statistical information that is based on the state of the at least one bank or the state of the DRAM to be displayed with respect to a predetermined unit time, wherein the state of the at least one bank and the state of the DRAM each includes at least one of the following: an operating state, in which data is being transferred, an inoperative state, in which transfer of data is not possible due to a predetermined constraint, or a pause state, in which, although there is no constraint, data is not being transferred.

Further features of the present disclosure will become apparent from the following description of exemplary embodiments with reference to the attached drawings.

BRIEF DESCRIPTION OF THE DRAWINGS

FIG. 4 is a diagram illustrating signal lines which constitute a DDR3-SDRAM interface.

FIG. 5 is a diagram illustrating a list of commands for DDR3-SDRAM.

FIG. 6 is a diagram illustrating an example of output results from a detection unit in the first exemplary embodiment.

FIG. 8 is a table illustrating constraints between commands in the first exemplary embodiment.

FIG. 11 is a diagram illustrating an example of display in a table form which is provided by a display unit.

FIG. 18 is diagram illustrating a detailed classification of bank states which a bank state classification unit classifies in a second exemplary embodiment.

FIG. 22 is a diagram illustrating signal lines which constitute an AMBA 3 interface.

FIG. 24 is a diagram illustrating an example of output results from a master event detection unit in the third exemplary embodiment.

FIG. 25 is a diagram illustrating an example of command queues in the third exemplary embodiment.

FIG. 26 is a diagram illustrating an example of output results from the association unit in the third exemplary embodiment.

FIG. 28 is a diagram illustrating processing results which are obtained by the bank state classification unit and a DRAM state classification unit in the third exemplary embodiment.

FIG. 30 is a diagram illustrating an example of display in a table form which is provided by a display unit in the third exemplary embodiment.

FIG. 31 is a diagram illustrating an example of display in a pie chart form which is provided by the display unit in the third exemplary embodiment.

FIGS. 37A, 37B, 37C, 37D, 37E, 37F, and 37G are diagrams illustrating states at respective times of the internal bank state information retained by the bank state classification unit in the sixth exemplary embodiment.

FIG. 39 is a diagram illustrating signals obtained by adding signals in write data channel to some signals in an AMBA 4 interface in a seventh exemplary embodiment.

DESCRIPTION OF THE EMBODIMENTS

A display apparatus (information processing apparatus) according to a first exemplary embodiment is described with reference to FIG. 1 to FIG. 17.

Figure 2:
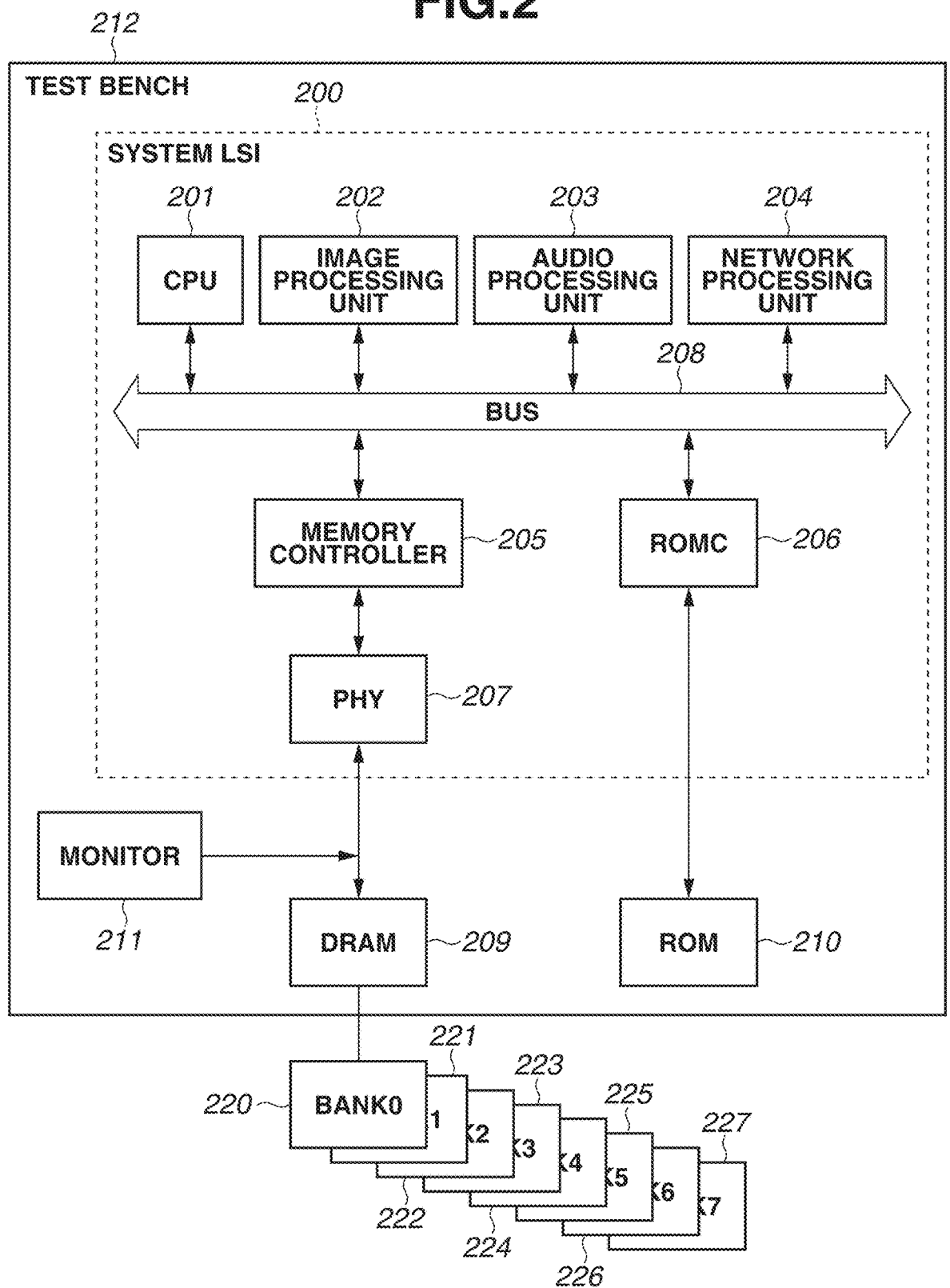
FIG. 2 is a configuration diagram of a test bench targeted for simulation.

FIG. 2 is a configuration diagram of a test bench including a system LSI targeted for simulation and peripheral modules in the first exemplary embodiment. In FIG. 2, a system large-scale integration (LSI) 200 is illustrated. A central processing unit (CPU) 201 performs various control operations for the system LSI 200. An image processing unit 202 performs image processing of a still image and a moving image which are handled by the system LSI 200. An audio processing unit 203 performs audio processing of audio data which is handled by the system LSI 200. A network processing unit 204 performs data transmission and reception from and to the system LSI 200 via an external network. A read-only memory (ROM) 210 stores a boot program, which is executed at the time of activation of the CPU 201, and various pieces of data, and is accessed via a ROM controller (ROMC) 206. Dynamic random access memory (DRAM) 209 mainly stores a control program which is executed by the CPU 201 and also provides a workspace used for the CPU 201 to perform various control operations. Besides, still images and moving image data which the image processing unit 202 handles, audio data which the audio processing unit 203 handles, and external communication data which the network processing unit 204 handles are also stored in the DRAM 209. The DRAM 209 is equipped with eight banks 220 to 227 therein, which constitute the DRAM 209. With regard to the bank number, bank 0 to bank 7 correspond to the banks 220 to 227, respectively. The image processing unit 202, the audio processing unit 203, and the network processing unit 204 access respective pieces of data by direct memory access (DMA). Access to the DRAM 209 is performed by a memory controller 205 receiving an access request and converting the access request into a control command and, then, a physical layer (PHY) 207 converting the control command into an analog signal and externally issuing the analog signal. A specific access method is as described above in background art and is omitted from description here. Besides, access from the image processing unit 202, the audio processing unit 203, and the network processing unit 204 to the DRAM 209 is also similar to the above-mentioned method. A bus 208 interconnects the CPU 201, the image processing unit 202, the audio processing unit 203, and the network processing unit 204, each of which issues an access request, to the memory controller 205 and the ROMC 206, each of which receives the access request. In the first exemplary embodiment, the DRAM 209 is assumed to be synchronous dynamic random access memory (SDRAM) conforming to the DDR3-SDRAM standard. A monitor 211 is connected to control signal lines between the system LSI 200 and the DRAM 209 and has the function of monitoring a command which has been generated on the control signal during execution of simulation. The system LSI 200, the DRAM 209, the ROM 210, and the monitor 211 are located in a test bench 212 and are interconnected via respective control signals.

Figure 3:
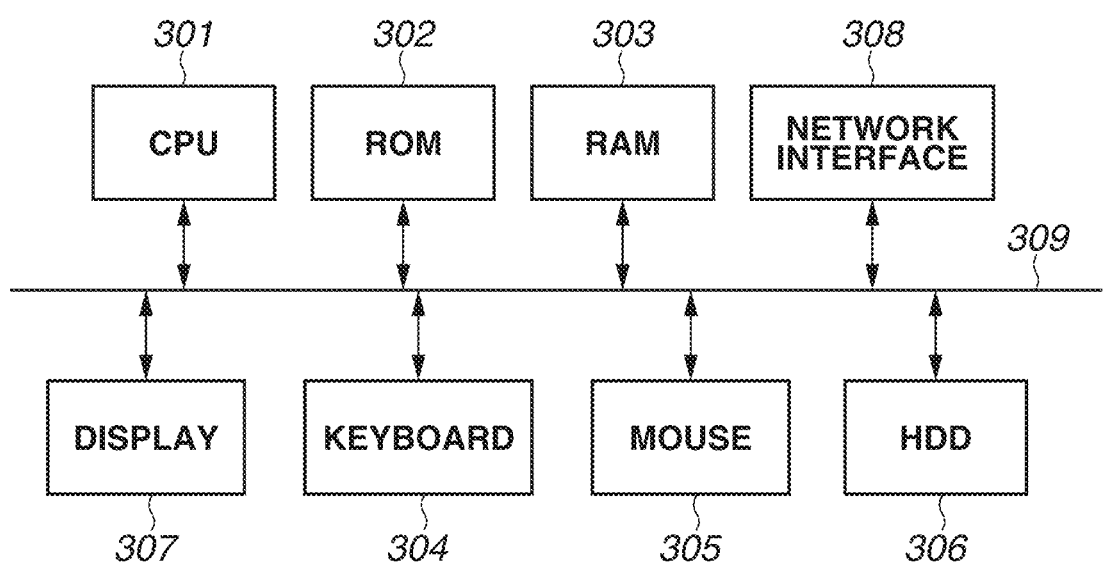
FIG. 3 is a configuration diagram of a computer apparatus which performs performance analysis processing and analysis result display processing.

FIG. 3 is a configuration diagram of a computer apparatus which performs performance analysis processing, which includes simulation processing for the test bench 212, and analysis result display processing. In FIG. 3, a CPU 301 performs various control operations in the computer apparatus. A ROM 302 stores a boot program, which is executed at the time of activation of the computer apparatus, and various pieces of data. A random access memory (RAM) 303 stores a control program, which the CPU 301 executes, and provides a workspace used for the CPU 301 to perform various control operations. A keyboard 304 and a mouse 305 provide an operational environment for various input operations performed by the user. A hard disk drive (HDD) 306 stores various pieces of data.

A display 307 displays, for example, a processing result to the user. In the first exemplary embodiment, specifically, the display 307 displays a simulation result, waveforms, and a performance analysis processing result. A network interface 308 allows a communication which is performed via an external network and a local area network (LAN) cable. A bus 309 is configured to interconnect the above-mentioned constituent elements. Furthermore, while a CPU, a ROM, and a bus are also present in the system LSI 200, these constituent elements are different from those included in the computer apparatus.

Figure 1:
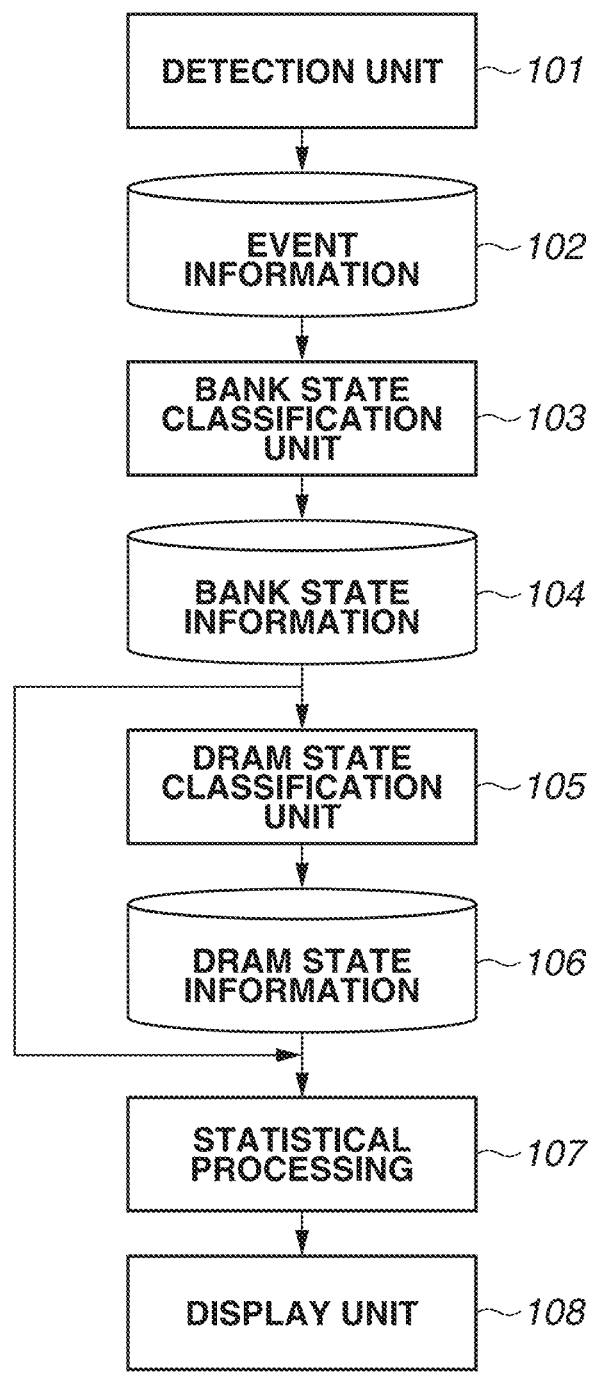
FIG. 1 is a processing concept diagram illustrating the whole of performance analysis processing and analysis result display processing according to a first exemplary embodiment of the present disclosure.

Now, performance analysis processing and analysis result display processing in the first exemplary embodiment are described. Performance analysis processing and analysis result display processing are performed by the above-mentioned computer apparatus. FIG. 1 is a processing concept diagram illustrating the whole of performance analysis processing and analysis result display processing. In FIG. 1, a detection unit 101 detects an event which causes a state transition of each of the banks 220 to 227, which constitute the DRAM 209 serving as a performance analysis target. More specifically, the event is a command which the memory controller 205 included in the system LSI 200 issues to control the DRAM 209. Event information 102 detected by the detection unit 101 is temporarily stored in the HDD 306 and is then input to a bank state classification unit 103. The bank state classification unit 103 causes the state of each of the banks 220 to 227 to transition based on the generated event. With this, the respective states of the banks 220 to 227 are determined in a time-series manner. Bank state information 104 about the banks 220 to 227 classified by the bank state classification unit 103 is stored in the HDD 306 as with the event information 102, and is then input to a DRAM state classification unit 105. The DRAM state classification unit 105 classifies the states of the DRAM 209 based on the states of the banks 220 to 227 obtained at the same time. With this, the states of the DRAM 209 are determined in a time-series manner. DRAM state information 106 about the DRAM 209 classified by the DRAM state classification unit 105 is also similarly stored in the HDD 306. The DRAM state information 106 about the DRAM 209 and the bank state information 104 about the banks 220 to 227 are input to a display unit 108 via statistical processing 107. The statistical processing 107 statistically analyzes the numbers of occurrences of respective states and the numbers of generated clock cycles with respect to the bank state information 104 and the DRAM state information 106. The display unit 108 counts the numbers of occurrences of respective states and the numbers of generated clock cycles about the DRAM 209 and the banks 220 to 227 and displays the counted results as a performance analysis result on the display 307. Thus far is the overall flow of performance analysis processing and analysis result display processing in the first exemplary embodiment. In the following description, the respective elements in the performance analysis processing and analysis result display processing illustrated in FIG. 1 are described in detail.

The detection unit 101 is implemented by the monitor 211 in simulation processing for the test bench 212 performed by the computer apparatus. The simulation processing performed by the computer apparatus is implemented by the CPU 301 using the RAM 303 as a work area and executing simulation software stored in the HDD 306. Typical examples of simulation software include Incisive (registered trademark of Cadence Design Systems, Inc.), VCS (registered trademark of Synopsys, Inc.), and Questasim (registered trademark of Mentor Graphics). These pieces of software are used to simulate the same operation as an operation which the system LSI 200 actually performs, and results of such simulation are stored in the HDD 306. Specifically, the results of such simulation include, for example, a simulation log file and a waveform file which simulation software outputs and event information which the monitor 211 outputs.

Monitoring of signal lines between the system LSI 200 and the DRAM 209 which is performed by the monitor 211, i.e., an operation of the detection unit 101 in the first exemplary embodiment, is described. The monitor 211 monitors signal lines between the system LSI 200 and the DRAM 209 in simulation processing. Specifically, the signal lines to be monitored include signal lines which constitute a DDR3-SDRAM interface illustrated in FIG. 4. A clock signal 401 serves as a basis for all of the signals. Thus, at the timing of rising (a change from 0 to 1) of the clock signal 401, the detection unit 101 evaluates states of signals other than the clock signal 401 and detects which command is being issued. Specifically, the detection unit 101 detects a command based on a table illustrated in FIG. 5. In FIG. 5, columns 503 to 513 represent values of the signal lines illustrated in FIG. 4. While columns 504 to 513 represent states of the respective signals at rising timing of a predetermined clock signal 401, it should be noted that only the column 503 represents the state at rising timing of a clock signal obtained one cycle before the rising timing of the predetermined clock signal 401. In FIG. 5, L means Low=0, and H means High=1. X means Don't Care and can be any value of 0 or 1. RFU is an abbreviation for Reserved for Future Use and can be any value as with X. V denotes Valid and means that, in a target command, a corresponding signal has a desired meaning. Specific meanings are not related to the description of the present exemplary embodiment and are, therefore, omitted from description. BA, RA, and CA mean a bank address, a row address, and a column address, respectively, and mean being determined as an address when a command is detected by a signal other than these signals. Columns 501 and 502 represent meanings and command notations of commands corresponding to cases where the respective signals in the columns 503 to 513 coincide the associated states. The detection unit 101 is described with ACT command taken as an example. The detection unit 101 determines whether a clock enable (CKE) signal is H at rising timing of a clock signal 401 obtained one cycle before based on the column 503. Next, the detection unit 101 determines whether the CKE signal is H at rising timing of the current clock signal 401 based on the column 504. Similarly, the detection unit 101 determines whether CS=L, whether RAS=L, whether CAS=H, and whether WE=H, and detects ACT command when all of these conditions are satisfied. At this time, a BA signal means a bank address and an A signal means RA, i.e., a row address. With respect to commands other than ACT command, the detection unit 101 also performs determination according to values of the signal lines based on the table illustrated in FIG. 5, thus detecting respective commands which have been issued. NOP command 540, which is a special command, is additionally described. The detection unit 101 detects NOP command 540 when CKE=H→H (meaning being H at rising of a just previous clock signal and H at rising of the current clock signal), CS=L, all of RAS, CAS, and WE=H. The NOP command 540 is an abbreviation for No Operation and means that no command has been issued. In the first exemplary embodiment, NOP command is not targeted for detection, and commands other than NOP command are targeted for detection. Thus far is the description of the detection unit 101. While, in the first exemplary embodiment, the detection unit 101 has been described with use of an example in which the detection unit 101 detects commands that are based on the DDR3-SDRAM standard, the detection unit 101 can detect commands that are based on any types of standards. More specifically, since any commands that are based on other standards DDR2, DDR4, DDR5, LPDDR2, LPDDR3, and LPDDR4 are also defined based on values of the signal lines, these values can be used as events to implement the detection unit 101. Additionally, events which the detection unit 101 detects are not limited to commands. The detection unit 101 is a unit which detects events by monitoring signal lines between the system LSI 200 and the DRAM 209, so that any changes in the signal lines can be defined as events irrespective of whether values of signals targeted for monitoring are defined on standards.

A command detected during a simulation period by the monitor 211, which implements the detection unit 101, and output as log information serves as the above-mentioned event information 102. FIG. 6 illustrates an example representing contents of the event information 102 output by the monitor 211. In FIG. 6, occurrence time 601 indicates elapsed time on a simulation. In the first exemplary embodiment, a unit of occurrence time 601 is assumed to be picosecond (ps) (0.000 000 000 001 seconds). Command 602 indicates a command detected by the above-mentioned detection unit 101. Bank address 603, row address 604, and column address 605 indicate contents represented by the BA signal and the A signal when the respective commands have been detected. Since, depending on commands, there are a case where some of a bank address, a row address, and a column address are not indicated and a case where they are indicated, contents of the event information 102 are displayed based on such cases.

Prior to describing the processing details of the following bank state classification unit 103 itself, types of bank states of the banks 220 to 227, which are classified by the bank state classification unit 103, are first described. In the first exemplary embodiment, the following three bank states are defined:

State 1 Operating state;
State 2 Pause state; and
State 3 Inoperative state.

The operating state is a state in which data access for read or write to a target bank is being performed. Specifically, a period of four clock cycles after issuance of RD command and a period of four clock cycles after issuance of WR command correspond to the operating state. On the DDR3-SDRAM standard, there are four-beat access, in which data is continuously accessed four times, and eight-beat access, in which data is continuously accessed eight times. Since, in continuous access, access is performed once at each of rising and falling of a clock signal, the four-beat access consumes two clock cycles and the eight-beat access consumes four clock cycles. The first exemplary embodiment is premised on only the eight-beat access being issued, so that a period of four clock cycles after issuance of RD and WR commands corresponds to the operating state. In the case of continuously performing read, on the standard, the eight-beat access allows issuing next RD command after four clock cycles. In other words, this means that the operating state for four clock cycles occurs continuously. This also applies to the case of continuously performing write.

The inoperative state is a state in which data access for read or write is impossible or at least not possible due to a predetermined constraint and is waiting. For example, on the DDR3-SDRAM standard, any command is not able to be issued for a time defined by tREF parameter after issuance of refresh (REF) command. This is a constraint which necessarily occurs in association with a refresh operation and is applied irrespective of types of DRAM. In the first exemplary embodiment, a tREF parameter period after issuance of REF command is defined as one of inoperative states. At this time, tREF parameter is assumed to be 500 clock cycles. However, there can be conceived a method in which only a case where REF command waits for issuance of RD or WR command is defined as an inoperative state. In other words, in such a method, only a case where ACT command has been issued just after a tREF parameter period after issuance of REF command is defined as an inoperative state. While, in the first exemplary embodiment, an inoperative state is defined irrespective of the presence or absence of ACT command, naturally, the present exemplary embodiment can also be applied to a case where only the case where ACT command has been generated is defined as an inoperative state. Moreover, on the DDR3-SDRAM standard, after issuance of ACT command, a time period defined by a tRCD parameter has to be spared before RD or WR command is issued. Similarly to this, constraints defined in a table illustrated in FIG. 8 are assumed to be present between ACT, PRE, RD, and WR commands, which are generally generated by ordinary data access. On the DDR3-SDRAM standard, as illustrated in FIG. 5, there are many other commands, and constraints are also present between those commands. However, the first exemplary embodiment is premised on only the constraints indicated in the table illustrated in FIG. 8 being present, and, in a case where a period of clock cycles corresponding to each constraint is spared between commands, this period is defined as one of inoperative periods. However, this premise does not limit the range of application of the present exemplary embodiment, and, even in a case where a constraint is present other than between commands illustrated in FIG. 8, if the constraint is defined as a given period after issuance of a predetermined command and a given period between predetermined commands, naturally, the present exemplary embodiment can be applied to such a case. Additionally, although not illustrated in FIG. 8, even in a case where there is a constraint defined by a series of three or more predetermined commands, as long as the constraint is able to be determined by conditional branching, the present exemplary embodiment can also be applied to such a case. For example, in a case where PRE command, ACT command, and RD command have been generated in sequence, a period from PRE command to RD command is able to be determined to be a constraint period caused by a page miss. Similarly, in a case where REF command, ACT command, and WR command have been generated in sequence, a period from REF command to WR command is also able to be determined to be a constraint period caused by refresh and page open. Furthermore, in a case where two predetermined commands have been sequentially generated, there may be a case where a subsequent command is issued at a time exceeding a constraint period illustrated in FIG. 8. For example, such a case is that, while, in a case where RD command is issued after ACT command, it is necessary to spare clock cycles corresponding to a constraint period illustrated in FIG. 8, RD command has been issued after clock cycles corresponding to more than the constraint period. In this case, it is determined that RD command has not been forced to wait by a constraint but has not been issued due to the absence of a next access request, and, in the first exemplary embodiment, this case is assumed not to be regarded as an inoperative state. However, similarly to the above-mentioned refresh (REF) command, a constraint period after issuance of ACT command irrespective of the presence or absence of RD or WR command is able to be defined as an inoperative state. The present exemplary embodiment can be applied to any case as long as conditional branching is able to be explicitly defined. While thus far is the definition of an inoperative state, how to define a given period after any command, a period between any two periods, and a series of any three or more commands as an inoperative state cannot be the premise of the present exemplary embodiment. In a case where an inoperative state is able to be defined by the number of cycles (or a numerical constraint convertible to that) based on event occurrence detected by the above-mentioned detection unit 101, the present exemplary embodiment can be applied to such a case regardless of its definitional content. Moreover, while, in the first exemplary embodiment, a period in which the issuance of a command is impossible or at least not possible for a given period after REF command is defined by the tREF parameter, the memory controller 205 is able to control the period in which the issuance of a command is impossible or at least not possible after REF command, irrespective of the tREF parameter. For example, the memory controller 205 is not allowed to set the period less than the tREF parameter due to non-compliance of the standard, but is able to control the period in such a way as to spare clock cycles corresponding to a period greater than or equal to the tREF parameter. In this case, an inoperative state can also be defined based on the number of cycles set in the memory controller 205.

Finally, a pause state is described. A state which is neither the above-mentioned operating state nor the above-mentioned inoperative state is defined as a pause state. While, in the first exemplary embodiment, the pause state is defined after the operating state and the inoperative state are defined, definition can be performed with this correlation switched around. For example, the operating state and the pause state are first defined, and, then, an operation other than those is defined as the inoperative state.

Figure 7:
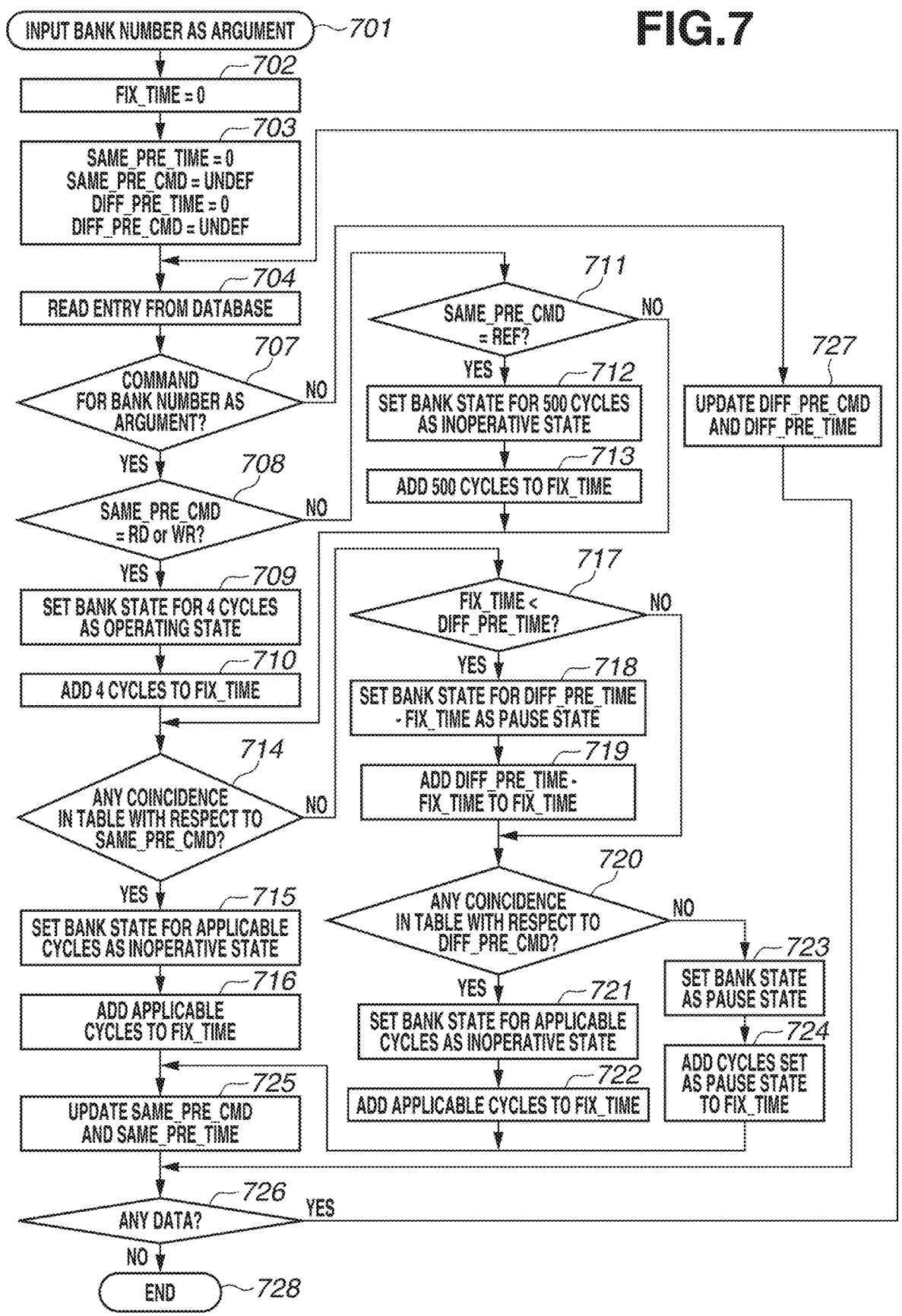
FIG. 7 is a flowchart illustrating processing which is performed by a bank state classification unit in the first exemplary embodiment.

From here, the bank state classification unit 103 is described with reference to FIG. 7. The bank state classification unit 103 receives the event information 102 and performs other processing operations after the above-mentioned simulation processing on the above-mentioned computer apparatus. The bank state classification unit 103 may check the number of clock cycles between two events to determine an inoperative state. Therefore, the bank state classification unit 103 is not configured to determine, at the time of event occurrence, a state obtained subsequent to that time, but is configured to determine, at the time of event occurrence, a state obtained from the time of occurrence of a just previous event to the time of occurrence of the current event. FIG. 7 is a flowchart illustrating processing for classifying states of the banks 220 to 227. However, processing in the present flowchart is assumed to be performed independently with respect to each bank. This means that, on the above-mentioned computer apparatus, processing in the flowchart illustrated in FIG. 7 is performed eight times corresponding to the number of banks. The flowchart is compatible with any bank, and, therefore, receives a bank number in inputting of an argument in step 701, thus identifying a target bank based on the bank number. Referring to FIG. 7, in step 701, the bank state classification unit 103 receives a bank number as an argument. In step 702 and step 703, the bank state classification unit 103 initializes variables which are used in the present processing. In step 702, the bank state classification unit 103 resets state fixing time (FIX_TIME). Specifically, the bank state classification unit 103 sets 0 to FIX_TIME. While the method used for the state fixing time (FIX_TIME) is described below, the present value thereof means that the state of a bank has been determined until that time. In step 703, the bank state classification unit 103 resets occurrence time of a just previous command and a type thereof. Specifically, the bank state classification unit 103 sets 0 to SAME_PRE_TIME, which indicates occurrence time of a just previous command with respect to a bank indicated by the bank number as an argument, and sets UNDEF, which indicates "undefined", to SAME_PRE_CMD, which indicates the type of that command. Additionally, the bank state classification unit 103 sets 0 to DIFF_PRE_TIME, which indicates occurrence time of a just previous command with respect to a bank other than the bank indicated by the bank number as an argument, and sets UNDEF, which indicates "undefined", to DIFF_PRE_CMD, which indicates the type of that command. Next, in step 704, the bank state classification unit 103 reads one event information entry from the event information 102 serving as an input. This is equivalent to information in one row in an example of the event information 102 illustrated in FIG. 6. From here, in step 707 to step 722, the bank state classification unit 103 classifies bank states. The bank states to be classified are three states, i.e., an operating state, an inoperative state, and a pause state, as mentioned above.

First, in step 707, the bank state classification unit 103 determines whether a bank address 603 of the current event information entry coincides with the bank number serving as an argument. If it is determined that the bank address 603 does not coincide with the bank number (NO in step 707), in the current event information entry, the state transition of a target bank does not occur. Therefore, in step 727, the bank state classification unit 103 updates DIFF_PRE_CMD and DIFF_PRE_TIME based on a command 602 and occurrence time 601 of the current event information entry. More specifically, the bank state classification unit 103 sets the command 602 of the current event information entry to DIFF_PRE_CMD, and sets the occurrence time 601 of the current event information entry to DIFF_PRE_TIME. On the other hand, if it is determined that the bank address 603 of the current event information entry coincides with the bank number serving as an argument (YES in step 707), the bank state classification unit 103 advances the processing to step 708. In step 708, the bank state classification unit 103 determines whether a just previous command with respect to a target bank, i.e., SAME_PRE_CMD, is RD command or WR command. In a case where determination is first performed at branching in step 708, since UNDEF is set to SAME_PRE_CMD, the result of such determination is necessarily NO. If it is determined that SAME_PRE_CMD is RD command or WR command (YES in step 708), then in step 709, the bank state classification unit 103 classifies a period of four clock cycles from FIX_TIME as an operating state. The bank state classification unit 103 outputs, as the bank state information 104, the classification result together with the occurrence time (FIX_TIME at this time) and four cycles serving as occurrence cycles. Then, in step 710, the bank state classification unit 103 adds four clock cycles to FIX_TIME, thus updating time at which the state has been fixed. On the other hand, if the result of determination in step 708 is NO, then in step 711, the bank state classification unit 103 determines whether a just previous command with respect to a target bank, i.e., SAME_PRE_CMD, is REF command. In a case where determination is first performed at branching in step 711, since UNDEF is set to SAME_PRE_CMD, the result of such determination is necessarily NO. If it is determined that SAME_PRE_CMD is REF command (YES in step 711), then in step 712, the bank state classification unit 103 classifies a period of 500 clock cycles from FIX_TIME as an inoperative state. The bank state classification unit 103 outputs, as the bank state information 104, the classification result together with the occurrence time (FIX_TIME at this time) and 500 cycles serving as occurrence cycles. Then, in step 713, the bank state classification unit 103 adds 500 clock cycles to FIX_TIME, thus updating time at which the state has been fixed. In a case where processing in step 710 has been performed, in a case where processing in step 713 has been performed, and in a case where the result of determination in step 711 is NO, the bank state classification unit 103 advances the processing to step 714. In step 714, the bank state classification unit 103 determines, using a just previous command with respect to a target bank, i.e., SAME_PRE_CMD, and the command 602 of the current event information entry, whether there is a coincidence with cycles set for the matching conditions in the table illustrated in FIG. 8. For example, in a case where the command 602 of the current event information entry is ACT command and SAME_PRE_CMD is PRE command, a period of 40 cycles is set based on the table illustrated in FIG. 8. In this case, the bank state classification unit 103 determines whether a period from SAME_PRE_TIME, which is the occurrence time of a just previous PRE command, to the occurrence time of a target ACT command, i.e., the occurrence time 601 of the current event information entry, coincides with 30 cycles. With regard to other types of commands, similarly, the bank state classification unit 103 also performs determination based on the table illustrated in FIG. 8. A case where the number of clock cycles is not set in the table illustrated in FIG. 8 means that there is no constraint, and is, therefore, determined to be NO in a result of the determination. If the result of the determination is YES (YES in step 714), then in step 715, the bank state classification unit 103 classifies a period from FIX_TIME to the occurrence time 601 of the current event information entry as an inoperative state. The bank state classification unit 103 outputs, as the bank state information 104, the classification result together with the occurrence time (FIX_TIME at this time) and the occurrence cycles. At this time, it should be noted that the period to be output is not a period from SAME_PRE_TIME, which is the occurrence time of a just previous command with respect to a target bank, to the occurrence time 601 of the current event information entry. The reason for this is described with a case where the command 602 of the current event information entry is PRE command and SAME_PRE_CMD is RD command taken as an example. In the present example, a period of 50 cycles is set based on table illustrated in FIG. 8. Therefore, the bank state classification unit 103 determines whether a period from SAME_

PRE_TIME, which is the occurrence time of RD command, to the occurrence time 601 of the current PRE command is 50 cycles. At this time, FIX_TIME and SAME_PRE_TIME do not coincide with each other in time. This is because, since SAME_PRE_CMD is RD command, a period of four clock cycles has been previously added to FIX_TIME in step 710. Therefore, if the bank state classification unit 103 classifies a period of 50 cycles from SAME_PRE_TIME to the occurrence time 601 of the current event information entry as an inoperative state, the bank state classification unit 103 would doubly classify a period of four clock cycles from SAME_PRE_TIME. To avoid this, the bank state classification unit 103 classifies a period of 46 clock cycles obtained by subtraction from FIX_TIME as an inoperative state. Furthermore, after performing classification into an inoperative state in step 715, then in step 716, the bank state classification unit 103 adds a difference between FIX_TIME and the occurrence time 601 of the current event information entry to FIX_TIME, thus updating time at which the state has been fixed. As a result, the state of FIX_TIME=the occurrence time 601 of the current event information entry is obtained. On the other hand, if, in step 714, no constraint is set in the table illustrated in FIG. 8 or the set constraint and a period from SAME_PRE_TIME to the occurrence time 601 of the current event information entry do not coincide with each other (NO in step 714), the bank state classification unit 103 advances the processing to step 717. In step 717 and subsequent steps, in the same manner in which, in step 714 to step 716, the bank state classification unit 103 has checked a constraint from a just previous command with respect to a target bank, the bank state classification unit 103 checks a constraint from a just previous command with respect to other than a target bank. Before checking a constraint, the bank state classification unit 103 checks whether the occurrence time of a just previous command with respect to other than a target bank, i.e., DIFF_PRE_TIME, is later than FIX_TIME. In the present flowchart, the bank state classification unit 103 checks the state transition of a bank and classifies the state of the bank only in a case where the command 602 of the current event information entry is a target bank as with branching in step 707. As a result, SAME_PRE_TIME, which is the occurrence time of a command with respect to a target bank, necessarily coincides with FIX_TIME at the time point of step 707. Moreover, even in subsequent processing, since there is only the possibility of addition to FIX_TIME, the state of FIX_TIME≥SAME_PRE_TIME has always been obtained. However, in a case where the command 602 of the current event information entry is a just previous command with respect to other than a target bank, branching is performed in step 707, so that the state transition is not performed. As a result, the state of FIX_TIME<DIFF_PRE_TIME may be obtained. If such a condition (FIX_TIME<DIFF_PRE_TIME) is satisfied, prior to analyzing a constraint from a just previous command with respect to other than a target bank, it is necessary to set a period up to the command as a pause state. In step 718, the bank state classification unit 103 classifies a period from FIX_TIME to the occurrence time of a just previous command with respect to other than a target bank, i.e., DIFF_PRE_TIME, as a pause state. The bank state classification unit 103 outputs, as the bank state information 104, the classification result together with the occurrence time (FIX_TIME at this time) and the occurrence cycles. Next, in step 719, the bank state classification unit 103 adds a difference between FIX_TIME and DIFF_PRE_TIME to FIX_TIME, thus advancing time at which the state has been fixed. As a result, the state of FIX_TIME=DIFF_PRE_TIME is obtained. Furthermore, if, in step 717, the state of FIX_TIME<DIFF_PRE_TIME is not obtained and after processing in step 719 is performed, the bank state classification unit 103 advances the processing to step 720. In step 720, the bank state classification unit 103 determines, using a just previous command with respect to other than a target bank, i.e., DIFF_PRE_CMD, and the command 602 of the current event information entry, whether there is a coincidence with cycles set for the matching conditions in the table illustrated in FIG. 8. For example, in a case where the command 602 of the current event information entry is WR command and DIFF_PRE_CMD is RD command, a period of 15 cycles is set based on the table illustrated in FIG. 8. In this case, the bank state classification unit 103 determines whether a period from DIFF_PRE_TIME, which is the occurrence time of RD command, to the occurrence time of a target WR command, i.e., the occurrence time 601 of the current event information entry, coincides with 15 cycles. With regard to other types of commands, similarly, the bank state classification unit 103 also performs determination based on the table illustrated in FIG. 8. A case where the number of clock cycles is not set in the table illustrated in FIG. 8 means that there is no constraint, and is, therefore, determined to be NO in a result of the determination. If the result of the determination is YES (YES in step 720), then in step 721, the bank state classification unit 103 classifies a period from FIX_TIME to the occurrence time 601 of the current event information entry as an inoperative state. The bank state classification unit 103 outputs, as the bank state information 104, the classification result together with the occurrence time (FIX_TIME at this time) and the occurrence cycles. At this time, it should be noted that the period to be output is not a period from DIFF_PRE_TIME, which is the occurrence time of a just previous command with respect to other than a target bank, to the occurrence time 601 of the current event information entry. The reason for this is the same as that described above in the description of step 715. Furthermore, after performing classification into an inoperative state in step 721, then in step 722, the bank state classification unit 103 adds a difference between FIX_TIME and the occurrence time 601 of the current event information entry to FIX_TIME, thus updating time at which the state has been fixed. As a result, the state of FIX_TIME=the occurrence time 601 of the current event information entry is obtained. On the other hand, if, in step 720, no constraint is set in the table illustrated in FIG. 8 or the set constraint and a period from DIFF_PRE_TIME to the occurrence time 601 of the current event information entry do not coincide with each other (NO in step 720), the bank state classification unit 103 advances the processing to step 723. In step 723, the bank state classification unit 103 classifies a period from FIX_TIME to the occurrence time 601 of the current event information entry as a pause state. The bank state classification unit 103 outputs, as the bank state information 104, the classification result together with the occurrence time (FIX_TIME at this time) and the occurrence cycles. Next, in step 724, the bank state classification unit 103 adds a difference between FIX_TIME and the occurrence time 601 of the current event information entry to FIX_TIME, thus updating time at which the state has been fixed. As a result, the state of FIX_TIME=occurrence time 601 of the current event information entry is obtained. Furthermore, in a case where processing in step 716, step 722, or step 724 has been performed, the bank state classification unit 103 advances the processing to step 725. In step 725, the bank state classification unit 103 updates SAME_PRE_CMD and SAME_PRE_TIME based on the command 602 and the occurrence time 601 of the current event information entry. More specifically, the bank state classification unit 103 sets the command 602 of the current event information entry to SAME_PRE_CMD and sets the occurrence time 601 of the current event information entry to SAME_PRE_TIME. Finally, in step 726, the bank state classification unit 103 determines whether there is a next event information entry in the event information 102 serving as an input, and, if it is determined that there is a next event information entry (YES in step 726), the bank state classification unit 103 returns the processing to step 704, thus repeating the processing. On the other hand, if it is determined that there is no event information entry (NO in step 726), the bank state classification unit 103 ends the processing. Thus far is the content of the bank state classification unit 103 in the first exemplary embodiment. The first exemplary embodiment has been described on the premise that, with regard to constraints between the respective commands, a plurality of constraints does not concurrently occur. However, actually, a case where, with respect to a command indicated by an event information entry targeted for processing, a plurality of commands which has been issued before that command applies constrains concurrently may occur. For example, suppose that ACT command, RD command, and PRE command have been issued in sequence. In this case, when the last command, i.e., PRE command, is processed, there is a constraint defined by the tRAS parameter between PRE command and ACT command. Similarly, there is another constraint between PRE command and RD command. While, in many cases, the timing of PRE command is determined by any one of the constraints, the constraints may be applied concurrently in some cases. In any case, the bank state classification unit 103 in the first exemplary embodiment only preserves information about only one command just previously issued as a history (SAME_PRE_TIME and SAME_PRE_CMD). Therefore, in the case of the above-mentioned example, the bank state classification unit 103 is not able to determine a constraint applied from ACT command. However, the present premise does not limit the present exemplary embodiment. For example, if the bank state classification unit 103 retains at least two histories and determines each of the respective constraints in the histories in step 714, the bank state classification unit 103 is able to cope with the above-mentioned example. Besides, if the bank state classification unit 103 is configured to list constraints which may occur due to the standard of SDRAM targeted for analysis and the constraint of the memory controller 205 and to preserve histories which are able to be used to cope with all of the listed constraints, there is no constraint which is not able to be coped with.

Figure 10:
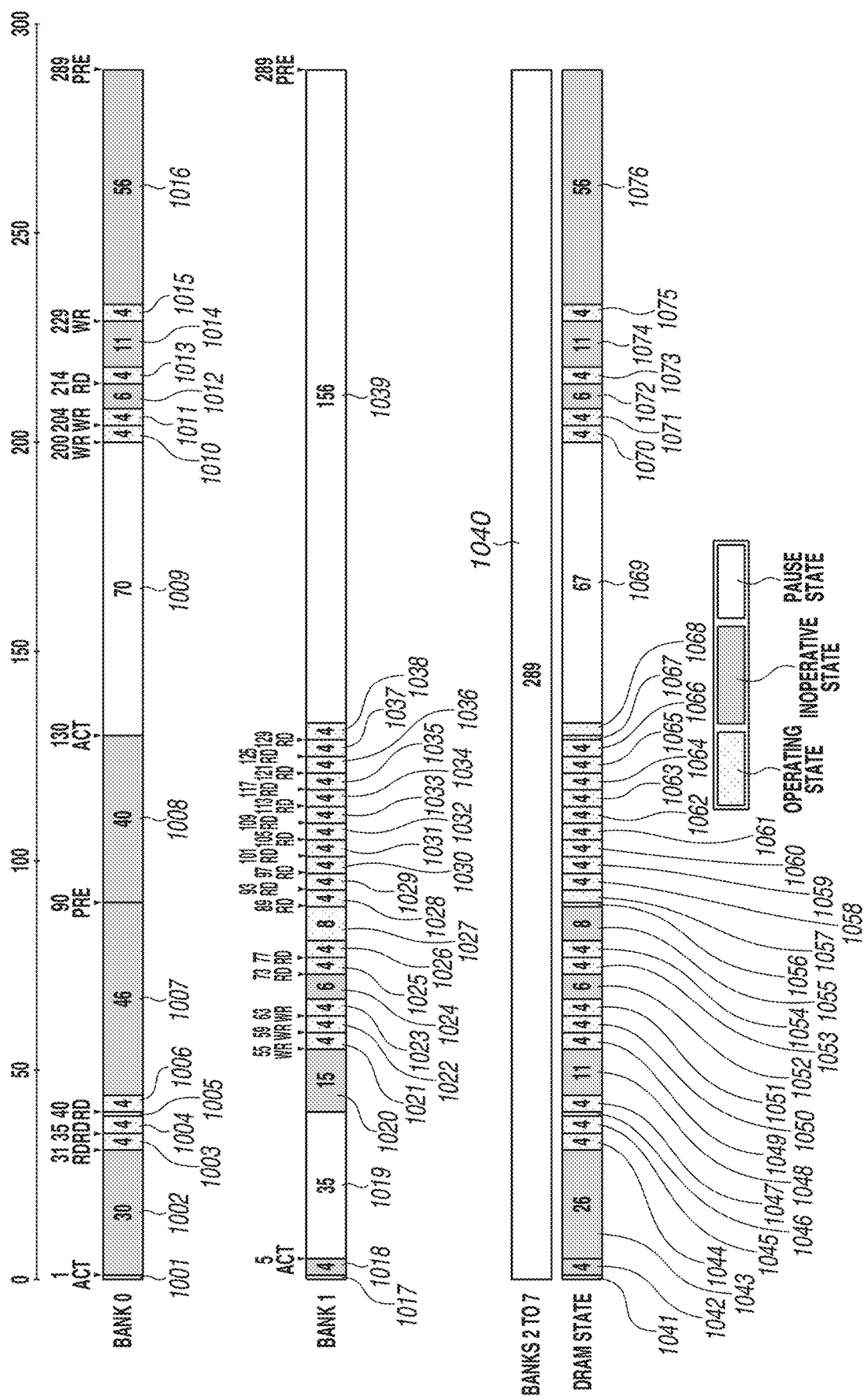
FIG. 10 is a diagram illustrating processing results which are obtained by the bank state classification unit and the DRAM state classification unit from the output states illustrated in FIG. 6.

In the following description, processing which is performed by the bank state classification unit 103 is specifically described using an example in which event information entries 610 to 638 illustrated in FIG. 6 are actually input with respect to the bank 220, i.e., bank number 0. In the present example, one clock cycle=1,000 ps is premised. When the event information entries 610 to 638 have been input, processing results 1001 to 1016 illustrated in FIG. 10 are obtained. In the following description, processing performed on the event information entries 610 to 638 is described with reference to the obtained processing results. First, before inputting of an event information entry, in step 701, the bank number 0 is input. In step 702 and step 703, resetting is performed as FIX_TIME=0, SAME_PRE_TIME=0, SAME_PRE_CMD=UNDEF, DIFF_PRE_TIME=0, and DIFF_PRE_CMD=UNDEF. Next, in step 704, the event information entry 610 is read. The bank address 603 of the event information entry 610 is 0 and, therefore, coincides with the bank number serving as an argument. Therefore, the result of determination in step 707 is YES. Since SAME_PRE_CMD at this time is UNDEF, each of the results of determination in step 708, step 711, and step 714 is NO. Additionally, since, at this time, FIX_TIME=0, DIFF_PRE_TIME=0, and DIFF_PRE_CMD=UNDEF, each of the results of determination in step 717 and step 720 is NO. As a result, in step 723, a period of one clock cycle from FIX_TIME=0 to the occurrence time "1000" of the event information entry 610 is classified as a pause state. Next, in step 724, FIX_TIME is set to 1000. Referring to FIG. 10, a pause state 1001 for one cycle has been determined, and, after that, in step 725, SAME_PRE_CMD=ACT and SAME_PRE_TIME=1000 are set and the processing returns to step 704 via step 726.

Next, the event information entry 611 is read and processing thereon is performed. The bank address 603 of the event information entry 611 is 1 and, therefore, does not coincide with the bank number serving as an argument. Therefore, the result of determination in step 707 is NO. In this case, in step 727, DIFF_PRE_CMD=ACT and DIFF_PRE_TIME=5000 are set, and the processing returns to step 704 via step 726.

In processing performed on the event information entry 612, the bank address 603 thereof is 0 and, therefore, coincides with the bank number serving as an argument. Therefore, the result of determination in step 707 is YES. Since SAME_PRE_CMD at this time is ACT command, each of the results of determination in step 708 and step 711 is NO. In step 714, since, in the table illustrated in FIG. 8, SAME_PRE_CMD is ACT command and the command 602 of the current event information entry 612 is RD command, a period of 30 cycles is applicable. On the other hand, since the occurrence time 601 of the current event information entry 612 is 31000, a period from SAME_PRE_TIME becomes 31000-1000=30000 and is thus found to be 30 clock cycles. Since the results coincide with each other, the result of determination in step 714 is YES, and, in step 715, a period of 30 clock cycles from FIX_TIME=1000 to the occurrence time 601 "31000" of the current event information entry 612 is classified as an inoperative state. Next, in step 716, FIX_TIME is set to 31000. Referring to FIG. 10, an inoperative state 1002 for 30 cycles has been determined. After that, in step 725, SAME_PRE_CMD=RD and SAME_PRE_TIME=31000 are set, and the processing returns to step 704 via step 726.

In processing performed on the event information entry 613, the bank address 603 thereof is 0 and, therefore, coincides with the bank number serving as an argument. Therefore, the result of determination in step 707 is YES. Since SAME_PRE_CMD at this time is RD command, the result of determination in step 708 is YES. Accordingly, in step 709, a period of four clock cycles from FIX_TIME "31000" is classified as an operating state. Next, in step 710, FIX_TIME is set to 35000. Then, the result of determination in step 714 is NO. Additionally, since, at this time, FIX_TIME=35000, DIFF_PRE_TIME=5000, and DIFF_PRE_CMD=ACT are set, each of the results of determination in step 717 and step 720 is NO. As a result, while, in step 723, a period from FIX_TIME=35000 to the occurrence time 601 "35000" of the current event information entry 613 is intended to be classified as a pause state, since a difference between them is 0, eventually, classification is not performed. Therefore, since, even in step 724, FIX_TIME=35000 coincides with the occurrence time 601 "35000" of the current event information entry 613, updating is not substantially performed. Referring to FIG. 10, an operating state 1003 for four cycles has been determined. After that, in step 725, SAME_PRE_CMD=RD and SAME_PRE_TIME=35000 are set, and the processing returns to step 704 via step 726.

In processing performed on the event information entry 614, the bank address 603 thereof is 0 and, therefore, coincides with the bank number serving as an argument. Therefore, the result of determination in step 707 is YES. Since SAME_PRE_CMD at this time is RD command, the result of determination in step 708 is YES. Accordingly, in step 709, a period of four clock cycles from FIX_TIME "35000" is classified as an operating state. Next, in step 710, FIX_TIME is set to 39000. Then, the result of determination in step 714 is NO. Additionally, since, at this time, FIX_TIME=39000, DIFF_PRE_TIME=5000, and DIFF_PRE_CMD=ACT are set, each of the results of determination in step 717 and step 720 is NO. As a result, in step 723, unlike in the case of the event information entry 613, a period of one clock cycle from FIX_TIME=39000 to the occurrence time 601 "40000" of the current event information entry 614 is classified as a pause state. Next, in step 724, FIX_TIME is set to 40000. Referring to FIG. 10, an operating state 1004 for four cycles and a pause state 1005 for one cycle have been determined. After that, in step 725, SAME_PRE_CMD=RD and SAME_PRE_TIME=40000 are set, and the processing returns to step 704 via step 726.

From here, in processing performed on the event information entries 615 to 620, the bank address 603 is 1 and, therefore, does not coincide with the bank number serving as an argument. Therefore, the result of determination in step 707 is NO. In this case, in step 727, DIFF_PRE_CMD and DIFF_PRE_TIME are only updated, and the processing ends. At the time of ending of processing performed on the event information entry 620, DIFF_PRE_CMD=RD and DIFF_PRE_TIME=89000 are set.

In processing performed on the event information entry 621, the bank address 603 is 0 and, therefore, coincides with the bank number serving as an argument. Therefore, the result of determination in step 707 is YES. Since SAME_PRE_CMD at this time is RD command, the result of determination in step 708 is YES. Accordingly, in step 709, a period of four clock cycles from FIX_TIME "40000" is classified as an operating state. Next, in step 710, FIX_TIME is set to 44000. Then, in step 714, in the table illustrated in FIG. 8, since SAME_PRE_CMD is RD command and the command 602 of the current event information entry 621 is PRE command, a period of 50 cycles is applicable. On the other hand, since the occurrence time 601 of the current event information entry 621 is 90000, a period from SAME_PRE_TIME becomes 90000−40000=50000 and is thus found to be 50 clock cycles. Since the results coincide with each other, the result of determination in step 714 is YES, and, in step 715, a period of 46 clock cycles from FIX_TIME=44000 to the occurrence time 601 "90000" of the current event information entry 621 is classified as an inoperative state. Next, in step 716, FIX_TIME is set to 90000. Referring to FIG. 10, an operating state 1006 for four cycles and an inoperative state 1007 for 46 cycles have been determined. After that, in step 725, SAME_PRE_CMD=PRE and SAME_PRE_TIME=90000 are set, and the processing returns to step 704 via step 726.

From here, in processing performed on the event information entries 622 to 631, the bank address 603 is 1 and, therefore, does not coincide with the bank number serving as an argument. Therefore, the result of determination in step 707 is NO. In this case, in step 727, DIFF_PRE_CMD and DIFF_PRE_TIME are only updated, and the processing ends. At the time of ending of processing performed on the event information entry 631, DIFF_PRE_CMD=RD and DIFF_PRE_TIME=129000 are set.

In processing performed on the event information entry 632, the bank address 603 is 0 and, therefore, coincides with the bank number serving as an argument. Therefore, the result of determination in step 707 is YES. Since SAME_PRE_CMD at this time is PRE command, each of the results of determination in step 708 and step 711 is NO. In step 714, since, in the table illustrated in FIG. 8, SAME_PRE_CMD is PRE command and the command 602 of the current event information entry 632 is ACT command, a period of 40 cycles is applicable. On the other hand, since the occurrence time 601 of the current event information entry 632 is 130000, a period from SAME_PRE_TIME becomes 130000−90000=40000 and is thus found to be 40 clock cycles. Since the results coincide with each other, the result of determination in step 714 is YES, and, in step 715, a period of 40 clock cycles from FIX_TIME=90000 to the occurrence time 601 "130000" of the current event information entry 632 is classified as an inoperative state. Next, in step 716, FIX_TIME is set to 130000. Referring to FIG. 10, an inoperative state 1008 for 40 cycles has been determined. After that, in step 725, SAME_PRE_CMD=ACT and SAME_PRE_TIME=130000 are set, and the processing returns to step 704 via step 726.

In processing performed on the event information entry 633, the bank address 603 is 0 and, therefore, coincides with the bank number serving as an argument. Therefore, the result of determination in step 707 is YES. Since SAME_PRE_CMD at this time is ACT command, each of the results of determination in step 708 and step 711 is NO. In step 714, since, in the table illustrated in FIG. 8, SAME_PRE_CMD is ACT command and the command 602 of the current event information entry 633 is WR command, a period of 30 cycles is applicable. On the other hand, since the occurrence time 601 of the current event information entry 633 is 200000, a period from SAME_PRE_TIME becomes 200000−130000=70000 and is thus found to be 70 clock cycles. Since the results do not coincide with each other, the result of determination in step 714 is NO. Additionally, since, at this time, FIX_TIME=130000, DIFF_PRE_TIME=129000, and DIFF_PRE_CMD=RD are set, each of the results of determination in step 717 and step 720 is NO. As a result, in step 723, a period of 70 clock cycles from FIX_TIME=130000 to the occurrence time 601 "200000" of the current event information entry 633 is classified as a pause state. Next, in step 724, FIX_TIME is set to 200000. Referring to FIG. 10, a pause state 1009 for 70 cycles has been determined. After that, in step 725, SAME_PRE_CMD=WR and SAME_PRE_TIME=200000 are set, and the processing returns to step 704 via step 726.

In processing performed on the event information entry 634, the bank address 603 thereof is 0 and, therefore, coincides with the bank number serving as an argument. Therefore, the result of determination in step 707 is YES. Since SAME_PRE_CMD at this time is WR command, the result of determination in step 708 is YES. Accordingly, in step 709, a period of four clock cycles from FIX_TIME "200000" is classified as an operating state. Next, in step 710, FIX_TIME is set to 204000. Then, the result of determination in step 714 is NO. Additionally, since, at this time, FIX_TIME=204000, DIFF_PRE_TIME=129000, and DIFF_PRE_CMD=RD are set, each of the results of determination in step 717 and step 720 is NO. As a result, while, in step 723, a period from FIX_TIME=204000 to the occurrence time 601 "204000" of the current event information entry 634 is intended to be classified as a pause state, since a difference between them is 0, eventually, classification is not performed. Therefore, since, even in step 724, FIX_TIME=204000 coincides with the occurrence time 601 "204000" of the current event information entry 634, updating is not substantially performed. Referring to FIG. 10, an operating state 1010 for four cycles has been determined. After that, in step 725, SAME_PRE_CMD=WR and SAME_PRE_TIME=204000 are set, and the processing returns to step 704 via step 726.

In processing performed on the event information entry 635, the bank address 603 is 0 and, therefore, coincides with the bank number serving as an argument. Therefore, the result of determination in step 707 is YES. Since SAME_PRE_CMD at this time is WR command, the result of determination in step 708 is YES. Accordingly, in step 709, a period of four clock cycles from FIX_TIME "204000" is classified as an operating state. Next, in step 710, FIX_TIME is set to 208000. Then, in step 714, in the table illustrated in FIG. 8, since SAME_PRE_CMD is WR command and the command 602 of the current event information entry 635 is RD command, a period of 10 cycles is applicable. On the other hand, since the occurrence time 601 of the current event information entry 635 is 214000, a period from SAME_PRE_TIME becomes 214000−204000=10000 and is thus found to be 10 clock cycles. Since the results coincide with each other, the result of determination in step 714 is YES, and, in step 715, a period of six clock cycles from FIX_TIME=208000 to the occurrence time 601 "214000" of the current event information entry 635 is classified as an inoperative state. Next, in step 716, FIX_TIME is set to 214000. Referring to FIG. 10, an operating state 1011 for four cycles and an inoperative state 1012 for six cycles have been determined. After that, in step 725, SAME_PRE_CMD=RD and SAME_PRE_TIME=214000 are set, and the processing returns to step 704 via step 726.

In processing performed on the event information entry 636, the bank address 603 is 0 and, therefore, coincides with the bank number serving as an argument. Therefore, the result of determination in step 707 is YES. Since SAME_PRE_CMD at this time is RD command, the result of determination in step 708 is YES. Accordingly, in step 709, a period of four clock cycles from FIX_TIME "214000" is classified as an operating state. Next, in step 710, FIX_TIME is set to 218000. Then, in step 714, in the table illustrated in FIG. 8, since SAME_PRE_CMD is RD command and the command 602 of the current event information entry 636 is WR command, a period of 15 cycles is applicable. On the other hand, since the occurrence time 601 of the current event information entry 636 is 229000, a period from SAME_PRE_TIME becomes 229000−214000=15000 and is thus found to be 15 clock cycles. Since the results coincide with each other, the result of determination in step 714 is YES, and, in step 715, a period of 11 clock cycles from FIX_TIME=218000 to the occurrence time 601 "229000" of the current event information entry 636 is classified as an inoperative state. Next, in step 716, FIX_TIME is set to 229000. Referring to FIG. 10, an operating state 1013 for four cycles and an inoperative state 1014 for 11 cycles have been determined. After that, in step 725, SAME_PRE_CMD=WR and SAME_PRE_TIME=229000 are set, and the processing returns to step 704 via step 726.

In processing performed on the event information entry 637, the bank address 603 is 0 and, therefore, coincides with the bank number serving as an argument. Therefore, the result of determination in step 707 is YES. Since SAME_PRE_CMD at this time is WR command, the result of determination in step 708 is YES. Accordingly, in step 709, a period of four clock cycles from FIX_TIME "229000" is classified as an operating state. Next, in step 710, FIX_TIME is set to 233000. Then, in step 714, in the table illustrated in FIG. 8, since SAME_PRE_CMD is WR command and the command 602 of the current event information entry 637 is WR command, a period of 60 cycles is applicable. On the other hand, since the occurrence time 601 of the current event information entry 637 is 289000, a period from SAME_PRE_TIME becomes 289000−229000=60000 and is thus found to be 60 clock cycles. Since the results coincide with each other, the result of determination in step 714 is YES, and, in step 715, a period of 56 clock cycles from FIX_TIME=233000 to the occurrence time 601 "289000" of the current event information entry 637 is classified as an inoperative state. Next, in step 716, FIX_TIME is set to 289000. Referring to FIG. 10, an operating state 1015 for four cycles and an inoperative state 1016 for 56 cycles have been determined. After that, in step 725, SAME_PRE_CMD=WR and SAME_PRE_TIME=289000 are set, and the processing returns to step 704 via step 726.

In processing performed on the event information entry 638, the bank address 603 is 1 and, therefore, does not coincide with the bank number serving as an argument. Therefore, the result of determination in step 707 is NO. In this case, in step 727, DIFF_PRE_CMD=ACT and DIFF_PRE_TIME=5000 are set. Additionally, since, in step 726, there is no more event information entry, the processing ends.

Thus far is the state classification processing for the bank 220 with bank number 0, which is performed by the bank state classification unit 103. Next, processing which is performed by the bank state classification unit 103 when event information entries 610 to 638 illustrated in FIG. 6 are input to the bank 221 with bank number 1.

First, before inputting of an event information entry, in step 701, the bank number 1 and a unit time "10,000,000 ps" are input. Processing operations in next steps 702, 703, and 704 are similar to those for the bank 220, and, therefore, the detailed description thereof is omitted here.

In processing performed on the event information entry 610, the bank address 603 thereof is 0 and, therefore, does not coincide with the bank number serving as an argument. Therefore, the result of determination in step 707 is NO. In this case, in step 727, DIFF_PRE_CMD=ACT and DIFF_PRE_TIME=1000 are set, and the processing returns to step 704 via step 726.

In processing performed on the event information entry 611, the bank address 603 is 1 and, therefore, the result of determination in step 707 is YES. Since, at this time, FIX_TIME=0, SAME_PRE_CMD=UNDEF, DIFF_PRE_CMD=UNDEF, and DIFF_PRE_TIME=1000, each of the results of determination in step 708, step 711, and step 714 is NO. Next, in step 717, since FIX_TIME<DIFF_PRE_TIME is satisfied, the result of determination is YES, and, in step 718, a period of one clock cycle from FIX_TIME=0 is classified as a pause state. After that, in step 719, FIX_TIME is set to 1000. Then, in step 720, since, in the table illustrated in FIG. 8, DIFF_PRE_CMD is ACT command and the command 602 of the current event information entry 611 is ACT command, a period of four cycles is applicable. On the other hand, since DIFF_PRE_TIME is 1000 and the occurrence time 601 of the event information entry 611 is 5000, the results coincide with each other, and, therefore, the result of determination in step 720 is YES. As a result, in step 721, a period of four clock cycles from FIX_TIME=1000 is classified as an inoperative state. After that, in step 724, FIX_TIME is set to 5000. Referring to FIG. 10, a pause state 1017 for one cycle and an inoperative state 1018 for four cycles have been determined. After that, in step 725, SAME_PRE_CMD=ACT and SAME_PRE_TIME=5000 are set, and the processing returns to step 704 via step 726.

In processing performed on the event information entries 612, 613, and 614, since the bank address 603 does not coincide with the bank number serving as an argument, in step 727, DIFF_PRE_CMD and DIFF_PRE_TIME are updated. As a result, DIFF_PRE_CMD=RD and DIFF_PRE_TIME=40000 are set.

In processing performed on the event information entry 615, the bank address 603 is 1 and, therefore, the result of determination in step 707 is YES. Since, at this time, FIX_TIME=5000, SAME_PRE_CMD=ACT, DIFF_PRE_CMD=RD, and DIFF_PRE_TIME=40000, each of the results of determination in step 708, step 711, and step 714 is NO. Next, in step 717, since FIX_TIME<DIFF_PRE_TIME is satisfied, the result of determination is YES, and, in step 718, a period of 35 clock cycles from FIX_TIME=5000 is classified as a pause state. After that, in step 719, FIX_TIME is set to 40000. Then, in step 720, since, in the table illustrated in FIG. 8, DIFF_PRE_CMD is RD command and the command 602 of the current event information entry 615 is WR command, a period of 15 cycles is applicable. On the other hand, since DIFF_PRE_TIME is 40000 and the occurrence time 601 of the event information entry 615 is 55000, the results coincide with each other, and, therefore, the result of determination in step 720 is YES. As a result, in step 721, a period of 15 clock cycles from FIX_TIME=40000 is classified as an inoperative state. After that, in step 724, FIX_TIME is set to 55000. Referring to FIG. 10, a pause state 1019 for 35 cycles and an inoperative state 1020 for 15 cycles have been determined. After that, in step 725, SAME_PRE_CMD=WR and SAME_PRE_TIME=55000 are set, and the processing returns to step 704 via step 726.

Subsequent processing operations are performed in a way similar to those described above. As a result, states 1021 to 1039 illustrated in FIG. 10 are determined. With regard to the bank 222 to the bank 227, since any control command has not been issued according to the event information 102 illustrated in FIG. 6, all of the banks 222 to 227 are assumed to be in a pause state.

Furthermore, each of the bank states classified in the respective steps is output to the bank state information 104 together with the occurrence time (FIX_TIME at this time) and the number of occurrence cycles. Eight pieces of information about the banks 220 to 227 are divisionally stored in the bank state information 104. From here, the DRAM state classification unit 105, which classifies the state of the DRAM 209 based on the states of the banks 220 to 227, is described. First, types of the state of the DRAM 209, which is classified by the DRAM state classification unit 105, is described. In the first exemplary embodiment, the DRAM state is assumed to include three states, i.e., an operating state, a pause state, and an inoperative state, as with the bank state. The DRAM state is classified as follows according to the respective cases.

Operating state: A case where the state of at least one bank is a pause state.
Inoperative state: A case where none of the states of the banks is an operating state and the state of at least one bank is an inoperative state.
Pause state: A case where the states of all of the banks are a pause state.

This allows classifying the state of DRAM even in a case where the respective banks are in different states.

Figure 9:
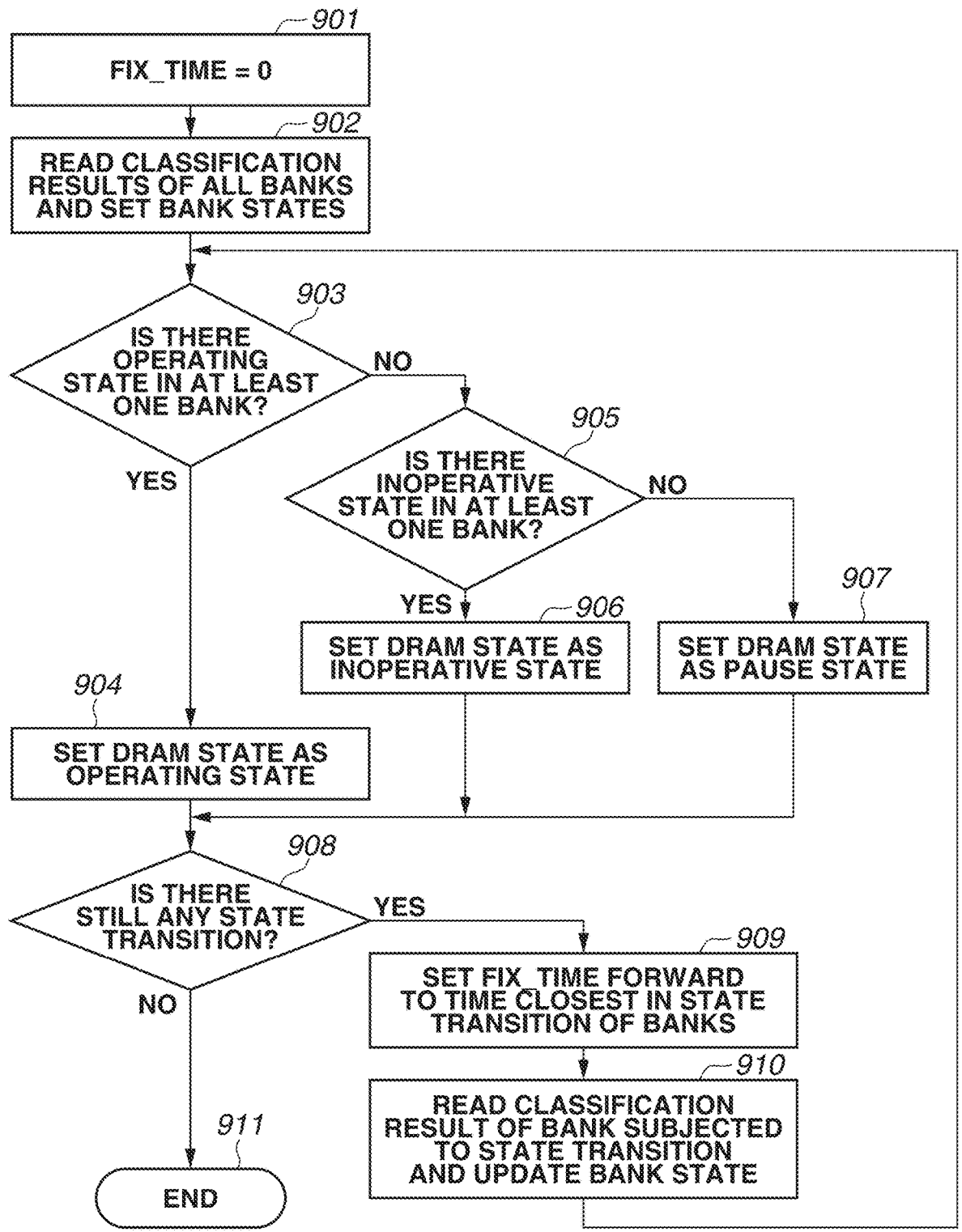
FIG. 9 is a flowchart illustrating processing which is performed by a DRAM state classification unit in the first exemplary embodiment.

FIG. 9 is a flowchart illustrating the flow of steps which are performed by the DRAM state classification unit 105. Details of the DRAM state classification unit 105 are described with reference to FIG. 9. First, in step 901, the DRAM state classification unit 105 resets state fixing time (FIX_TIME). Specifically, the DRAM state classification unit 105 sets 0 to FIX_TIME. While the method used for the state fixing time (FIX_TIME) is described below, the present value thereof means that the state of the DRAM 209 has been determined until that time. Next, in step 902, the DRAM state classification unit 105 reads, from the bank state information 104, the classification results of the respective banks 220 to 227 one by one and sets the states of the respective banks. As mentioned above, each classification result includes a set of the state of the bank, the occurrence time, and the occurrence cycle. From here, in steps 903, 904, 905, 906, and 907, the DRAM state classification unit 105 classifies the DRAM state. More specifically, in step 903, the DRAM state classification unit 105 determines whether there is an operating state in at least one of the banks 220 to 227. If the result of determination in step 903 is YES, then in step 904, the DRAM state classification unit 105 sets the DRAM state to an operating state. On the other hand, if the result of determination in step 903 is NO, then in step 905, the DRAM state classification unit 105 determines whether there is an inoperative state in at least one of the banks 220 to 227. If the result of determination in step 905 is YES, then in step 906, the DRAM state classification unit 105 sets the DRAM state to an inoperative state. On the other hand, if the result of determination in step 905 is NO, since all of the banks are in a pause state, then in step 907, the DRAM state classification unit 105 sets the DRAM state to a pause state. The DRAM state classification unit 105 outputs the result of setting of the DRAM state obtained in any of step 904, step 906, and step 907 to the DRAM state information 106. The result of setting is associated with FIX_TIME obtained at this time, which indicates the occurrence time, and a period corresponding to the smallest value of the occurrence cycles of the banks 220 to 227, which indicates the occurrence cycle. After that, in a cases where the DRAM state is set to any of an operating state, an inoperative state, and a pause state, the DRAM state classification unit 105 advances the processing to step 908. In step 908, the DRAM state classification unit 105 determines whether the classification result of any of the banks 220 to 227 is remaining in the bank state information 104. If it is determined that no classification result is remaining (NO in step 908), the DRAM state classification unit 105 ends the processing. If it is determined that at least one classification result is still remaining (YES in step 908), then in step 909, the DRAM state classification unit 105 sets FIX_TIME forward by a period corresponding to the smallest value of the occurrence cycles of the banks 220 to 227. Next, in step 910, the DRAM state classification unit 105 reads out the classification result of a bank subsequent to the bank in which the smallest value of the occurrence cycles of the banks 220 to 227 is obtained, and thus updates the state of the subsequent bank. After that, the DRAM state classification unit 105 returns the processing to step 903, thus repeating the processing. Thus far is the content of the DRAM state classification unit 105 in the first exemplary embodiment. While, in the first exemplary embodiment, the classification of the DRAM state performed by the DRAM state classification unit 105 has been described using the above-described classification method, which is based on the premise that priority is higher in the order of an operating state, an inoperative state, and a pause state, the content of the classification does not limit the present exemplary embodiment. For example, the classification can also be applied on the premise that priority is higher in the order of an inoperative state, an operating state, and a pause state. In this case, in a case where at least one bank is in an inoperative state, the DRAM state classification unit 105 determines that the DRAM state is an inoperative state, and, in a case where no bank is in an inoperative state and at least one bank is in an operating state, the DRAM state classification unit 105 determines that the DRAM state is an operating state. In a case other than the above two cases, the DRAM state classification unit 105 determines that the DRAM state is a pause state. Besides, as long as the priority order or determination condition is able to be rationally explained, any content thereof can also be applied. Moreover, while, in the first exemplary embodiment, the bank state classification unit 103 and the DRAM state classification unit 105 have been described on the premise that they perform processing in this order, the processing order does not limit the present exemplary embodiment. For example, results of classification performed by the bank state classification unit 103 can be sequentially input to the DRAM state classification unit 105, so that two processing operations can be performed in parallel by them.

In the following description, processing which is performed by the DRAM state classification unit 105 is specifically described with the classification results in the banks 220 to 227 illustrated in FIG. 10 taken as an example. FIG. 10 also illustrates processing results 1041 to 1076 obtained by the DRAM state classification unit 105.

First, in step 901, the DRAM state classification unit 105 resets FIX_TIME to 0. Next, in step 902, the DRAM state classification unit 105 reads out the classification results of the respective banks 220 to 227, thus setting the bank states. The DRAM state classification unit 105 sets the bank 220 to a pause state for a period of one clock cycle. The DRAM state classification unit 105 sets the bank 221 to a pause state for a period of one clock cycle. The DRAM state classification unit 105 sets the banks 222 to 227 to a pause state for a period of 289 clock cycles, which corresponds to all of the processing cycles. At this point of time, since all of the banks are in a pause state, each of the results of determination in step 903 and step 905 is NO, so that, in step 907, the DRAM state classification unit 105 sets the DRAM state to a pause state. Referring to FIG. 10, a pause state 1041 for one cycle has been determined. After that, via step 908, then in step 909, the DRAM state classification unit 105 sets FIX_TIME to 1000. Next, in step 910, the DRAM state classification unit 105 sets each of the bank states of the banks 220 and 221 to an inoperative state, and then returns the processing to step 903.

In subsequent processing at timing of FIX_TIME=1000, since each of the banks 220 and 221 is in an inoperative state and each of the banks 222 to 227 is in a pause state, the results of determination in step 903 and step 905 are NO and YES, respectively. Then, in step 906, the DRAM state classification unit 105 sets the DRAM state to an inoperative state. Referring to FIG. 10, an inoperative state 1042 for four cycles has been determined. After that, via step 908, then in step 909, the DRAM state classification unit 105 sets FIX_TIME to 5000. Next, in step 910, the DRAM state classification unit 105 sets the bank state of the bank 221 to a pause state, and then returns the processing to step 903.

In subsequent processing at timing of FIX_TIME=5000, since the bank 220 is in an inoperative state and each of the banks 221 to 227 is in a pause state, the results of determination in step 903 and step 905 are NO and YES, respectively, and then in step 906, the DRAM state classification unit 105 sets the DRAM state to an inoperative state. Referring to FIG. 10, an inoperative state 1043 for 26 cycles has been determined. After that, via step 908, then in step 909, the DRAM state classification unit 105 sets FIX_TIME to 31000. Next, in step 910, the DRAM state classification unit 105 sets the bank state of the bank 220 to an operating state, and then returns the processing to step 903.

In subsequent processing at timing of FIX_TIME=31000, since the bank 220 is in an operating state and each of the banks 221 to 227 is in a pause state, the result of determination in step 903 is YES, and then in step 904, the DRAM state classification unit 105 sets the DRAM state to an operating state. Referring to FIG. 10, an operating state 1044 for four cycles has been determined. After that, via step 908, then in step 909, the DRAM state classification unit 105 sets FIX_TIME to 35000. Next, in step 910, the DRAM state classification unit 105 sets the bank state of the bank 220 to an operating state (no change in result), and then returns the processing to step 903.

From here, the detailed description of each step is omitted, and only the determination content in each step is described.

In subsequent processing at timing of FIX_TIME=35000, as with processing at timing of FIX_TIME=31000, in step 904, the DRAM state classification unit 105 sets the DRAM state to an operating state. Referring to FIG. 10, an operating state 1045 for four cycles has been determined.

In subsequent processing at timing of FIX_TIME=39000, since all of the banks are in a pause state, the DRAM state classification unit 105 sets the DRAM state to a pause state. Referring to FIG. 10, a pause state 1046 for one cycle has been determined.

In subsequent processing at timing of FIX_TIME=40000, since the bank 220 is in an operating state, the bank 221 is in an inoperative state, and each of the banks 222 to 227 is in a pause state, the DRAM state classification unit 105 sets the DRAM state to an operating state. Referring to FIG. 10, an operating state 1047 for four cycles has been determined.

In subsequent processing at timing of FIX_TIME=44000, since each of the banks 220 and 221 is in an inoperative state and each of the banks 222 to 227 is in a pause state, the DRAM state classification unit 105 sets the DRAM state to an inoperative state. Referring to FIG. 10, an inoperative state 1048 for 11 cycles has been determined.

In subsequent processing at timing of FIX_TIME=55000, 59000, and 63000, since the bank 220 is in an inoperative state, the bank 221 is in an operating state, and each of the banks 222 to 227 is in a pause state, the DRAM state classification unit 105 sets the DRAM state to an operating state. Referring to FIG. 10, operating states 1049, 1050, and 1051 each for four cycles have been determined.

In subsequent processing at timing of FIX_TIME=67000, since each of the banks 220 and 221 is in an inoperative state and each of the banks 222 to 227 is in a pause state, the DRAM state classification unit 105 sets the DRAM state to an inoperative state. Referring to FIG. 10, an inoperative state 1052 for six cycles has been determined.

In subsequent processing at timing of FIX_TIME=73000 and 77000, since the bank 220 is in an inoperative state, the bank 221 is in an operating state, and each of the banks 222 to 227 is in a pause state, the DRAM state classification unit 105 sets the DRAM state to an operating state. Referring to FIG. 10, operating states 1053 and 1054 each for four cycles have been determined.

In subsequent processing at timing of FIX_TIME=81000, since the bank 220 is in an inoperative state and each of the banks 221 to 227 is in a pause state, the DRAM state classification unit 105 sets the DRAM state to an inoperative state. Referring to FIG. 10, an inoperative state 1055 for eight cycles has been determined.

In subsequent processing at timing of FIX_TIME=89000 and 90000, since the bank 220 is in an inoperative state, the bank 221 is in an operating state, and each of the banks 222 to 227 is in a pause state, the DRAM state classification unit 105 sets the DRAM state to an operating state. Referring to FIG. 10, operating states 1056 and 1057 for one cycle and three cycles, respectively, have been determined.

In subsequent processing at timing of FIX_TIME=93000 to 125000 at intervals of 4000, since the bank 220 is in an inoperative state, the bank 221 is in an operating state, and each of the banks 222 to 227 is in a pause state, the DRAM state classification unit 105 sets the DRAM state to an operating state. Referring to FIG. 10, operating states 1058 to 1066 each for four cycles have been determined.

In subsequent processing at timing of FIX_TIME=129000, since the bank 220 is in an inoperative state, the bank 221 is in an operating state, and each of the banks 222 to 227 is in a pause state, the DRAM state classification unit 105 sets the DRAM state to an operating state. Referring to FIG. 10, an operating state 1067 for one cycle has been determined.

In subsequent processing at timing of FIX_TIME=130000, since the bank 220 is in a pause state, the bank 221 is in an operating state, and each of the banks 222 to 227 is in a pause state, the DRAM state classification unit 105 sets the DRAM state to an operating state. Referring to FIG. 10, an operating state 1068 for three cycles has been determined.

In subsequent processing at timing of FIX_TIME=133000, since all of the banks are in a pause state, the DRAM state classification unit 105 sets the DRAM state to a pause state. Referring to FIG. 10, a pause state 1069 for 67 cycles has been determined.

In subsequent processing at timing of FIX_TIME=200000 and 204000, since the bank 220 is in an operating state and each of the banks 221 to 227 is in a pause state, the DRAM state classification unit 105 sets the DRAM state to an operating state. Referring to FIG. 10, operating states 1070 and 1071 each for four cycles have been determined.

In subsequent processing at timing of FIX_TIME=208000, since the bank 220 is in an inoperative state and each of the banks 221 to 227 is in a pause state, the DRAM state classification unit 105 sets the DRAM state to an inoperative state. Referring to FIG. 10, an inoperative state 1072 for six cycles has been determined.

In subsequent processing at timing of FIX_TIME=214000, since the bank 220 is in an operating state and each of the banks 221 to 227 is in a pause state, the DRAM state classification unit 105 sets the DRAM state to an operating state. Referring to FIG. 10, an operating state 1073 for four cycles has been determined.

In subsequent processing at timing of FIX_TIME=218000, since the bank 220 is in an inoperative state and each of the banks 221 to 227 is in a pause state, the DRAM state classification unit 105 sets the DRAM state to an inoperative state. Referring to FIG. 10, an inoperative state 1074 for 11 cycles has been determined.

In subsequent processing at timing of FIX_TIME=229000, since the bank 220 is in an operating state and each of the banks 221 to 227 is in a pause state, the DRAM state classification unit 105 sets the DRAM state to an operating state. Referring to FIG. 10, an operating state 1075 for four cycles has been determined.

In subsequent processing at timing of FIX_TIME=233000, since the bank 220 is in an inoperative state and each of the banks 221 to 227 is in a pause state, the DRAM state classification unit 105 sets the DRAM state to an inoperative state. Referring to FIG. 10, an inoperative state 1076 for 56 cycles has been determined.

Thus far is the description of processing which is performed by the DRAM state classification unit 105 with the classification results of the banks 220 to 227 illustrated in FIG. 10 taken as an example.

Figure 17:
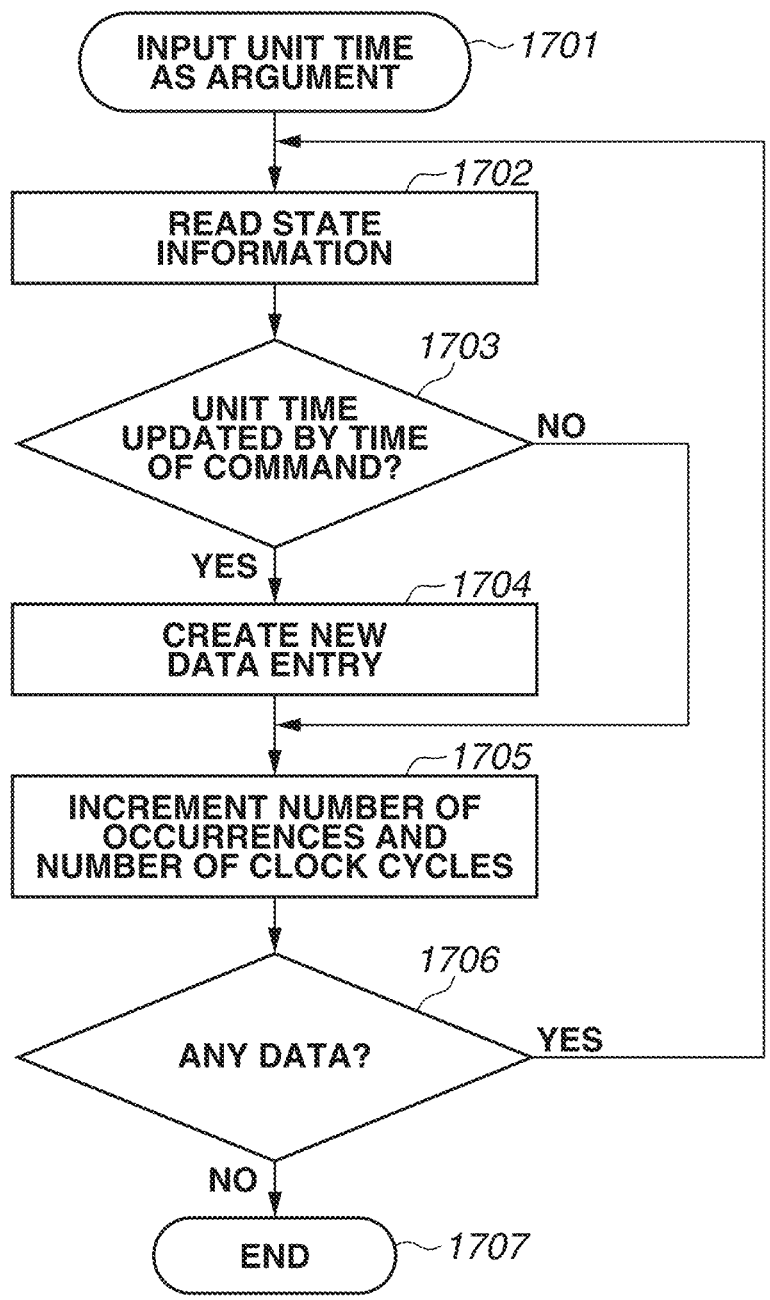
FIG. 17 is a flowchart illustrating processing which is performed by statistical processing in the first exemplary embodiment.

Next, the statistical processing 107 in the first exemplary embodiment is described. The statistical processing 107 receives the bank state information 104 and the DRAM state information 106 as inputs. However, processing operations for the bank state information 104 and the DRAM state information 106 are separately performed. FIG. 17 is a flowchart illustrating the flow of steps which are performed by the statistical processing 107, and this flowchart is applicable to each of the bank state information 104 and the DRAM state information 106. However, with regard to the bank state information, since the flowchart of FIG. 17 is performed separately for respective banks, it is premised that bank state information about at least one bank is input. Details of the statistical processing 107 are described with reference to FIG. 17.

First, in step 1701, the statistical processing 107 inputs a unit time as an argument. Next, in step 1702, the statistical processing 107 reads one piece of data from the bank state information 104 or the DRAM state information 106 serving as an input. Next, in step 1703, the statistical processing 107 checks the occurrence time of input data and determines whether the occurrence time has updated the unit time serving as an argument received in step 1701. For example, the unit time received in step 1701 is assumed to be 10,000,000 ps (=10 microseconds (μs)). On the other hand, it is assumed that, after reading data obtained at the occurrence time "9,999,000 ps in step 1702, the statistical processing 107 has read data obtained at the occurrence time "10,000,000 ps" in a next round. In this case, since the range of the unit time "10,000,000 ps" has been exceeded, the result of determination in step 1703 is YES. Similarly, in a case where the integral multiple of the unit time "10,000,000 ps" has been exceeded, such as a case where the time "20,000,000 ps" or "30,000,000 ps" has been exceeded, the result of determination in step 1703 is YES. Moreover, in a case where the first data is processed, such a case is also regarded as the unit time having been exceeded, and, therefore, the result of determination in step 1703 is YES. The occurrence time which is used for determination in step 1703 is associated with the state classified by the bank state classification unit 103 or the DRAM state classification unit 105. If the result of determination in step 1703 is YES, then in step 1704, the statistical processing 107 creates a data entry for statistical information serving as a new output. The data entry is a data entry for retaining the number of occurrences and the accumulation of occurrence cycles for each bank state and DRAM state at each unit time.

If the result of determination in step 1703 is NO or after step 1704 is performed, the statistical processing 107 advances the processing to step 1705. In step 1705, the statistical processing 107 adds one time to the number of occurrences and adds the associated number of occurrence cycles to the occurrence cycles with respect to the DRAM state and bank state included in the data read in step 1702. The occurrence cycle is associated with the state classified by the bank state classification unit 103 or the DRAM state classification unit 105, as with the occurrence time. Next, in step 1706, the statistical processing 107 determines whether data is remaining, and, if it is determined that data is remaining (YES in step 1706), the statistical processing 107 returns the processing to step 1702, thus repeating the processing. On the other hand, if it is determined that no data is remaining (NO in step 1706), then in step 1707, the statistical processing 107 ends the processing. Thus far is the content of the statistical processing 107.

Next, the display unit 108 in the first exemplary embodiment is described. The display unit 108 receives, as an input, the processing result obtained by the statistical processing 107, i.e., a data entry for unit time, performs processing via the above-mentioned computer apparatus, and outputs output results in various forms to the display 307. In the following description, all of the display examples illustrated in FIGS. 11 to 16 are able to be output in the same manner with respect to both the bank state and the DRAM state. In the case of simultaneous outputting, the display unit 108 provides up to a total of nine display outputs including the bank states of the banks 220 to 227 and the DRAM state of the DRAM 209.

A table illustrated in FIG. 11 represents one of display examples which are provided by the display unit 108. In the table illustrated in FIG. 11, the number of occurrences and the number of occurrence cycles in each of three states, i.e., an operating state, an inoperative state, and a pause state, are shown.

Figure 12:
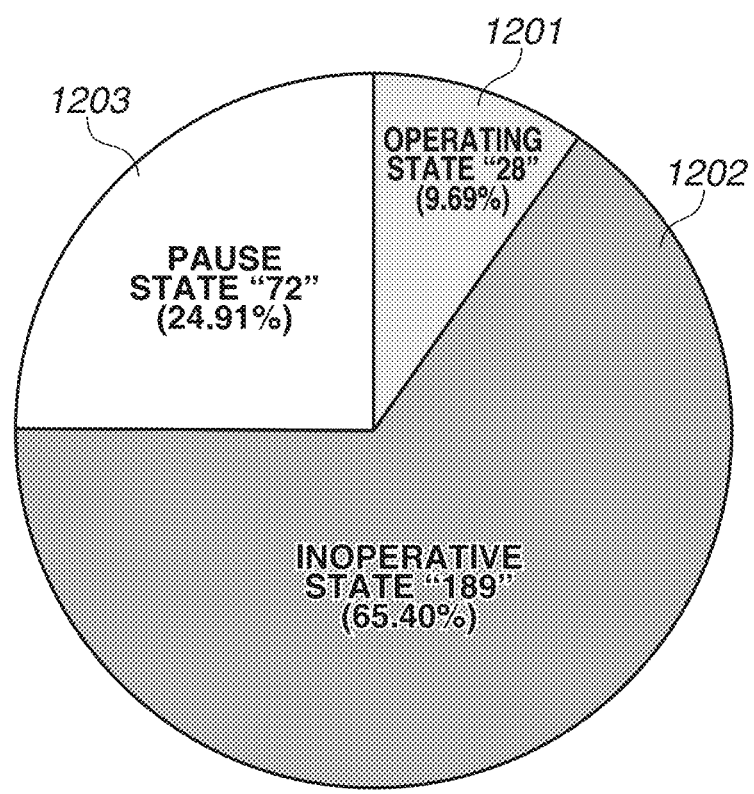
FIG. 12 is a diagram illustrating an example of display in a pie chart form which is provided by the display unit.

A pie chart illustrated in FIG. 12 represents one of display examples which are provided by the display unit 108. In FIG. 12, a slice 1201 indicates a proportion occupied by the number of occurrence cycles of the operating state in the total number of occurrence cycles. Similarly, a slice 1202 indicates a proportion occupied by the number of occurrence cycles of the inoperative state, and a slice 1203 indicates a proportion occupied by the number of occurrence cycles of the pause state.

Figure 13:
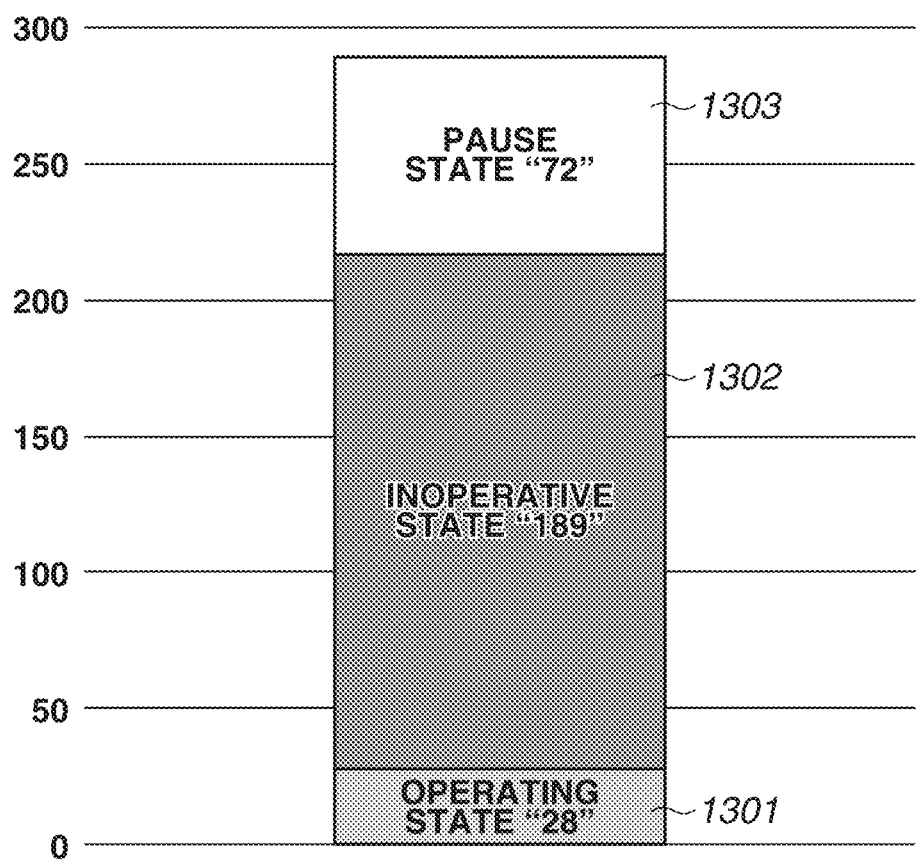
FIG. 13 is a diagram illustrating an example of display in a stacked bar graph form (number of cycles) which is provided by the display unit.

A stacked bar graph illustrated in FIG. 13 represents one of display examples which are provided by the display unit 108. In FIG. 13, a segment 1301 indicates the number of occurrence cycles of the operating state. Similarly, a segment 1302 indicates the number of occurrence cycles of the inoperative state, a segment 1303 indicates the number of occurrence cycles of the pause state, and the whole bar indicates the total number of occurrence cycles.

Figure 14:
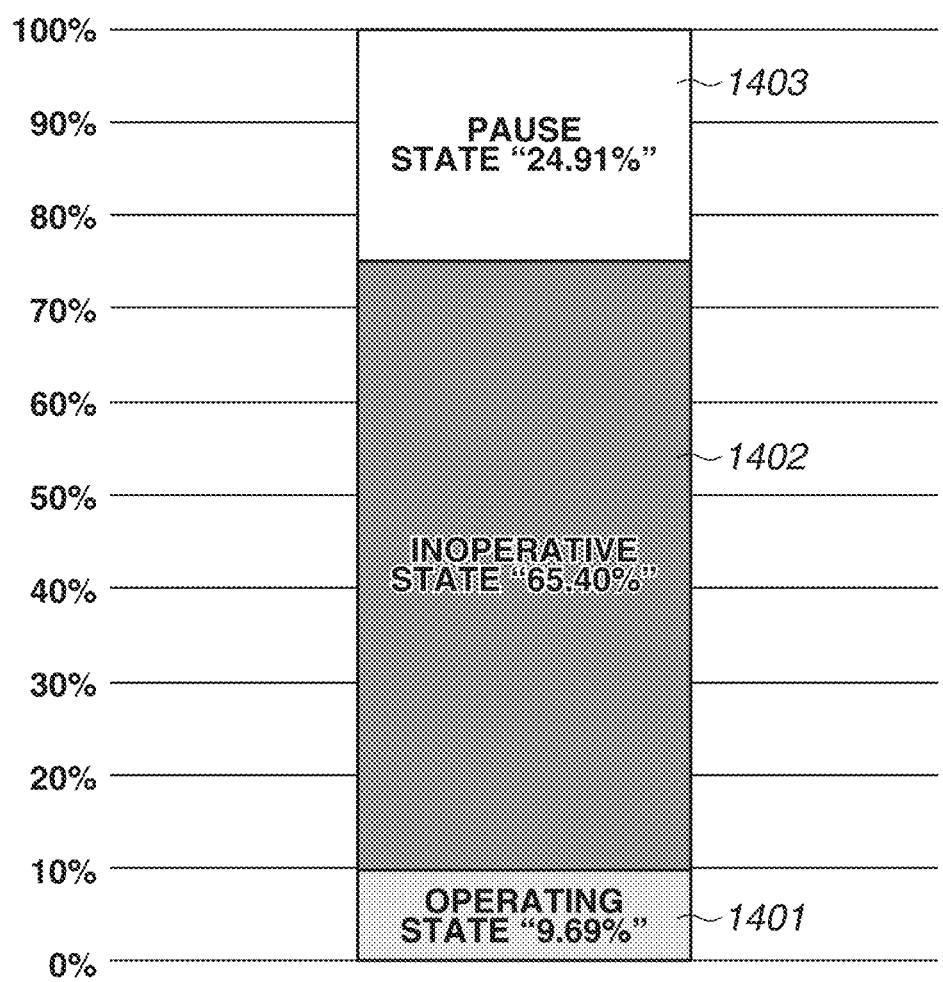
FIG. 14 is a diagram illustrating an example of display in a stacked bar graph form (percent) which is provided by the display unit.

A stacked bar graph illustrated in FIG. 14 represents one of display examples which are provided by the display unit 108. In FIG. 14, a segment 1401 indicates a proportion occupied by the number of occurrence cycles of the operating state in the total number of occurrence cycles. Similarly, a segment 1402 indicates a proportion occupied by the number of occurrence cycles of the inoperative state, and a segment 1403 indicates a proportion occupied by the number of occurrence cycles of the pause state. The difference from FIG. 13 is whether the whole bar indicates the total number of occurrence cycles or 100%.

Figure 15:
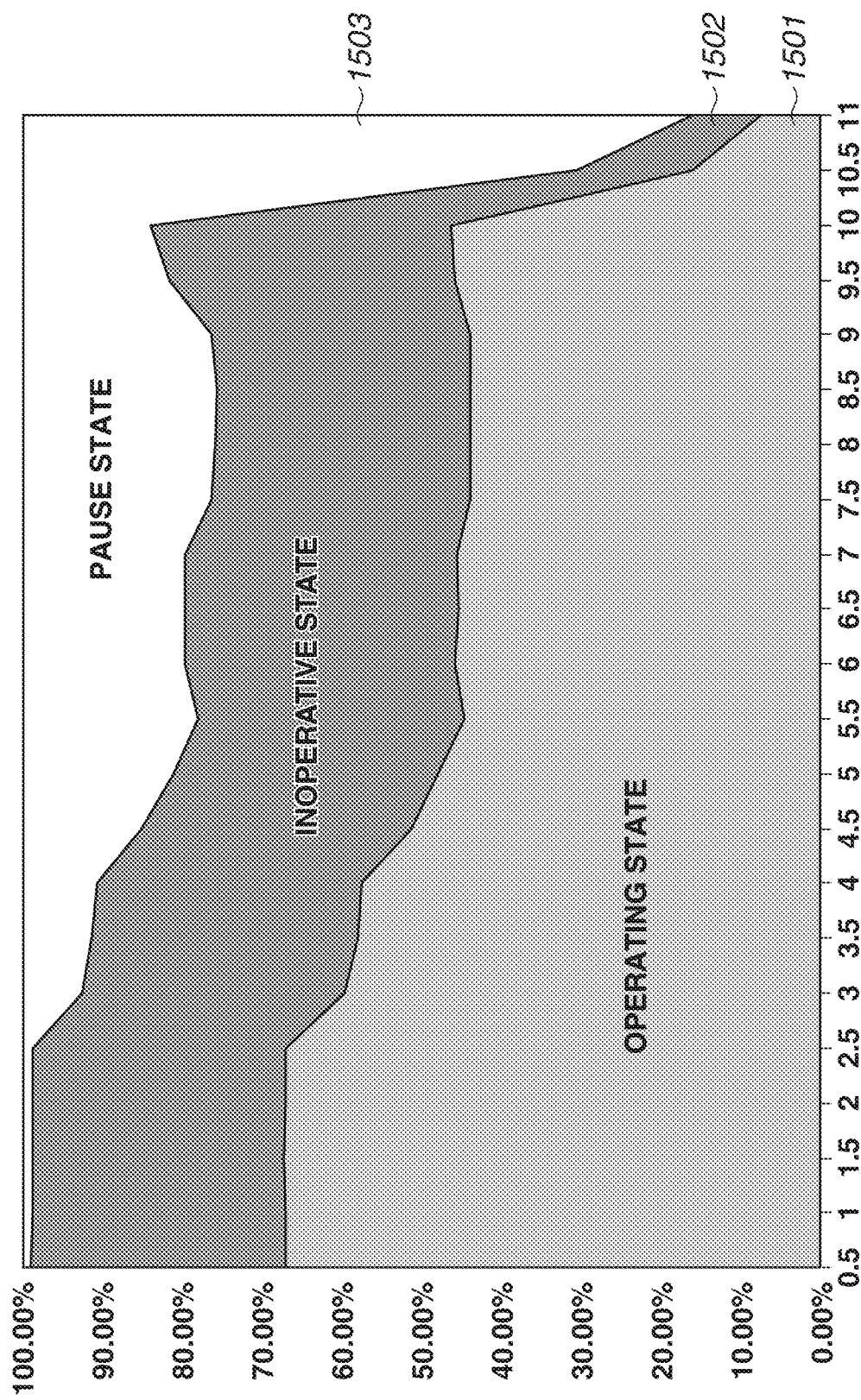
FIG. 15 is a diagram illustrating an example of display in a time-series line graph form which is provided by the display unit.

A line graph illustrated in FIG. 15 represents one of display examples which are provided by the display unit 108. In FIG. 15, a polygonal line 1501 indicates a proportion occupied by the number of occurrence cycles of the operating state in the total number of occurrence cycles for each unit time, and is thus a joined polygonal line indicating a change for each unit time. Similarly, a polygonal line 1502 indicates a proportion occupied by the number of occurrence cycles of the inoperative state, and a polygonal line 1503 indicates a proportion occupied by the number of occurrence cycles of the pause state. Showing the respective proportions side by side for each unit time allows readily analyzing such a change.

Figure 16:
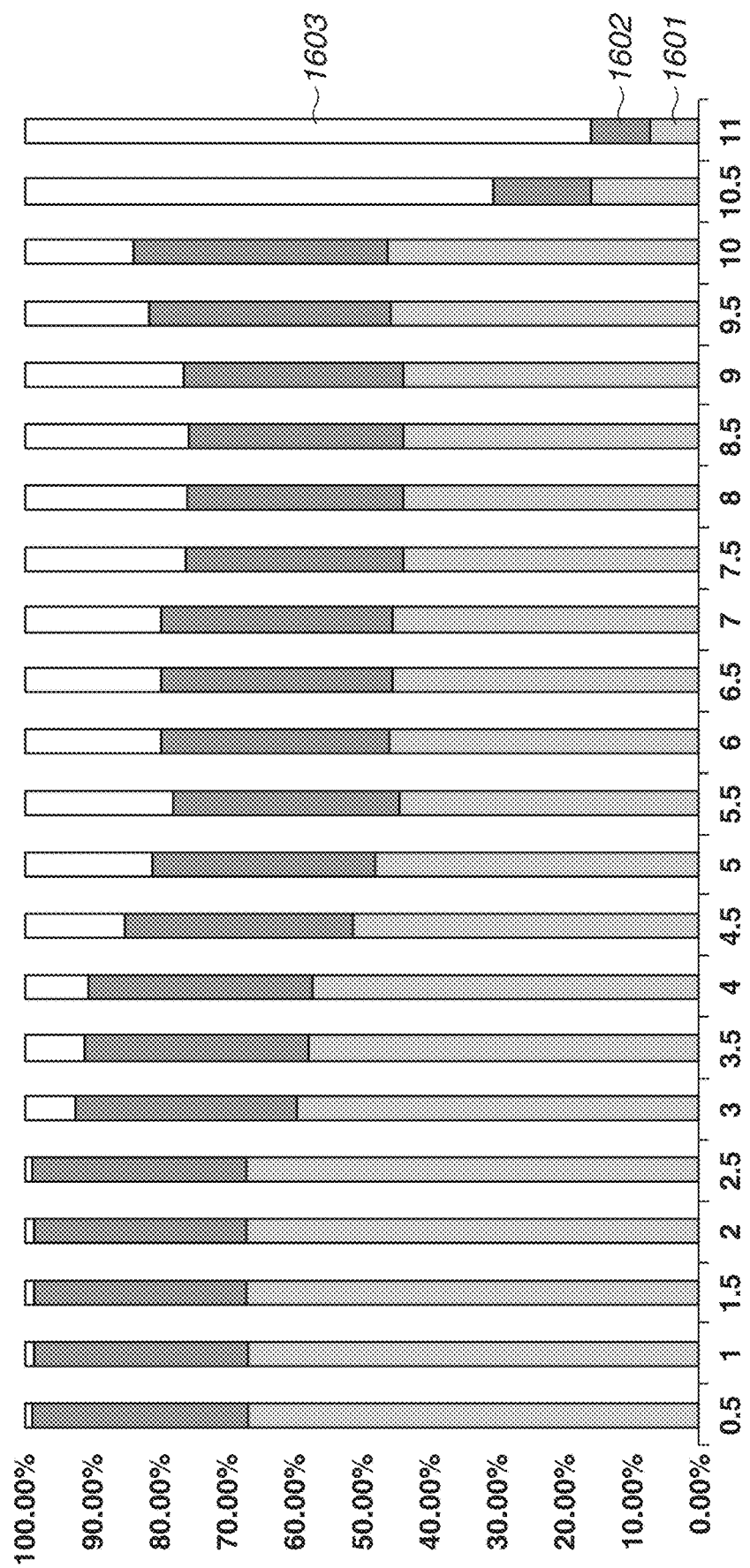
FIG. 16 is a diagram illustrating an example of display in a time-series stacked bar graph form which is provided by the display unit.

A stacked bar graph illustrated in FIG. 16 represents one of display examples which are provided by the display unit 108. In FIG. 16, segments 1601, 1602, and 1603 are the same as the segments 1401, 1402, and 1403 illustrated in FIG. 14. The difference is that FIG. 16 illustrates stacked bars arranged side by side for each unit time and accordingly allows analyzing a change for each unit time as with FIG. 15.

A second exemplary embodiment is described with reference to FIG. 1, FIG. 2, FIG. 3, FIG. 7, FIG. 8, FIG. 9, FIG. 18, and FIG. 19. The second exemplary embodiment is different from the first exemplary embodiment in the level of detail of types of bank state and DRAM state. More specifically, even in the second exemplary embodiment, there is no difference in using three states, i.e., an operating state, an inoperative state, and a pause state, used in the first exemplary embodiment. On the other hand, the second exemplary embodiment has a difference in classifying these three states into more detailed states corresponding to analysis purposes.

Furthermore, the configuration of a display apparatus (information processing apparatus) according to the second exemplary embodiment is the same as that of the first exemplary embodiment illustrated in FIG. 1, and, therefore, the detailed description of the configuration thereof is omitted here. Additionally, the configuration of a test bench targeted for simulation and the configuration of a computer apparatus, which performs performance analysis processing and analysis result display processing including simulation processing, in the second exemplary embodiment are also the same as those illustrated in FIG. 2 and FIG. 3, and, therefore, the detailed description thereof is omitted here.

From here, a detailed classification of the bank state which is classified by the bank state classification unit 103 in the second exemplary embodiment is described with reference to FIG. 18. In FIG. 18, a read operating state 1801 means a period occupied by a data signal obtained after reception of RD command in the operating state, for example, four clock cycles on the premise of 8-beat access. On the other hand, a write operating state 1802 means a period occupied by a data signal obtained after reception of WR command in the operating state, for example, four clock cycles on the premise of 8-beat access. These two states correspond to the detailed classification of the operating state.

In the case of applying the detailed classification of the operating state to the bank state, the bank state is classified by the bank state classification unit 103 as with the operating state. Specifically, simultaneously with classifying the bank state as an operating state in step 709 illustrated in FIG. 7, the bank state classification unit 103 checks a just previous command with respect to a target bank, i.e., SAME_PRE_CMD. If the just previous command is RD command, the bank state classification unit 103 sets a read operating state as the detailed classification, and, if the just previous command is WR command, the bank state classification unit 103 sets a write operating state as the detailed classification.

Additionally, adding the processing in step 709 illustrated in FIG. 7 to step 710 allows performing detailed classification with respect to the operating state.

Next, a detailed classification of the inoperative state is described. In FIG. 18, an activate inoperative state 1803 means a period subjected to constraints imposed by ACT command to RD or WR command in the inoperative state. A precharge inoperative state 1804 means a period subjected to constraints imposed by PRE command to ACT command in the inoperative state. A Write-to-Precharge inoperative state 1805 means a period subjected to constraints imposed by WR command to PRE command in the inoperative state. A Read-to-Precharge inoperative state 1806 means a period subjected to constraints imposed by RD command to PRE command in the inoperative state. A refresh inoperative state 1807 means a period from REF command in which another command is not able to be issued in the inoperative state. A Read-to-Write switching inoperative state 1808 means a period subjected to constraints imposed by RD command to WR command in the inoperative state. A Write-to-Read switching inoperative state 1809 means a period subjected to constraints imposed by WR command to RD command in the inoperative state. The states 1803 to 1806 are directed to only commands to be issued to the same bank. On the other hand, the Read-to-Write switching inoperative state 1808 and the Write-to-Read switching inoperative state 1809 are directed to a preceding command and a subsequent command to be issued irrespective of the same bank or different banks.

The above-mentioned detailed classification about seven inoperative states is performed by the bank state classification unit 103 as with the inoperative state. First, simultaneously with classifying the bank state as an inoperative state in step 712 illustrated in FIG. 7, the bank state classification unit 103 performs detailed classification as the refresh inoperative state 1807. With respect to four states 1803 to 1806, the bank state classification unit 103 performs detailed classification in step 715 illustrated in FIG. 7. In step 715, simultaneously with classifying the bank state as an inoperative state, the bank state classification unit 103 determines which type of inoperative state the detailed classification is. For example, in a case where a just previous command with respect to a target bank is ACT command and the command 602 of the current event information entry is RD command, the bank state classification unit 103 determines that the detailed classification is the activate inoperative state 1803. Moreover, for another example, in a case where a just previous command with respect to a target bank is RD command and the command 602 of the current event information entry is PRE command, the bank state classification unit 103 determines that the detailed classification is the Read-to-Precharge inoperative state 1806. With regard to the Read-to-Write switching inoperative state 1808 and the Write-to-Read switching inoperative state 1809, there are two cases in which the bank state classification unit 103 performs detailed classification at respective portions. In the first case, the bank state classification unit 103 performs detailed classification in step 715 as with the states 1803 to 1806. In this case, the bank state classification unit 103 determines the detailed classification in the same method as that described above. In the second case, the bank state classification unit 103 performs detailed classification in step 721. Even in this case, there is no difference from the determination method performed in step 715 except that the preceding command is a just previous command with respect to other than the target bank. The above-described method allows performing detailed classification about the inoperative state. Furthermore, in a case where a previous command is ACT command, a subsequent command is ACT command to be issued to another bank, and a period between the commands is four cycles, the bank state classification unit 103 classifies the bank state as an inoperative state based on the table illustrated in FIG. 8. However, this inoperative state has no corresponding detailed classification. In the second exemplary embodiment, in such a case, the detailed classification is set as not applicable. In this way, the detailed classification can be performed while narrowing down to items intended to be analyzed in more detail.

Next, the DRAM state classification unit 105 in the second exemplary embodiment is described. There are two types of detailed classification of the DRAM state which is classified by the DRAM state classification unit 105. In the first type of detailed classification, the same detailed classification as that of the bank state described above, i.e., the classification illustrated in FIG. 18, is used. In the second type of detailed classification, a detailed classification different from that of the bank state, i.e., a detailed classification unique to the DRAM state, is used. First, a case where the first type of detailed classification, which is the same as that of the bank state, is used is described. In this case, it is necessary to determine priority order between detailed classification states as with the priority order and determination conditions of the operating state, inoperative state, and pause state. In the second exemplary embodiment, the DRAM state classification unit 105 determines an operating state, inoperative state, or pause state with use of the same determination conditions as those in the first exemplary embodiment, and then determines a detailed classification state based on the priority order between detailed classification states in each of the operating state, inoperative state, and pause state. Specifically, with regard to the operating state, since read and write do not occur simultaneously, no priority order is set. With regard to the inoperative state, the priority order is higher in the following sequence.

Refresh inoperative state 1807
Read-to-Write switching inoperative state 1808 and Write-to-Read switching inoperative state 1809 (because of not occurring simultaneously)
Activate inoperative state 1803
Precharge inoperative state 1804
Write-to-Precharge inoperative state 1805
Read-to-Precharge inoperative state 1806
(Not applicable)

The detailed classification which is performed by the DRAM state classification unit 105 based on the above priority order is described. First, the detailed classification of the operating state is described. In step 904 illustrated in FIG. 9, simultaneously with setting the DRAM state as an operating state, the DRAM state classification unit 105 sets the detailed classification of the bank directly as the detailed classification of the DRAM state. For example, in a case where the detailed classification of the bank 220 is a read operating state, the DRAM state classification unit 105 determines that the detailed classification of the DRAM state of the DRAM 209 is also a read operating state. Due to a signal line for data transfer being shared, two or more banks do not simultaneously enter an operating state, and, therefore, the read operating state and the write operating state do not simultaneously occur. Next, the detailed classification of the inoperative state is described. In step 906 illustrated in FIG. 9, simultaneously with setting the DRAM state as an inoperative state, the DRAM state classification unit 105 determines the detailed classification of a bank which is in an inoperative state based on the above-mentioned priority order and thus determines the detailed classification of the DRAM state. For example, suppose a case where the detailed classification of the bank 220 is a Read-to-Write switching inoperative state and the detailed classification of the bank 221 is an activate inoperative state. In this case, the DRAM state classification unit 105 determines that the detailed classification of the DRAM 209 is a Read-to-Write switching inoperative state. At this time, the pause state is not set as a comparison target. The above-described method allows the DRAM state classification unit 105 to perform detailed classification.

Next, the second type of detailed classification which is performed by the DRAM state classification unit 105 is described. The second type of detailed classification is a detailed classification different from that of the bank state. In the second exemplary embodiment, the second type of detailed classification is applied to only an operating state. Specifically, such an operating state includes two states, i.e., an operating state (1) in which an inoperative state is present in another bank and an operating state (2) in which all of the other banks are in a pause state. The operating state (1) is an operating state obtained in a case where, while an inoperative state is present in another bank, the DRAM state has been determined as an operating state because the operating state of a bank is prioritized. On the other hand, the operating state (2) is an operating state obtained in a case where the DRAM state has been determined as an operating state because an inoperative state is not present in any other bank and all of the banks are in a pause state. In data access to DRAM, an inoperative state is hidden by data access to another bank, i.e., an operating state, so that access efficiency is apparently increased. Thus, in performance analysis, the detailed classification of the operating state (1) and the detailed classification of the operating state (2) greatly differ from each other in meaning. For example, in a case where there is almost no state in the detailed classification of the operating state (1) and there are many states 1803 and 1804 in the detailed classification, the occurrence of a state in which access efficiency is low can be analyzed. On the other hand, in a case where, while there are many states in the detailed classification of the operating state (1), there are almost no states 1803 and 1804 in the detailed classification, since an inoperative state has been able to be hidden, the occurrence of a state in which access is able to be performed without reducing access efficiency can be analyzed.

The method of determining the detailed classification of each of the operating states (1) and (2) is described. As with the first type of detailed classification, in step 904 illustrated in FIG. 9, simultaneously with setting the DRAM state to an operating state, the DRAM state classification unit 105 checks the states of other banks, and determines the DRAM state as the operating state (1) in a case where an inoperative state is present in at least one other bank and determines the DRAM state as the operating state (2) in a case where all of the other banks are in a pause state. This allows also determining the second type of detailed classification.

From here, display examples which are provided by the display unit 108 when the above-described detailed classification is applied is described with reference to FIG. 19.

Figure 19:
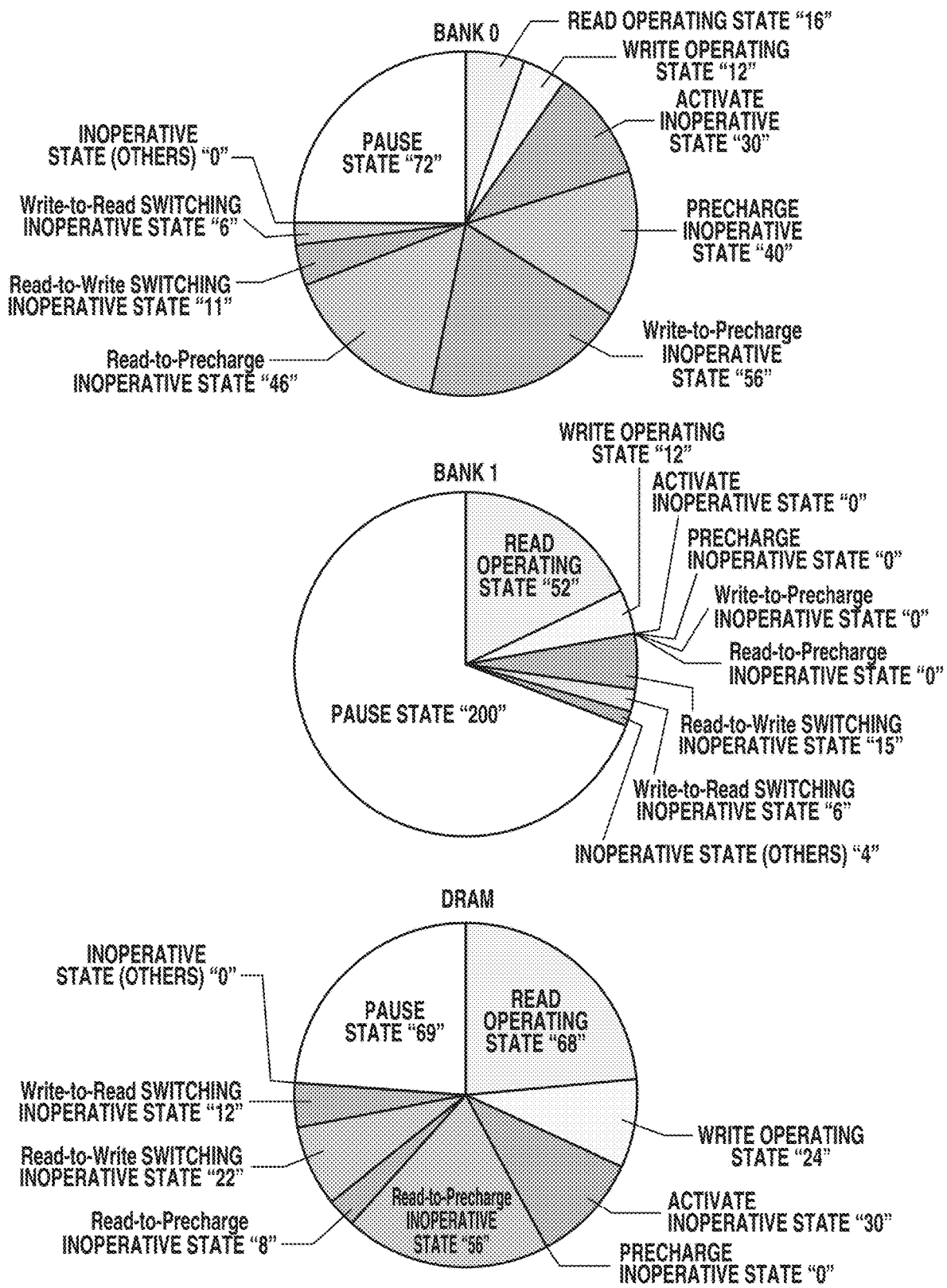
FIG. 19 is a diagram illustrating an example of display in a pie chart form which is performed by the display unit in the second exemplary embodiment.

Pie charts illustrated in FIG. 19 represent some display examples which are provided by the display unit 108. Each display example indicates states in the detailed classification in addition to the states indicated by a pie chart illustrated in FIG. 12. Since states in the detailed classification and states in the three-state classification necessarily coincide with each other in total number, arranging these states side by side and comparing each state allows performing performance analysis more efficiently.

The above-described method allows performing classification of the bank state and classification of the DRAM state with use of the finer detailed classification with respect to the first exemplary embodiment, and allows the display unit 108 to display the classification result.

A third exemplary embodiment is described with reference to FIG. 1 to FIG. 3, FIG. 6, FIG. 7, FIG. 9, FIG. 20 to FIG. 28, and FIG. 30 to FIG. 32. Even in the third exemplary embodiment, there is no difference in using three states, i.e., an operating state, an inoperative state, and a pause state, used in the first exemplary embodiment. The third exemplary embodiment has a difference in associating master information with an operating state used in the first exemplary embodiment and a partial inoperative state.

Figure 20:
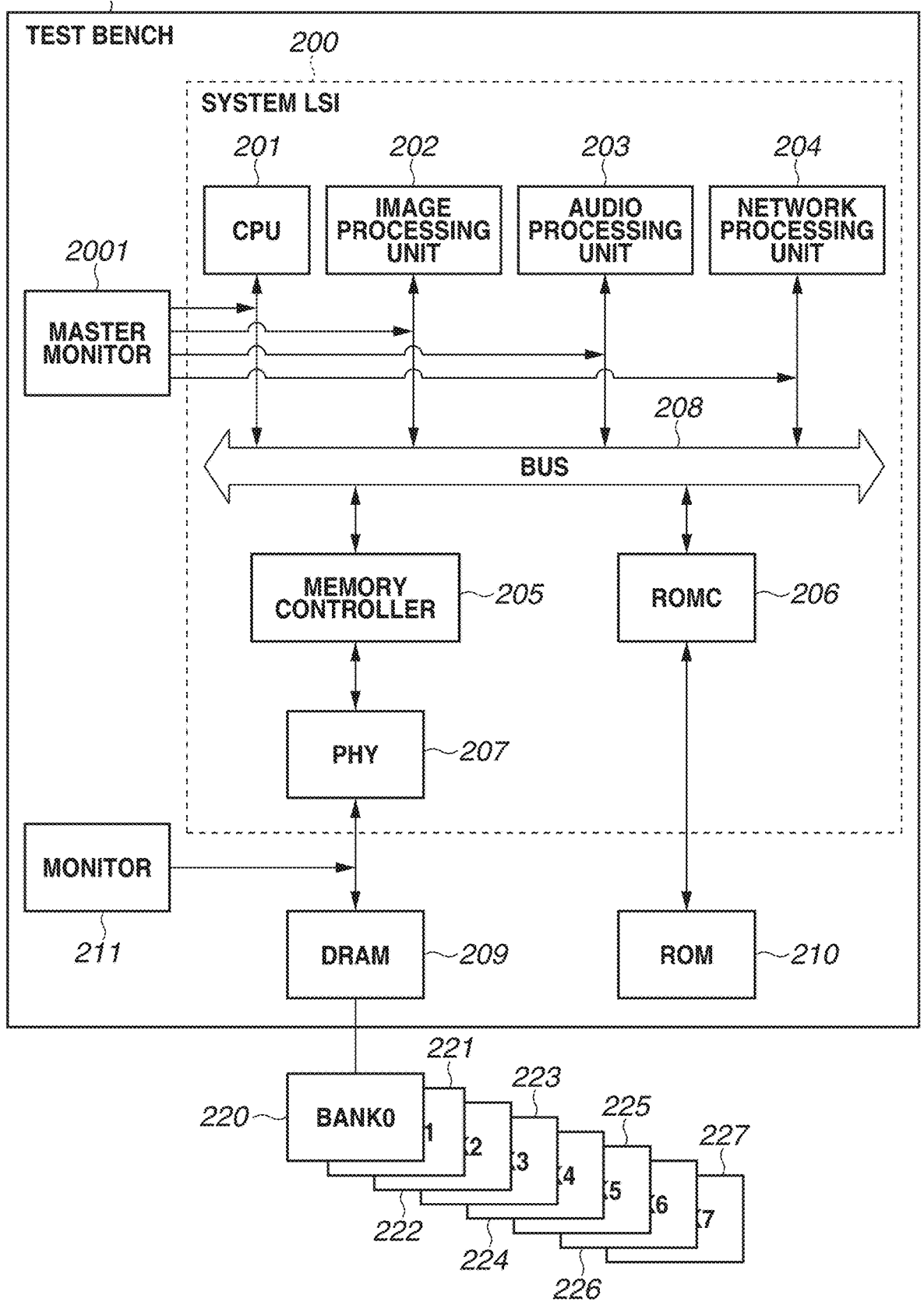
FIG. 20 is a configuration diagram of a test bench targeted for simulation in a third exemplary embodiment.

Prior to description of master information in the third exemplary embodiment, a mechanism of data access inside a system LSI targeted for analysis in the third exemplary embodiment is described. Generally, with regard to a bus mounted inside a system LSI, a block which requests data access via the bus is referred to as a "master" (and an "initiator"), and a block which receives a request for data access is referred to as a "slave" (and a "terminator"). FIG. 20 is a configuration diagram of a test bench including a system LSI targeted for simulation and peripheral modules in the third exemplary embodiment. In the third exemplary embodiment, each of the CPU 201, the image processing unit 202, the audio processing unit 203, and the network processing unit 204 illustrated in FIG. 20 serves as a master. On the other hand, each of the ROMC 206 and the memory controller 205 serves as a slave. Each master issues a data access request to each slave via the bus 208. FIG. 20 has a difference in that a master monitor 2001 is added to the test bench configuration diagram of FIG. 2 in the first exemplary embodiment. The master monitor 2001 is described below.

In a case where each of the CPU 201, the image processing unit 202, the audio processing unit 203, and the network processing unit 204 serving as a master issues a data access request, it is not necessary to become conscious of to which slave the data access request is directed. Allocation of a data access request is implemented by the bus 208 based on information for identifying an address of a region subjected to access, which is called a bus address. The bus address is generally composed of data with 32 bits or with a number of bits greater than or equal to 32 bits. In the third exemplary embodiment, the bus address is assumed to be composed of data with 32 bits. Hereinafter, the bus address is expressed by a hexadecimal number with a prefix "0x" appended thereto.

Each master issues a data access request with a bus address appended thereto. The bus 208 analyzes the bus address appended to the data access request, and determines a slave serving as an access destination based on the result of analysis. In the third exemplary embodiment, the slave is either the ROMC 206 or the memory controller 205. Generally, the bus 208 determines a slave serving as an access destination based on the value of a portion of data about the bus address. In the third exemplary embodiment, the bus 208 is assumed to determine a slave with use of bit 30 of the bus address. In a case where bit 30 of the bus address is 0, a data access request is assumed to be directed to the memory controller 205, and, in a case where bit 30 of the bus address is 1, a data access request is assumed to be directed to the ROMC 206. The bus 208 allocates a data access request based on the value of bit 30 of the bus address.

Furthermore, each slave, which has received the data access request from the bus 208, similarly analyzes the bus address and identifies the address of an access destination. In the ROMC 206, the address of an access destination is an address inside the ROM 210, and, in the memory controller 205, the address of an access destination is an address inside the DRAM 209. A mechanism of identifying an address inside the DRAM 209 in the memory controller 205 is described in more detail. DRAM is composed of a plurality of banks, and an address which is accessed is specified by designating a column address and a row address in each bank. In other words, converting the bus address into a bank number, a row address, and a column address allows identifying an address inside DRAM. In the third exemplary embodiment, on the premise that the data unit size inside the DRAM 209 is 1 byte (=8 bits), 32 bits of the bus address are allocated as follows.

Bus address bit 27 to bit 29=Bank number
Bus address bit 11 to bit 26=Row address
Bus address bit 0 to bit 10=Column address For example, suppose that the memory controller 205 has received a data access request with a bus address=0x3FED_CBA8 appended thereto. In this case, since all of bit 27 to bit 29 are 1, the bank number is designated as 7. Bit 11 to bit 26 are 1111110110111001 in binary number in order from high-order bit, and are 0xFDB9 in hexadecimal number. Bit 0 to bit 10 are 01110101000 in binary number in order from high-order bit, and are 0x3A8 in hexadecimal number. Therefore, access is performed to the DRAM 209 with use of the bank number=7, the row address=0xFDB9, and the column address=0x3A9. The above-described method using a data access request with a bus address appended thereto is used to implement data access from each master to each slave via the bus 208.

Additionally, a bus is able to include a buffer which accumulates data access requests from masters, and may have the function of allowing a data access request having high priority to overtake a data access request having low priority. Moreover, a memory controller is also able to include a buffer which accumulates data access requests therein, and may have the function of permuting the data access requests to perform efficient DRAM access. The efficient DRAM access refers to, for example, a command group which prevents or reduces the occurrence of a page miss. While, in a case where RD or WR command serially continues in the same page, no page miss occurs, when RD or WR command is issued on the way in different pages, a page miss occurs two times, i.e., before and after the command, so that access efficiency is decreased. The command group which prevents or reduces the occurrence of a page miss refers to RD or WR command which continues in the same page, and, as the number of times of issuance of the command is larger, more efficient DRAM access is attained. Moreover, preventing or reducing the occurrence of Read-to-Write switching or Write-to-Read switching described in the second exemplary embodiment is also a method of attaining efficient DRAM access. For example, in a case where there are five times of RD command and five times of WR command, if RD command and WR command are alternately issued, switching occurs 10 times. On the other hand, if five times of RD command and five times of WR command are sequentially issued, switching occurs once. While, in the above description, an example in which a general bus and memory controller perform permutation of data has been described, in the third exemplary embodiment, for simplicity of explanation, permutation of data access requests in the bus 208 and the memory controller 205 is assumed not to occur.

From here, operations of control signals between each master and the bus 208 which the master monitor 2001 illustrated in FIG. 20 monitors are described. In the third exemplary embodiment, the bus 208 is assumed to conform to the protocol of the AMBA 4 specification (AMBA being a registered trademark of ARM Ltd.). In the AMBA 4 specification, the bus architecture is composed of the following four channels, and each channel operates independently.

Address channel
Write data channel
Write response channel
Read data channel

FIG. 22 illustrates some control signals in the address channel conforming to the AMBA 4 specification. While, in the address channel, there are other control signals, such control signals are not necessary for the present exemplary embodiment and are, therefore, omitted from description. In FIG. 22, a clock signal 2201 serves as a basis for all of the signals. Thus, at the timing of rising (a change from 0 to 1) of the clock signal 2201, the master monitor 2001 evaluates states of signals other than the clock signal 2201 and detects whether a data access request is being issued. Specifically, a case where each of a signal arready 2203 and a signal arvalid 2204 is 1 at rising of the clock signal 2201 means that a data access request for read has been issued. On the other hand, a case where each of a signal awready 2209 and a signal awvalid 2210 is 1 at rising of the clock signal 2201 means that a data access request for write has been issued. Signals other than the above signals, i.e., signals 2202, 2205, 2206, and 2207 and signals 2208, 2211, 2212, and 2213 mean pieces of attribute information appended to the data access requests for read and write, respectively. The signal araddr 2202 is a 32-bit signal and indicates a bus address in a data access request for read. The signal arburst 2205 indicates the access type of a data access request for read. The signal arlen 2206 indicates the number of continuous accesses (=beat size) of a data access request for read but is a value smaller by 1 than the actual number of accesses. Thus, the signal arlen 2206 being 0 means that access is performed once, and the signal arlen 2206 being 1 means that access is performed twice. The signal arsize 2207 indicates the unit access size of a data access request for read and is a value of a multiplier of 2, so that, when the actual unit access size is a value of n, the unit access size is 2 to the power of n. Thus, the signal arsize 2207 being 0 means 1-byte unit, the signal arsize 2207 being 1 means 2-byte unit, the signal arsize 2207 being 2 means 4-byte unit, and the signal arsize 2207 being 3 means 8-byte unit. The access type includes three types, i.e., INCR, WRAP, and FIXED. The access type INCR is used to perform continuous access while sequentially incrementing the bus address by the access size indicated by the signal arsize 2207 for the number of accesses indicated by the signal arlen 2206 from the bus address indicated by the signal araddr 2202. The access type WRAP is used to access a divided region in which the bus address indicated by the signal araddr 2202 is included and which is obtained by dividing an access space by the access size unit defined by the signal arsize 2207 and the signal arlen 2206. However, while the access type INCR is used to perform access starting with the top of a region to be accessed, the access type WRAP is used to perform access starting with the middle of a region to be accessed, i.e., the bus address indicated by the signal araddr 2202. Then, when reaching the end of the region to be accessed, the access type WRAP is used to perform access after returning to the top thereof. On the other hand, the access type FIXED is used to access the bus address indicated by the signal arlen 2206 for the access size and the number of accesses defined by the signal arsize 2207 and the signal arlen 2206. Thus, while the access types INCR and WRAP are used to perform access while incrementing (in WRAP, decrementing only in the case of returning) the bus address for the number of accesses indicated by the signal arlen 2206, the access type FIXED is used to access the same address without changing the bus address. For example, suppose that araddr 2202=0x0801_0000, arburst 2205=INCR, arlen 2206=7, and arsize 2207=3 are set. In this case, read access is performed with the unit access size set to 8 bytes, continuously 8 times, from 0x0801_0000. Thus, access is performed to a region for 64 bytes from 0x0801_0000 to 0x0801_003F. Thus far is the description of the access content at the time of a data access request for read. At the time of a data access request for write, the signal awaddr 2208 is used for the bus address, the signal awburst 2211 is used for the access type, the signal awlen 2212 is used for the number of continuous accesses, and the signal awsize 2213 is used for the unit access size. These signals are used to perform access in a manner similar to that at the time of a data access request for read. As described above, in the protocol of the AMBA 4 specification, a region to be accessed can be identified by referring to the signals 2202, 2205, 2206, and 2207 and the signals 2208, 2211, 2212, and 2213. As a result, analyzing attribute information appended to a data access request allows identifying an access region inside a slave serving as an access destination. For example, suppose that, similarly to the above-mentioned example, araddr 2202=0x0801_0000, arburst 2205=INCR, arlen 2206=7, and arsize 2207=3 are set. In this case, as explained above, access is performed to a region for 64 bytes from 0x0801_0000 to 0x0801_003F. Since bit 30 of the bus address is 0, this means that access is performed to the DRAM 209 via the memory controller 205. With regard to an address in the DRAM 209, since the bank number=1, the row address=0x0040, and the column address=0x000 to x03F are determined as mentioned above, access is performed to these regions. While, as mentioned above, with regard to a data access request, analyzing attribute information appended thereto allows identifying an access region, in the third exemplary embodiment, for simplicity of explanation, the access type=INCR and the access size=8 bytes fixed are assumed to be set. However, this limitation is for the purpose of simplicity of explanation and is not intended to limit the applicable scope of the present disclosure. Thus, however complicated an access request between each master and the bus 208 is, as long as an access region in a slave serving as an access destination is able to be identified based on attribute information, the present disclosure is applicable. For example, an exemplary embodiment in which an access request is issued not with a complete access request issued once but with a plurality of divided access requests issued can be readily conceivable. Even in this case, access requests can be preserved in a history and an access region can be identified at timing when the access request is finally fixed. In such an exemplary embodiment for a plurality of divided access requests, naturally, access for setting the address allocation method for the memory controller 205, such as register access, is included. Additionally, if an access region is not able to be identified based on attribute information, that is similarly applicable to the bus 208 or the memory controller 205, and, therefore, the applicable access request itself does not come into effect. Furthermore, the master monitor 2001 monitors control signals between each master and the bus 208 according to the above-mentioned protocol of the AMBA 4 specification and thus detects, as a master event, a data access request and attribute information appended thereto. Additionally, the master monitor 2001 associates the master information, introduced at the beginning of the third exemplary embodiment, with the detected data access request. The master information is information uniquely set for each master and is used to indicate from which master the associated data access request has been issued. The master information in the third exemplary embodiment is assumed to be numbers of 0 to 3, which are respectively allocated to the CPU 201, the image processing unit 202, the audio processing unit 203, and the network processing unit 204 in sequence. For example, upon detecting that a data access request has been issued from the CPU 201, the master monitor 2001 associates the master information=0 with the detected data access request with attribute information appended thereto and outputs the associated pieces of information.

Figure 21:
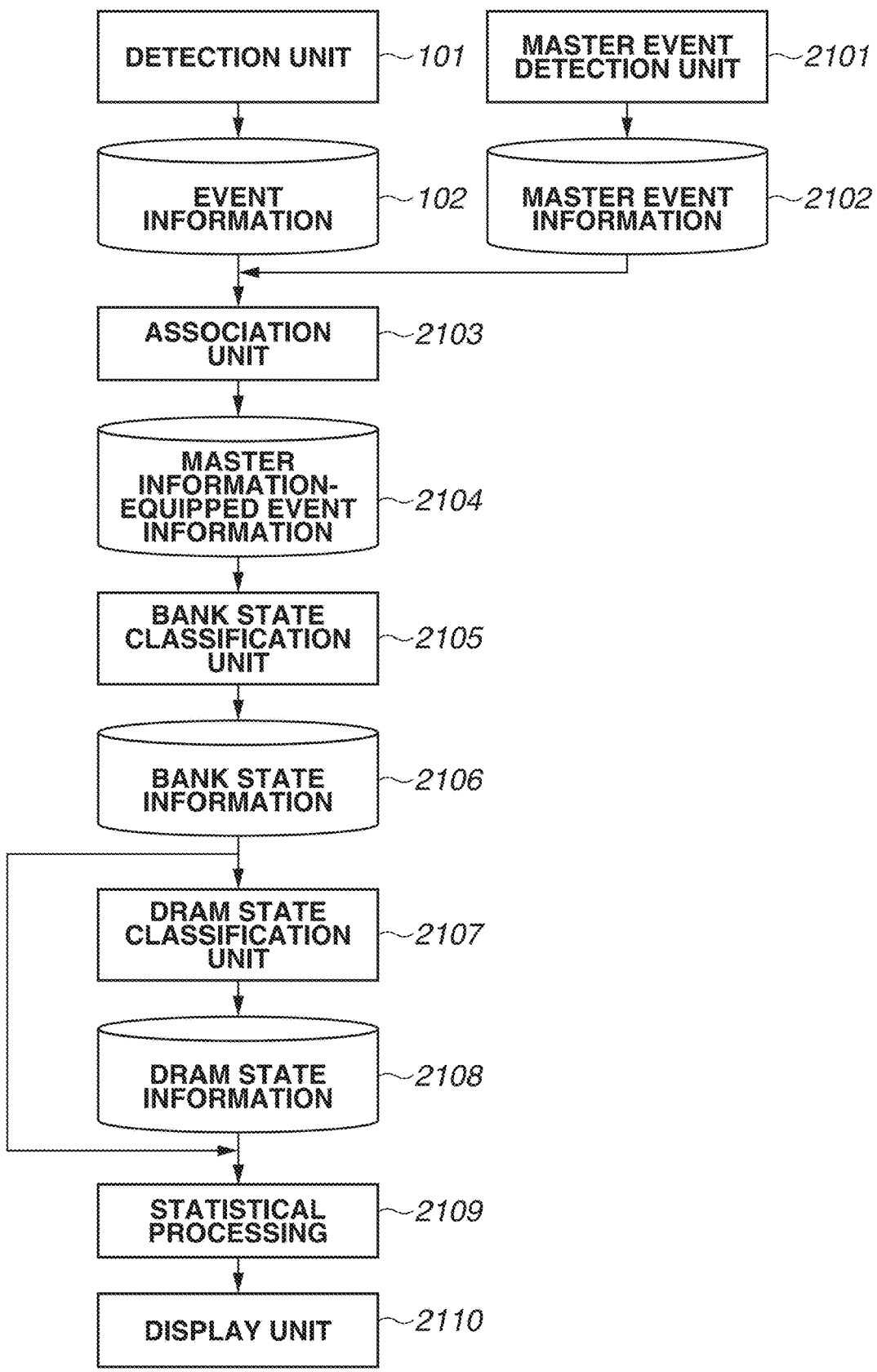
FIG. 21 is a processing concept diagram illustrating the whole of performance analysis processing and analysis result display processing according to the third exemplary embodiment.

From here, performance analysis processing and analysis result display processing in the third exemplary embodiment are described. Performance analysis processing and analysis result display processing are performed by the computer apparatus illustrated in FIG. 3. FIG. 21 is a processing concept diagram illustrating the whole of performance analysis processing and analysis result display processing. In FIG. 21, the detection unit 101 and the event information 102 are similar to those in the first exemplary embodiment and are, therefore, omitted from description here. A master event detection unit 2101 detects, via the master monitor 2001, a master event issued from a master and thus outputs master event information 2102. The master event refers to the issuance of a data access request from a master included in the system LSI 200. A specific method of outputting the master event information 2102 from the master event detection unit 2101 is described below. The event information 102 detected by the detection unit 101 and the master event information 2102 detected by the master event detection unit 2101 are input to an association unit 2103 located at a next stage. The event is a command used to control the DRAM 209, as mentioned in the first exemplary embodiment. The association unit 2103 associates a DRAM control command serving as an event with information indicating from which master a data access request has been issued, and outputs master information-equipped event information 2104 obtained by appending mater information to the event information 102. Details of the association unit 2103 are also described below. The master information-equipped event information 2104 is input to a bank state classification unit 2105. The bank state classification unit 2105 to a display unit 2110 are the same in flow as the bank state classification unit 103 to the display unit 108 in the first exemplary embodiment. The difference is that associating event information with master information is performed to indicate a data access request from which master has become a factor for each of an operating state and a partial inoperative state. Details of differences of the bank state classification unit 2105 to the display unit 2110 from those in the first exemplary embodiment are described below.

Thus far is the overall flow of performance analysis processing and analysis result display processing in the third exemplary embodiment. In the following description, details of the master event detection unit 2101 to the display unit 2110 are described.

The master event detection unit 2101 is implemented by the master monitor 2001 in simulation processing for a test bench 2002 which is performed by the above-mentioned computer apparatus. Master event information output from the master monitor 2001 is stored in the HDD 306 as with the event information output from the monitor 211 in the first exemplary embodiment. The master monitor 2001, which monitors signal lines between each master and the bus 208 in the system LSI 200, i.e., the master event detection unit 2101 in the third exemplary embodiment, is described. The master monitor 2001 monitors signal lines between all of the masters and the bus 208 in the system LSI 200. In the third exemplary embodiment, signal lines between each of the CPU 201, the image processing unit 202, the audio processing unit 203, and the network processing unit 204 and the bus 208 are targeted for monitoring. Specifically, the master monitor 2001 monitors the above-mentioned signals in the AMBA 4 specification illustrated in FIG. 22 for each of the masters, and thus detects the issuance of a data access request serving as a master event. The mechanism for the issuance of a data access request in the AMBA 4 specification has been described above and is, therefore, omitted from description here. At the time of detecting a master event, the master monitor 2001 outputs attribute information appended to a data access request. Specifically, in the case of a data access request for read, the attribute information is signals araddr 2202, arburst 2205, arlen 2206, and arsize 2207. Moreover, in the case of a data access request for write, the attribute information is signals awaddr 2208, awburst 2211, awlen 2212, and awsize 2213. The master event information is information obtained by adding, to the above attribute information, time on a simulation of the issuance of a data access request and the master information. FIG. 24 illustrates an example of master event information. In the third exemplary embodiment, the unit of time is also assumed to be picosecond (ps) (=0.000 000 000 001 seconds) as in the first exemplary embodiment. The master information is information uniquely set for each master as mentioned above and indicates from which master a data access request has been issued. From here, a master event information entry 2410 is specifically described. The master event information entry 2410 indicates that, at time 3000 ps, a data access request is generated from the CPU 201 (master information=0). Moreover, the master event information entry 2410 indicates that the address of the data access request is 0x00080010 (araddr), the burst type is INCR (arburst), the number of continuous accesses is 2 (arlen=1), and the unit access size is 8 bytes (arsize=3). A case where signals araddr, arburst, arlen, and arsize are output represents the issuance of a data access request for read, and a case where signal awaddr, awburst, awlen, and awsize are output represents the issuance of a data access request for write. Therefore, it is understood that the master event information entry 2410 indicates a data access request for read. While, in the third exemplary embodiment, detecting a master event that is based on the standard of the AMBA 4 specification has been described as an example, a master event to be detected by the master event detection unit 2101 is not limited by the type of the standard. Since, even in another standard, the issuance of a data access request is defined based on the value of signal lines, the master event detection unit 2101 can be implemented.

From here, the association unit 2103 is described with reference to FIG. 6, FIG. 20, FIG. 23, and FIG. 26. The association unit 2103 receives, as inputs, the event information 102 and the master event information 2102, and, after the above-mentioned simulation processing, is executed as another processing operation on the above-mentioned computer apparatus. The association unit 2103 performs association indicating by a data access request from which master the DRAM command serving as an event is generated. As mentioned above, analyzing attribute information appended to a data access request allows identifying an access region in a slave serving as an access destination. For example, in the case of the DRAM 209, an access region in a slave is expressed by a bank number, a column address, and a row address. With regard to commands, ACT command designates a bank number and a row address and opens the applicable row address. RD or WR command designates a bank number and a column address, so that a region to be subjected to read and write is determined by a combination of the opened row address and these two addresses. While RD and WR commands do not designate a row address, a bank number and a row address have already been designated by ACT command at the time of issuance of RD and WR commands, so that, at the time of issuance of RD and WR commands, there occurs a state in which the bank number, the row address, and the column address have been designated. Therefore, if it is possible to discriminate from which master a data access request has been issued, it is also possible to identify by a data access request from which master RD and WR commands have been generated. Moreover, the association unit 2103 also associates commands other than RD and WR commands with master information. In the third exemplary embodiment, the association unit 2103 associates PRE command and ACT command with master information, and does not associate the other commands with master information. PRE command and ACT command are used to perform switching of page open or page close with respect to a row address in each bank of DRAM. Thus, PRE and ACT commands are issued to perform preliminary preparation or post-processing of RD or WR command. Therefore, it can be deemed that PRE and ACT commands are issued due to RD or WR command which has been generated immediately before or immediately after the same bank as that for the PRE and ACT commands. In the third exemplary embodiment, the association unit 2103 associates master information which has been associated with RD or WR command generated immediately before the same bank as that for PRE and ACT commands with the PRE and ACT commands.

Figure 23:
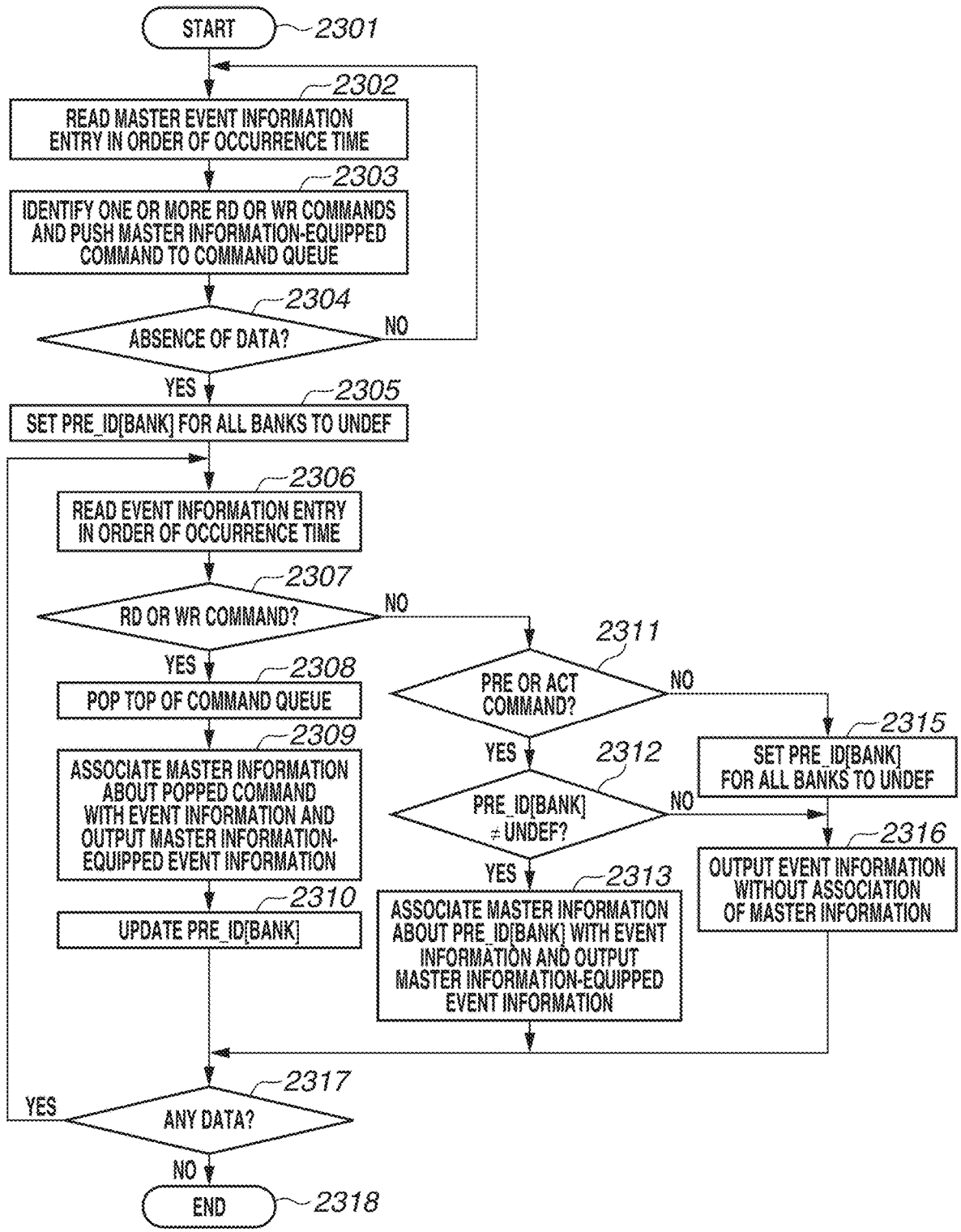
FIG. 23 is a flowchart illustrating processing which is performed by an association unit in the third exemplary embodiment.
Figure 27B:
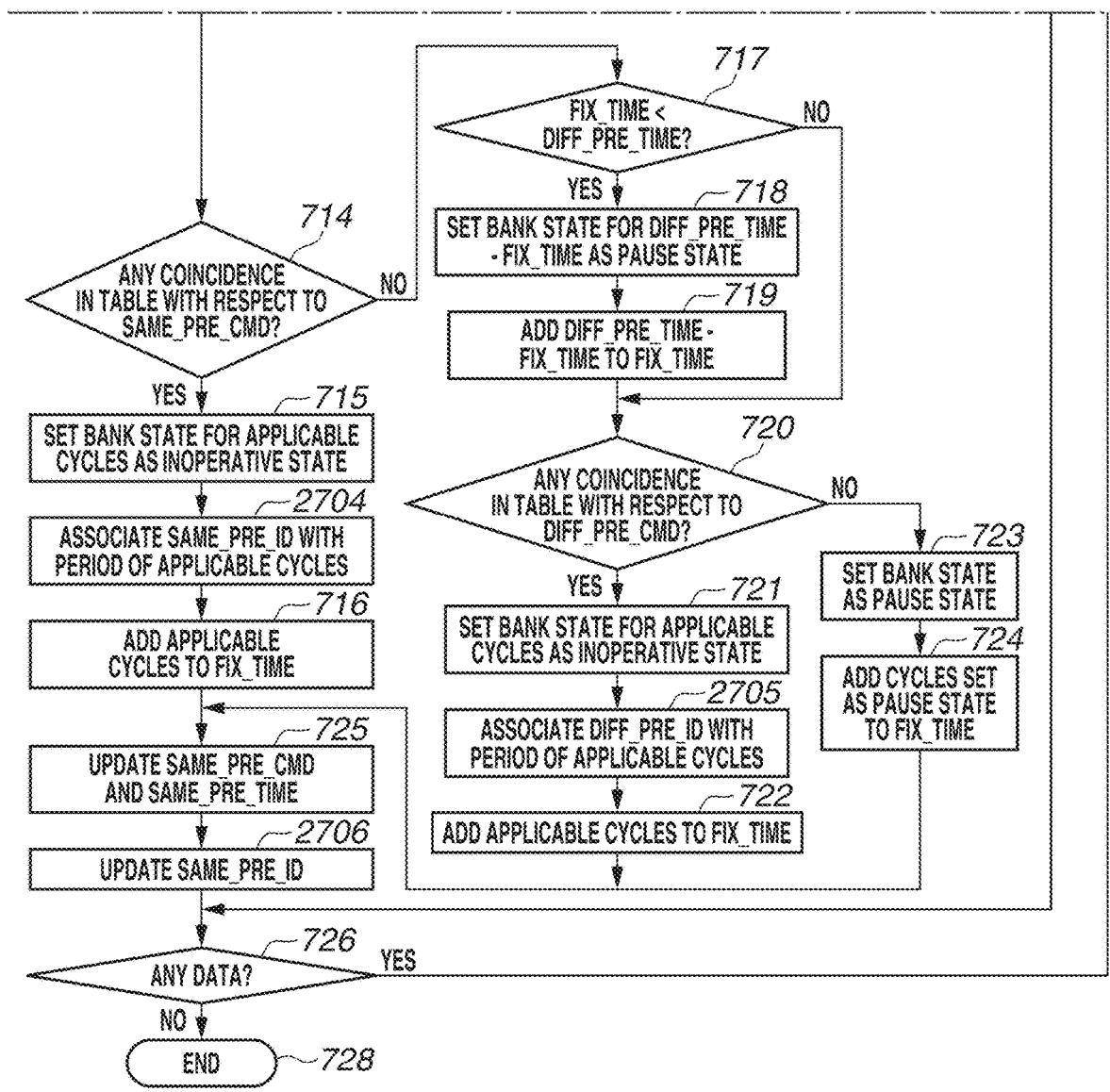
FIG. 27, which is composed of FIGS. 27A and 27B, is a flowchart illustrating processing which is performed by a bank state classification unit in the third exemplary embodiment.
Figure 29:
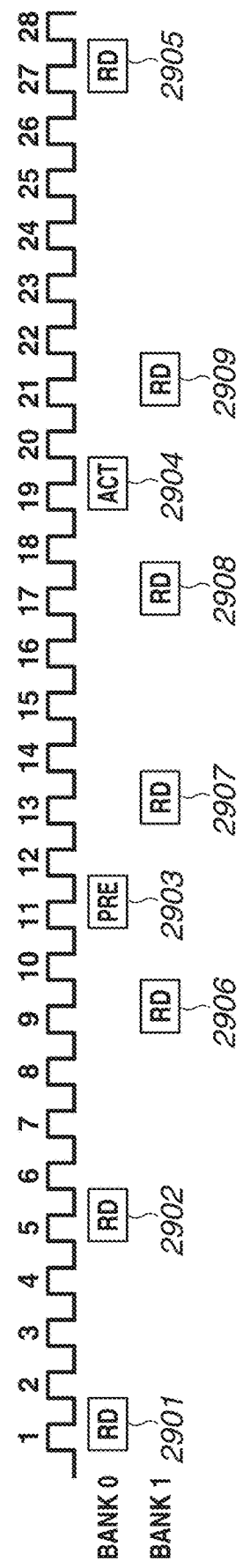
FIG. 29 is a diagram illustrating a penalty caused by a page miss in DDR3-SDRAM and an operation for hiding the penalty.

FIG. 23 is a flowchart for the association unit 2103. This flowchart is divided into early-stage processing in step 2302 to step 2304 and later-stage processing in step 2305 to step 2318. In the early-stage processing, the association unit 2103 analyzes a data access request serving as a master event and thus identifies a bank number, a row address, and a column address in the DRAM 209 serving as an access destination, a read or write attribute, and master information. The identified pieces of information are used for association of event information and master information with each other, which is also performed in the later-stage processing. Moreover, since, as mentioned above, at the time of issuance of RD or WR command, there occurs a state in which a bank number, a row address, and a column address have been designated, the above-mentioned pieces of information have the same meaning as processing for identifying RD or WR command which is generated by a data access request. However, since the data size of a data access request may become larger than the access size (8 bytes) of RD or WR command issued once, a data access request issued once is identified by one or more RD or WR commands. This is described with the master event information entry 2410 illustrated in FIG. 24 taken as an example. The master event information entry 2410 indicates that the bus address is 0x00080010 (araddr), the number of accesses is 2 (arlen=1), the access type is INCR (arburst), and the unit access size is 8 bytes (arsize=3). Moreover, the master event information entry 2410 also indicates that the requestor is the CPU 201 (master information=0). The access size is 16 bytes, so that, specifically, transfer for 16 bytes corresponding to the bus address 0x00080010 to the bus address 0x0008001F is performed. Since RD access is 8-beat access fixed, the access size of RD command issued once is 8 bytes (64 bits), in which 8 bits (1 byte) of DRAM width are repeated 8 beats (times). Since, while the size of a data access request in the master event information entry 2410 is 16 bytes, the access size of RD command issued once is 8 bytes, analyzing the master event information entry 2410 results in RD command issued twice being identified. A specific procedure for analysis is as described above, and, if x00080010 of the bus address is analyzed, information indicating "the bank number=0x0, the row address=0x0100, and the column address=0x0010" is found. This information serves as an address in DRAM designated by the first RD command. Since the first RD command corresponds to transfer for 8 bytes, RD command for transfer of the remaining 8 bytes is also identified. The first RD command corresponds to data access for 8 bytes from the bus address 0x00080010 to the bus address 0x00080017, and the remaining 8 bytes are used for data access from the bus address 0x00080018 to the bus address 0x0008001F. If the bus address 0x00080018 is analyzed, information indicating "the bank number=0x0, the row address=0x0100, and the column address=0x0018" is found, and this information serves as an address in DRAM designated by the second RD command. It can be identified that these RD commands are issued by a data access request from the CPU 201. In the third exemplary embodiment, RD or WR commands generated by analyzing all of the data access requests are accumulated. This processing serves as the early-stage processing performed in step 2302 to 2304. Accumulation of RD or WR commands is performed with use of a queue which retains data in a first-in first-out list structure. In the third exemplary embodiment, this queue is referred to as a "command queue", a push operation is assumed to be performed to register a command with the lattermost stage of the queue, and a pop operation is assumed to be performed to invoke a command. Specific elements of the command queue include a command (RD or WR), a bank number, a row address, a column address, and master information. Step 2305 to step 2318 in the later-stage processing are steps for associating master information with a DRAM control command serving as an event. Specifically, depending on commands included in event information which is input, processing is divided into processing for RD and WR commands, processing for PRE and ACT commands, and processing for the other commands. Step 2308 to step 2310 correspond to processing for RD and WR commands. Steps 2312, 2313, and 2316 correspond to processing for PRE and ACT commands. Steps 2315 and 2316 correspond to processing for commands other than RD, WR, PRE, and ACT commands. A policy of association of master information with respective commands is as described above.

From here, the respective steps are described. In step 2301, the association unit 2103 starts processing. In step 2302, the association unit 2103 reads a master event information entry in order of occurrence time. For example, in the case of master event information illustrated in FIG. 24, the association unit 2103 reads one row. In step 2303, the association unit 2103 analyzes a data access request serving as a master event, identifies RD or WR command having a bank number, a column address, and a row address in DRAM, and pushes the identified command to a command queue. Since master information is able to be discriminated based on the data access request targeted for analysis, master information is also appended to the identified RD and WR commands when each command is pushed to the command queue. In the third exemplary embodiment, the procedure of analyzing data access requests to identify RD and WR commands has been described above. Next, in step 2304, the association unit 2103 determines whether there is no more master event information entry. If it is determined that there is at least one master event information entry (NO in step 2304), the association unit 2103 returns the processing to step 2302, and then reads a next master event information entry. If it is determined that there is no master event information entry (YES in step 2304), the association unit 2103 advances the processing to step 2305, thus starting a procedure for associating master information with a DRAM control command serving as an event. There occurs a state in which analysis of all of the data access requests obtained at a point of time when the result of determination in step 2304 has become YES and creation of a command queue in which RD and WR commands with master information appended thereto have been accumulated have been completed. The command queue is used in a procedure for association of master information in step 2307 and subsequent steps. Next, in step 2305, the association unit 2103 sets PRE_ID[BANK] for all of the banks to UNDEF. PRE_ID is array data corresponding to the number of banks, and BANK denotes a bank number. In the third exemplary embodiment, since DRAM is composed of a bank 220 to a bank 227 illustrated in FIG. 20, BANK is a numerical value of 0 to 7. Thus, the association unit 2103 sets PRE_ID[0] to PRE_ID[7] to UNDEF. This PRE_ID[BANK] retains master information associated with the last RD or WR command generated in each bank, and is used to associate master information with PRE and ACT commands. Next, the association unit 2103 advances the processing to step 2306. In step 2306, the association unit 2103 reads an event information entry in order of occurrence time. This is equivalent to a step of reading one row in the event information illustrated in FIG. 6. Next, in step 2307, the association unit 2103 determines whether the current command is RD or WR command. If the result of determination in step 2307 is YES, the association unit 2103 advances the processing to step 2308. In step 2308, the association unit 2103 pops the earliest stage of a command queue. As mentioned above, in the third exemplary embodiment, permutation of data access requests does not occur at the bus 208 and the memory controller 205. Therefore, when, in step 2302 to step 2304, the association unit 2103 analyzes data access requests, serving as master events, in order of occurrence thereof, RD and WR commands included in the command queue also line up in order of occurrence thereof from the top. Thus, if the event information entry read in step 2306 is RD or WR command, such an event information entry necessarily coincides with a command at the top of the command queue. In step 2309, the association unit 2103 associates the master information about the command popped in step 2308 with the event information entry and thus outputs master information-equipped event information. FIG. 26 illustrates an example of master information-equipped event information. Since, in step 2309, master information is appended to event information about RD and WR commands, for example, a row 2612 illustrated in FIG. 26 indicates that master information=0 indicating the CPU 201 is associated with the event information. Next, in step 2310, the association unit 2103 updates PRE_ID[BANK] of a target bank of the popped command to the master information about the popped command, and then advances the processing to step 2317. When the state obtained after the above-mentioned row 2612 illustrated in FIG. 26 is output is taken as an example, since the popped RD command includes bank number=0 and master information=0, PRE_ID[0 (bank number)]=0 (master information) is obtained. If it is determined that the current command is neither RD nor WR command (NO in step 2307), the association unit 2103 advances the processing to step 2311.

In step 2311, the association unit 2103 determines whether the current command is PRE or ACT command, and, if it is determined that the current command is PRE or ACT command (YES in 2311), the association unit 2103 advances the processing to step 2312. In step 2312, the association unit 2103 determines whether PRE_ID[BANK] is not UNDEF, and it is determined that PRE_ID[BANK] is not UNDEF (YES in step 2312), the association unit 2103 advances the processing to step 2313. The time when PRE_ID[BANK] becomes UNDEF is the time of initialization performed in step 2305 and the time of detection of commands other than RD, WR, PRE, and ACT commands performed in step 2315 described below. In step 2313, the association unit 2103 associates master information associated with the last RD or WR command which has occurred in each bank with PRE or ACT command targeted for analysis and thus outputs master information-equipped event information. After step 2313, the association unit 2103 advances the processing to step 2317. If, in step 2312, it is determined that PRE_ID[BANK] is UNDEF (NO in step 2312), the association unit 2103 advances the processing to step 2316. In step 2316, since there is no master information to be associated with PRE or ACT command, the association unit 2103 outputs event information with no master information associated therewith. In the third exemplary embodiment, the association unit 2103 outputs event information with master information=NO, which indicates the absence of association. For example, referring to FIG. 26, in a row 2610, master information=NO, which indicates that there is no master information to be associated with ACT command, is set. If, in step 2311, it is determined that the current command is neither PRE nor ACT command (NO in step 2311), the association unit 2103 advances the processing to step 2315. In step 2315, the association unit 2103 sets PRE_ID[BANK] to UNDEF as mentioned above, and then advances the processing to step 2316. For example, REF command is a command for performing refresh serving as a memory storage operation of DRAM and, on the standard of DDR3-SDRAM, is not able to be executed unless all of the banks of the DRAM 209 are closed. Thus, page close which occurs due to refresh execution is irrelevant to a data access request. Moreover, REF command itself is also irrelevant to a data access request. Commands which are not able to be executed unless all of the banks are closed due to, in addition to refresh, power-down and self-refresh are treated in the same manner as REF command. Step 2315 means that, in a case where a command other than RD, WR, ACT, and PRE commands has occurred, the states of the banks are reset and the command history obtained before that returns to an initial state thereof. After setting PRE_ID[BANK] to UNDEF in step 2315, the association unit 2103 advances the processing to step 2316. In step 2316, the association unit 2103 outputs event information without associating master information with the read command. As mentioned above, in the third exemplary embodiment, the association unit 2103 outputs event information with master information=NO, which indicates the absence of association. In step 2317, the association unit 2103 determines whether the event information 102 has been read up to the end. If, in step 2317, it is determined that there is any data (YES in step 2317), the association unit 2103 returns the processing to step 2306, then reading next data. If, in step 2317, it is determined that there is no data (NO in step 2317), the association unit 2103 advances the processing to step 2318, then ending the processing. Thus far is the details of the association unit 2103.

In the following description, while a case where the event information illustrated in FIG. 6 and the master event information illustrated in FIG. 24 have actually been input is taken as an example, processing which is performed by the association unit 2103 is specifically described with reference to FIG. 23, FIG. 25, and FIG. 26. Rows 2610 to 2638, 2651, and 2652 illustrated in FIG. 26 are results obtained by processing the event information illustrated in FIG. 6 and the master event information illustrated in FIG. 24 according to the flowchart of FIG. 23, and thus indicate the master information-equipped event information 2104 obtained by association of mater information.

First, the flow of repeating step 2302 to step 2304 with respect to rows 2410 to 2452 illustrated in FIG. 24 and thus accumulating RD and WR commands in a command queue is described. First, in step 2302, the association unit 2103 reads a master event information entry 2410, and then advances the processing to step 2303. In step 2303, the association unit 2103 analyzes the master event information entry 2410 and thus identifies RD command. Processing for identifying RD command from the master event information entry 2410 has been described above, and is, therefore, omitted from description here. FIG. 25 illustrates the state of a command queue obtained by analyzing master event information entries 2414 to 2420, 2451, and 2452 illustrated in FIG. 24. Column 2501 indicates a queue number, and the queue number being smaller indicates the row being closer to the top of the queue. Moreover, column 2502 indicates master information and indicates by a data access request from which master RD or WR command has been generated. The command queue obtained when processing of the master event information entry 2410 has been completed is in a state in which rows 2510 and 2511 illustrated in FIG. 25 are present. After pushing the command to the command queue in step 2303, the association unit 2103 advances the processing to step 2304. In step 2304, since there is still a master event information entry to be read, the result of determination therein is NO, and the association unit 2103 returns the processing to step 2302.

In next step 2302, the association unit 2103 reads a master event information entry 2411, and then advances the processing to step 2303. In step 2303, the association unit 2103 analyzes the master event information entry 2411 and thus identifies RD command. The association unit 2103 performs analysis based on a similar concept to the above-mentioned method of analyzing the master event information entry 2410 and thus identifying RD command, and identifies one RD command indicating "bank number=0x0, row address=0x0100, and column address=0x0080". The association unit 2103 appends, to this command, master information=0 of the master event information entry 2411 targeted for analysis. As a result, the command queue obtained when processing of the master event information entry 2411 has been completed is in a state in which rows 2510 to 2512 illustrated in FIG. 25 are present. After pushing the command to the command queue in step 2303, the association unit 2103 advances the processing to step 2304, in which, since there is still a master event information entry to be read, the association unit 2103 returns the processing to step 2302.

In next step 2302, the association unit 2103 reads a master event information entry 2412, and then advances the processing to step 2303. In step 2303, the association unit 2103 analyzes the master event information entry 2412 and thus identifies WR command. The association unit 2103 performs analysis based on a similar concept to the above-mentioned method of analyzing the master event information entry 2410 and thus identifying RD command. As a result of analysis, the association unit 2103 identifies two WR commands indicating "bank number=0x1, row address=0x0010, and column address=0x0020" and "bank number=0x1, row address=x0010, and column address=0x0028". The association unit 2103 appends, to these commands, master information=3 of the master event information entry 2412 targeted for analysis. As a result, the command queue obtained when processing of the master event information entry 2412 has been completed is in a state in which rows 2510 to 2514 illustrated in FIG. 25 are present. After pushing the commands to the command queue in step 2303, the association unit 2103 advances the processing to step 2304, in which, since there is still a master event information entry to be read, the association unit 2103 returns the processing to step 2302.

In next step 2302, the association unit 2103 reads a master event information entry 2413, and then advances the processing to step 2303. In step 2303, the association unit 2103 analyzes the master event information entry 2413 and thus identifies WR command. The association unit 2103 performs analysis based on a similar concept to the above-mentioned method of analyzing the master event information entry 2410 and thus identifying RD command, and identifies one WR command indicating "bank number=0x1, row address=0x0010, and column address=0x0030". The association unit 2103 appends, to this command, master information=3 of the master event information entry 2413 targeted for analysis. As a result, the command queue obtained when processing of the master event information entry 2413 has been completed is in a state in which rows 2510 to 2515 illustrated in FIG. 25 are present.

When the association unit 2103 repeats step 2302 and step 2303 with respect to master event information entries 2414 to 2420, 2451, and 2452 illustrated in FIG. 24 in a similar way to that described above, the command queue becomes as illustrated in FIG. 25.

After the association unit 2103 analyzes the last master event information entry 2452, identifies RD command, and pushes the command to the command queue, the result of determination in step 2304 becomes YES, so that the association unit 2103 advances the processing to step 2305.

Next, the flow of repeating step 2305 to step 2317 with respect to rows 610 to 652 illustrated in FIG. 6 and thus associating master information with a DRAM control command serving as an event is described. First, in step 2305, the association unit 2103 sets PRE_ID[0] to PRE_ID[7] to UNDEF. As mentioned above, PRE_ID[BANK] is used to preserve master information about RD or WR command generated immediately before in the applicable bank.

In next step 2306, the association unit 2103 reads an event information entry 610, and then advances the processing to step 2307. Since the event information entry 610 is ACT command, the association unit 2103 advances the processing from step 2307 to step 2311. The result of determination in step 2311 is YES, so that the association unit 2103 advances the processing to step 2312. Since a target bank for ACT command in the event information entry 610 is 0, then in step 2312, the association unit 2103 determines whether PRE_ID[0] is not UNDEF. Since PRE_ID[0] is UNDEF, the result of determination in step 2312 is NO, so that the association unit 2103 advances the processing to step 2316. In step 2316, the association unit 2103 appends, as master information, NO indicating that there is no master information to be associated as mentioned above, and thus outputs the row 2610 illustrated in FIG. 26. FIG. 26 illustrates a format in which master information is appended to the event information illustrated in FIG. 6. After outputting such master information-equipped event information, the association unit 2103 advances the processing to step 2317, and, since there is still data to be read, the association unit 2103 returns the processing to step 2306.

In next step 2306, the association unit 2103 reads an event information entry 611, and then advances the processing to step 2307. Since the event information entry 611 is ACT command, the association unit 2103 advances the processing from step 2307 to step 2311. The result of determination in step 2311 is YES, so that the association unit 2103 advances the processing to step 2312. Since a target bank for ACT command in the event information entry 611 is 1, then in step 2312, the association unit 2103 determines whether PRE_ID[1] is not UNDEF. Since PRE_ID[1] is UNDEF, the result of determination in step 2312 is NO, so that the association unit 2103 advances the processing to step 2316. In step 2316, the association unit 2103 appends, as master information, NO indicating that there is no master information to be associated as mentioned above, and thus outputs the row 2611 illustrated in FIG. 26. After outputting such master information-equipped event information, the association unit 2103 advances the processing to step 2317, and, since there is still data to be read, the association unit 2103 returns the processing to step 2306.

In next step 2306, the association unit 2103 reads an event information entry 612, and then advances the processing to step 2307. Since the event information entry 612 is RD command, the result of determination in step 2307 is YES, so that the association unit 2103 advances the processing to step 2308. In step 2308, the association unit 2103 pops a master information-equipped command in the row 2510, which is the top of the command queue, and then advances the processing to step 2309. In step 2309, the association unit 2103 associates master information=0 about the popped command with the event information entry 612 and thus outputs a row 2612 illustrated in FIG. 26. Then, in step 2310, the association unit 2103 refers to the bank number=0 and master information=0 about the popped command, updates PRE_ID[0] to 0 (master information), and advances the processing to step 2317. In step 2317, since there is still data to be read, the association unit 2103 returns the processing to step 2306.

The association unit 2103 repeats the above-mentioned procedure performed on the event information entry 612 with respect to event information entries 613 to 620 about RD and WR commands, and thus outputs rows 2613 to 2620 illustrated in FIG. 26 as master information-equipped event information.

In next step 2306, the association unit 2103 reads an event information entry 621, and then advances the processing to step 2307. Since the event information entry 621 is PRE command, the association unit 2103 advances the processing from step 2307 to step 2311. The result of determination in step 2311 is YES, so that the association unit 2103 advances the processing to step 2312. Since a target bank for PRE command of the event information entry 621 is 0, then in step 2312, the association unit 2103 determines whether PRE_ID[0] is not UNDEF. PRE_ID[0] is updated as master information=0 in step 2310 for processing performed on the event information entry 614. With regard to event information entries 615 to 620, since the bank number=1 is targeted, PRE_ID[0] is not updated. Therefore, the result of determination in step 2312 is YES, so that the association unit 2103 advances the processing to step 2313. In step 2313, the association unit 2103 appends PRE_ID[0]=0 as master information, and thus outputs a row 2621 illustrated in FIG. 26. After outputting such master information-equipped event information, the association unit 2103 advances the processing to step 2317, and, since there is still data to be read, the association unit 2103 returns the processing to step 2306.

The association unit 2103 also repeats the above-mentioned procedure performed on the event information entry 612 with respect to event information entries 622 to 631 about RD command, and thus outputs rows 2622 to 2631 illustrated in FIG. 26 as master information-equipped event information.

In next step 2306, the association unit 2103 reads an event information entry 632, and then advances the processing to step 2307. Since the event information entry 632 is ACT command, the association unit 2103 advances the processing from step 2307 to step 2311. The result of determination in step 2311 is YES, so that the association unit 2103 advances the processing to step 2312. Since a target bank for ACT command of the event information entry 632 is 0, then in step 2312, the association unit 2103 determines whether PRE_ID[0] is not UNDEF. As mentioned above, at a point of time of the completion of processing performed on the event information entry 621, PRE_ID[0]=0 is set. With regard to the event information entries 622 to 631, since the bank number=1 is targeted, PRE_ID[0] is not updated. Therefore, the result of determination in step 2312 is YES, so that the association unit 2103 advances the processing to step 2313. In step 2313, the association unit 2103 appends PRE_ID[0]=0 as master information, and thus outputs a row 2632 illustrated in FIG. 26. After outputting such master information-equipped event information, the association unit 2103 advances the processing to step 2317, and, since there is still data to be read, the association unit 2103 returns the processing to step 2306.

The association unit 2103 repeats the above-mentioned procedure with respect to event information entries 633 to 638, 651, and 652, and thus outputs rows 2633 to 2638, 2651, and 2652 illustrated in FIG. 26 as master information-equipped event information. The final master information-equipped event information 2104 in the third exemplary embodiment becomes as illustrated in FIG. 26.

In the third exemplary embodiment, association of master information with ACT and PRE commands is performed with use of master information about RD or WR command immediately before the applicable bank. ACT and PRE commands are commands for performing page open and page close associated with a page miss of DRAM. Page open and page close occur not only in relation to RD or WR command generated immediately before that but also in relation to RD or WR command generated immediately after that. Therefore, ACT or PRE command can be associated with not master information about RD or WR command generated immediately before that but master information about RD or WR command generated immediately after that. In that case, when reading ACT or PRE command, the association unit 2103 once stores the ACT or PRE command in a buffer, and, at the timing when RD or WR command in the same bank has been detected, the association unit 2103 associates master information about that with the ACT or PRE command and outputs such master information-equipped event information. Moreover, the association unit 2103 can associate both master information about RD or WR command generated immediately before ACT or PRE command and master information about RD or WR command generated immediately after that with the ACT or PRE command. Using this method, when reading RD or WR command in reading of an event information entry, the association unit 2103 outputs master information-equipped event information collectively for each bank (together with PRE command and ACT command). Therefore, events which are output do not line up in a time-series manner, but, if, after processing on all of pieces of event information is completed, events are permuted in order of occurrence time, time-series master information-equipped event information equivalent to that illustrated in FIG. 26 is generated.

Moreover, in the flow employed in the third exemplary embodiment, after analyzing all of the pieces of master event information in advance and identifying RD and WR commands, the association unit 2103 associates master information with event information. However, the association unit 2103 can also generate master information-equipped event information by reading master event information and event information in order of occurrence time and performing sequential processing. In this flow, since one of commands accumulated in a command queue is popped at the timing when event information is read, a resource (a hard disk or memory) which is used in a command queue can be kept to the minimum.

Moreover, in the third exemplary embodiment, there is provided a premise that the bus 208 and the memory controller 205 do not permute data access requests inside those. However, even if permutation occurs, it is possible to generate master information-equipped event information. For example, if there is no permutation with respect to the same address, in step 2309, the association unit 2103 can search for a command coincident with each item other than master information in the read event information entry in order from the top of the command queue and then pop the found command. In the above-mentioned case, there is provided a premise that there is no permutation with respect to the same address. However, even if there is a permutation with respect to the same address, since, as long as a rule for the permutation is previously determined, a command can be identified from a data access request based on the rule, it is also possible to generate master information-equipped event information.

Moreover, while, in the third exemplary embodiment, the association unit 2103 is implemented on the above-mentioned computer apparatus as processing which is performed separately after simulation processing, master information can be associated with event information within the simulation processing. For example, an association module having the function of receiving information detected by the master monitor 2001 and the monitor 211 and generating master information-equipped event information is mounted in a test bench. The term "module" means a functionally defined component. Mounting the association unit 2103 as a module in a test bench allows generating master information-equipped event information within the test bench.

The master information-equipped event information 2104 is input to the bank state classification unit 2105, and the bank state classification unit 2105 classifies the bank state for each bank. In the third exemplary embodiment, while the bank state classification unit 2105 performs classification into states similar to those in the first exemplary embodiment, an operating state and a partial inoperative state are associated with master information. Therefore, a flow illustrated in FIG. 27, which is composed of FIGS. 27A and 27B, in which steps for association of master information are added to the flow illustrated in FIG. 7 used in the first exemplary embodiment, is used. In the third exemplary embodiment, the description of portions similar to those of the flow illustrated in FIG. 7 are omitted, and only the added steps are described. As mentioned in the first exemplary embodiment, an operating state is determined by classification that is based on RD or WR command and is, therefore, associated with master information about RD or WR command. On the other hand, an inoperative state is associated with master information about RD or WR command generated immediately before in the same bank. While, since the inoperative state is determined based on a time constraint between two commands, both the first command and the second command become a factor for causing an inoperative state, the third exemplary embodiment is assumed to associate master information about the first command with an inoperative state. However, as mentioned in the description of the association unit 2103, REF command is irrelevant to master information, and master information is not associated with REF command. Therefore, an inoperative state which is determined by classification based on REF command is not associated with master information.

From here, among the flow illustrated in FIG. 27, differences from the flow illustrated in FIG. 7 are described. First, in step 2701, the association unit 2103 performs initialization by setting SAME_PRE_ID and DIFF_PRE_ID to UNDEF. SAME_PRE_ID means master information about a just previous command in the bank number designated in step 701. DIFF_PRE_ID means master information associated with a just previous command in a bank other than the bank designated in step 701. Step 2701 is inserted immediately after step 703. SAME_PRE_ID is updated in step 2706. In step 2706, which is inserted immediately after step 725, after updating SAME_PRE_CMD and SAME_PRE_TIME, the association unit 2103 sets master information associated with SAME_PRE_CMD to SAME_PRE_ID. DIFF_PRE_ID is updated in step 2707. In step 2707, which is inserted immediately after step 727, after updating DIFF_PRE_CMD and DIFF_PRE_TIME, the association unit 2103 sets master information associated with DIFF_PRE_CMD to DIFF_PRE_ID.

Association of master information with an operating state is performed in step 2702. In step 2702, which is inserted immediately after step 709, the association unit 2103 associates SAME_PRE_ID as master information with the operating state for four cycles set in step 709. Moreover, association of master information with an inoperative state is performed in step 2704 and step 2705. Step 2704 is inserted immediately after step 715. When there is a constraint coincident with the number of cycles between commands in the same bank, after setting the bank state for the corresponding number of cycles to an inoperative state in step 715, then in step 2704, the association unit 2103 associates SAME_PRE_ID as master information with the inoperative state for the corresponding number of cycles. Step 2705 is inserted immediately after step 721. When there is a constraint coincident with the number of cycles between commands in different banks, after setting the bank state for the corresponding number of cycles to an inoperative state in step 721, then in step 2705, the association unit 2103 associates DIFF_PRE_ID as master information with the inoperative state for the corresponding number of cycles.

While, as mentioned above, the association unit 2103 does not associate master information with an inoperative state determined by classification performed on REF command, to make not performing association clear, step 2703 is inserted immediately after step 712. However, in the third exemplary embodiment, NO, which means that there is no master information to be associated, is assumed to be set as master information.

In the following description, while a case where master information-equipped event information entries 2610 to 2638, 2651, and 2652 illustrated in FIG. 26 have actually been input is taken as an example, processing which is performed by the bank state classification unit 2105 is specifically described. FIG. 28 illustrates classification results obtained when the master information-equipped event information entries 2610 to 2638 are received as inputs and the states of the respective banks and master information are associated with each other. In the following description, processing of the master information-equipped event information entries 2610 to 2638 is described with reference to the classification results. Furthermore, the master information-equipped event information illustrated in FIG. 26 for use in the third exemplary embodiment is generated by the association unit 2103 receiving the event information illustrated in FIG. 6 used in the first exemplary embodiment as inputs and is, therefore, the same as that in the first exemplary embodiment in classification of bank states. In the third exemplary embodiment, the description of the classification of bank states is omitted, and procedures for associating master information with the respective bank states are specifically described.

First, the description is directed to a bank number 0. In step 704, the bank state classification unit 2105 reads a master information-equipped event information entry 2610. The master information-equipped event information entry 2610 is finally classified as a pause state for one cycle in step 723. In step 2706, since master information of the master information-equipped event information entry 2610 is NO, the association unit 2103 sets SAME_PRE_ID=NO.

In next step 704, the bank state classification unit 2105 reads a master information-equipped event information entry 2611. Since the event of the master information-equipped event information entry 2611 is a command directed to a bank number 1 and master information=NO is set therein, in step 2707, the association unit 2103 sets DIFF_PRE_ID=NO.

In next step 704, the bank state classification unit 2105 reads a master information-equipped event information entry 2612. Since the event of the master information-equipped event information entry 2612 is RD command to the bank number 0, in step 714, it is determined that there is a coincidence in the table, and, in step 715, the bank state classification unit 2105 classifies the bank state as an inoperative state 1002 for 30 cycles. In step 2704, the association unit 2103 determines master information which is to be associated with the inoperative state 1002. Since SAME_PRE_ID=NO is set, the master information which is to be associated with the inoperative state 1002 becomes equal to NO (2801). After that, in step 2706, since master information=0 is set in the master information-equipped event information entry 2612, the association unit 2103 sets SAME_PRE_ID=0.

In next step 704, the bank state classification unit 2105 reads a master information-equipped event information entry 2613. Since the event of the master information-equipped event information entry 2613 is RD command to the bank number 0 and SAME_PRE_CMD is RD command, in step 709, the bank state classification unit 2105 classifies the bank state as an operating state 1003 for four cycles, and advances the processing to step 2702. In step 2702, the association unit 2103 sets master information which is to be associated with the operating state 1003 to 0 (2802) of SAME_PRE_ID. After that, in step 2706, since master information=0 is set in the master information-equipped event information entry 2613, the association unit 2103 sets SAME_PRE_ID=0.

In next step 704, the bank state classification unit 2105 reads a master information-equipped event information entry 2614. Since the event of the master information-equipped event information entry 2614 is RD command to the bank number 0 and SAME_PRE_CMD is RD command, in step 709, the bank state classification unit 2105 classifies the bank state as an operating state 1004 for four cycles, and advances the processing to step 2702. In step 2702, the association unit 2103 sets master information which is to be associated with the operating state 1004 to 0 (2803) of SAME_PRE_ID. In reading of the master information-equipped event information entry 2614, additionally, in step 724, the bank state classification unit 2105 classifies the bank state as a pause state 1005 for one cycle. After that, in step 2706, since master information=0 is set in the master information-equipped event information entry 2614, the association unit 2103 sets SAME_PRE_ID=0.

Since the events of subsequent master information-equipped event information entries 2615 to 2620 are commands directed to the bank number 1, the result of determination in step 707 is NO. In step 2707, since, at a point of time when processing on the master information-equipped event information entry 2620 is completed, master information=4 is set in the master information-equipped event information entry 2620, the association unit 2103 sets DIFF_PRE_ID=4.

In next step 704, the bank state classification unit 2105 reads a master information-equipped event information entry 2621. Since, at this point of time, SAME_PRE_CMD is RD command, in step 709, the bank state classification unit 2105 classifies the bank state as an operating state 1006 for four cycles, and advances the processing to step 2702. In step 2702, the association unit 2103 sets master information which is to be associated with the operating state 1006 to 0 (2804) of SAME_PRE_ID. Additionally, in step 714, it is determined that there is a coincidence in the table, and in step 715, the bank state classification unit 2105 classifies the bank state as an inoperative state 1007 for 46 cycles and then advances the processing to step 2704. In step 2704, the association unit 2103 sets master information which is to be associated with the inoperative state 1007 to 0 (2805) of SAME_PRE_ID. After that, in step 2706, since master information=0 is set in the master information-equipped event information entry 2621, the association unit 2103 sets SAME_PRE_ID=0.

Since the events of subsequent master information-equipped event information entries 2622 to 2631 are commands directed to the bank number 1, the result of determination in step 707 is NO. In step 2707, since, at a point of time when processing on the master information-equipped event information entry 2631 is completed, master information=4 is set in the master information-equipped event information entry 2631, the association unit 2103 sets DIFF_PRE_ID=4.

In next step 704, the bank state classification unit 2105 reads a master information-equipped event information entry 2632. Since the event of the master information-equipped event information entry 2632 is ACT command to the bank number 0, in step 714, it is determined that there is a coincidence in the table, and, in step 715, the bank state classification unit 2105 classifies the bank state as an inoperative state 1008 for 40 cycles, and advances the processing to step 2704. In step 2704, the association unit 2103 sets master information which is to be associated with the inoperative state 1008 to 0 (2806) of SAME_PRE_ID. After that, in step 2706, since master information=0 is set in the master information-equipped event information entry 2632, the association unit 2103 sets SAME_PRE_ID=0.

Then, results 2807 to 2813 are obtained by the bank state classification unit 2105 reading subsequent master information-equipped event information entries 2633 to 2638 and the association unit 2103 associating master information with respective operating states and respective inoperative states in the above-described procedure.

With regard to the bank number 1, the association unit 2103 is also able to associate master information with respective operating states and respective inoperative states in a similar procedure to that for the bank number 0. However, with regard to the bank number 1, there are inoperative states 1018 and 1020 which occur due to a constraint between different banks, and, therefore, only association of master information with these inoperative states is specifically described.

First, in step 704, the bank state classification unit 2105 reads a master information-equipped event information entry 2610. Since the event of the master information-equipped event information entry 2610 is a command directed to the bank number 0 and master information=NO is set therein, in step 2707, the association unit 2103 sets DIFF_PRE_ID=NO.

In next step 704, the bank state classification unit 2105 reads a master information-equipped event information entry 2611. Since the event of the master information-equipped event information entry 2611 is ACT command to the bank number 1, after, in step 718, the bank state classification unit 2105 classifies the bank state as a pause state 1017 for one cycle, then in step 720, it is determined that there is a coincidence in the table, and then, the bank state classification unit 2105 advances the processing to step 721. In step 721, the bank state classification unit 2105 classifies the bank state as an inoperative state 1018 for four cycles, and advances the processing to step 2705. In step 2705, the association unit 2103 sets master information which is to be associated with the inoperative state 1018 to NO (2814) of DIFF_PRE_ID. After that, in step 2706, since master information=NO is set in the master information-equipped event information entry 2611, the association unit 2103 sets SAME_PRE_ID=NO.

Since the events of subsequent master information-equipped event information entries 2612 to 2614 are commands directed to the bank number 0, the result of determination in step 707 is NO. In step 2707, since, at a point of time when processing on the master information-equipped event information entry 2614 is completed, master information=0 is set in the master information-equipped event information entry 2614, the association unit 2103 sets DIFF_PRE_ID=0.

In next step 704, the bank state classification unit 2105 reads a master information-equipped event information entry 2615. Since the event of the master information-equipped event information entry 2615 is WR command to the bank number 1, after, in step 718, the bank state classification unit 2105 classifies the bank state as a pause state 1019 for 35 cycles, then in step 720, it is determined that there is a coincidence in the table, and then, the bank state classification unit 2105 advances the processing to step 721. In step 721, the bank state classification unit 2105 classifies the bank state as an inoperative state 1020 for 15 cycles, and advances the processing to step 2705. In step 2705, the association unit 2103 sets master information which is to be associated with the inoperative state 1020 to 0 (2815) of DIFF_PRE_ID.

Then, results 2816 to 2832 are obtained by the bank state classification unit 2105 reading subsequent master information-equipped event information entries 2616 to 2638 and the association unit 2103 associating master information with respective operating states and respective inoperative states in the above-described procedure.

As mentioned in the first exemplary embodiment, an inoperative state in the third exemplary embodiment, except for an inoperative state determined by classification performed on REF command, is determined by classification in a case where a time between the first command and the second command coincides with a time constraint between commands. As explained above, in the third exemplary embodiment, association of master information with an inoperative state is performed with use of master information about the first command based on the view that a cause for the occurrence of an inoperative state is present on the side of the first command. However, it can also be thought that an inoperative state caused by a page miss and inoperative states caused by Read-to-Write switching and Write-to-Read switching have been determined by classification due to the second command. Therefore, it is possible to associate master information about the second command with an inoperative state. Moreover, it is also possible to determine master information about which command to associate with each inoperative state obtained by detailed classification described in the second exemplary embodiment. For example, an inoperative state caused by a page miss is able to be divided into the following three examples. The first category is a Write-to-Precharge inoperative state and a Read-to-Precharge inoperative state. The second category is a precharge inoperative state. The third category is an activate inoperative state. A page miss occurs when RD or WR commands to the same bank and different row addresses have been continuously generated. Thus, RD or WR commands corresponding to both the first command and the second command provide cause of a page miss. Here, both master information about the first command and master information about the second command are assumed to be associated with an inoperative state. In that case, master information about the first RD or WR command is assumed to be associated with a Write-to-Precharge inoperative state and a Read-to-Precharge inoperative state in the first category. Moreover, master information about the second RD or WR command is assumed to be associated with a precharge inoperative state and an activate inoperative state in the second and third categories. Moreover, a Read-to-Write inoperative state and a Write-to-Read inoperative state are also brought about by the first RD or WR command and the second RD or WR command. If only one piece of master information is able to be associated with an inoperative state, master information about any one of the first and second commands is associated with a switching inoperative state. Here, master information about the second command is assumed to be used for association. For example, master information about the second WR command is associated with a Read-to-Write switching inoperative state, and master information about the second RD command is associated with a Write-to-Read switching inoperative state. In the above description, an example of the method of associating master information about the first and second commands, which provide cause of an inoperative state, and an inoperative state with each other has been described. However, as long as association of master information about a command and an inoperative state is able to be logically explained, an inoperative state and master information can be associated with each other in any condition.

In the description so far, an example in which the bank state classification unit 2105 outputs the bank state information 2106 with master information associated therewith based on the first exemplary embodiment has been described. The bank state information 2106 stores therein eight pieces of information about the banks 220 to 227. From here, the DRAM state classification unit 2107, which classifies the state of the DRAM 209 in association with master information, is described based on states associated with respective pieces of master about the banks 220 to 227. The DRAM state classification unit 2107 performs a flow similar to that illustrated in FIG. 9 used in the description of the first exemplary embodiment. However, since master information may be associated with the inoperative state of a bank, in a case where two or more banks are in an inoperative state, any one of pieces of master information is selected. In the third exemplary embodiment, the inoperative state of a bank with a larger bank number is assumed to be prioritized. On the other hand, master information which is associated with the operating state of DRAM is assumed to be master information associated with the operating state of a bank which occurs alone at the same time.

In the following description, a procedure for determining master information which is associated with the DRAM state is specifically described with reference to FIG. 9 and FIG. 28. The operating state of DRAM, with which master information associated with the operating state of a bank is associated as mentioned above, is, therefore, omitted from description here. Moreover, inoperative states 1043, 1055, 1072, 1074, and 1076 of DRAM illustrated in FIG. 28 each represent a case where only one bank is in an inoperative state and the other banks are in a pause state. With respect to these inoperative states of DRAM, the DRAM state classification unit 2107 performs association of master information associated with the inoperative state of a bank. For example, since the inoperative state 1076 of DRAM is caused by the inoperative state 1016 of the bank number 0, the DRAM state classification unit 2107 associates master information=1 associated with an inoperative state of the bank number 0 with the inoperative state 1076. In the third exemplary embodiment, as illustrated in FIG. 28, there are three portions in which two or more banks are in an inoperative state. Such three portions are inoperative states 1042, 1048, and 1052 of DRAM. In the third exemplary embodiment, as mentioned above, with respect to master information associated with DRAM in a case where two or more banks are in an inoperative state, master information associated with a bank with a larger bank number is prioritized. With respect to the inoperative state 1042 of DRAM, master information=NO associated with the inoperative state of the bank number 1 is associated, and, with respect to the inoperative state 1048 of DRAM, master information=0 associated with the inoperative state of the bank number 1 is associated. With respect to the inoperative state 1052 of DRAM, master information=3 associated with the inoperative state of the bank number 1 is associated. Referring to the steps illustrated in FIG. 9, association of master information with an operating state of DRAM is performed concurrently with step 904, and association of master information with an inoperative state of DRAM is performed concurrently with step 906. In the third exemplary embodiment, FIG. 28 illustrates results 2833 to 2865 obtained by appending pieces of master information to the respective DRAM states in the above-mentioned conditions.

In the third exemplary embodiment, an example in which master information associated with the DRAM state in a case where two or more banks are in an inoperative state is master information associated with a bank with a larger bank number has been described. However, similar to the procedure of analyzing an inoperative state of DRAM based on the priority order of detailed inoperative states as in the second exemplary embodiment, master information associated with a high-priority inoperative state can be associated with an inoperative state of DRAM. Moreover, since it is possible to easily implement associating master information with an inoperative state of DRAM based on a previously determined rule, the rule for associating master information with an inoperative state of DRAM is not limited to only the above-mentioned rule.

Next, the statistical processing 2109 in the third exemplary embodiment is described. A difference from the first exemplary embodiment is that, in the third exemplary embodiment, statistical processing for each master is added. While the statistical processing 107 in the first exemplary embodiment uses the flow illustrated in FIG. 17, the statistical processing for each master in the third exemplary embodiment is also able to similarly use the flow illustrated in FIG. 17. In the following description, two patterns of the statistical processing 2109 for each master using the flow illustrated in FIG. 17 are described.

The first pattern is a method of performing the flow processing illustrated in FIG. 17 a number of times equal to the number of masters. In this case, in step 1701, the statistical processing 107 not only inputs a unit time but also designates master information. Next, in step 1702 for state information reading, the statistical processing 107 reads only a state associated with the designated master information. Performing this processing on all of the masters allows performing statistical processing for each master.

The second pattern is a method of performing the flow processing illustrated in FIG. 17 only once. While, in step 1705, the statistical processing 2109 increments the number of occurrences of the applicable state and the number of clock cycles thereof, in this method, the statistical processing 2109 increments the number of occurrences and the number of clock cycles for each of the masters in step 1705. Although, since it is necessary to retain the numbers of occurrences and the number of clock cycles corresponding to the number of masters, a region which stores data increases as compared with the first method, it is possible to perform statistical processing for each master by performing the flow processing only once.

Figure 32:
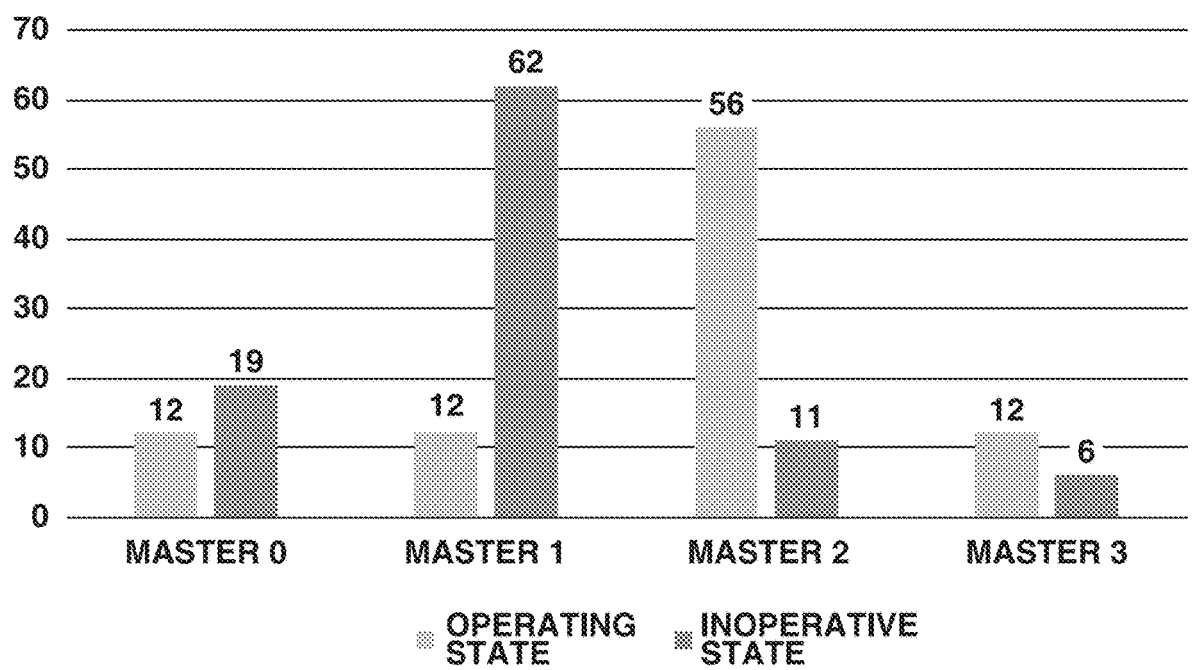
FIG. 32 is a diagram illustrating an example of display in a bar graph form (number of cycles) which is provided by the display unit in the third exemplary embodiment.

Next, display examples which are provided by the display unit 2110 in the third exemplary embodiment are described with reference to FIG. 30 to FIG. 32. FIG. 30 to FIG. 32 illustrate specific display examples of DRAM states associated with respective pieces of master information illustrated in FIG. 28.

A table illustrated in FIG. 30 represents one of display examples which are provided by the display unit 2110. The table illustrated in FIG. 30 shows the number of occurrences and the number of occurrence cycles of each operating state and each inoperative state of DRAM associated with each master.

Pie charts illustrated in FIG. 31 represent one of pairs of display examples which are provided by the display unit 2110. The pie charts illustrated in FIG. 31 show proportions indicating with which master an operating state and an inoperative state of DRAM are associated.

A bar graph illustrated in FIG. 32 represents one of display examples which are provided by the display unit 2110. The bar graph illustrated in FIG. 32 displays the numbers of cycles of an operating state and an inoperative state of DRAM associated with each master side by side. Arranging the numbers of cycles side by side allows visually checking a transfer efficiency for each master and allows efficiently discriminating a master which becomes a bottleneck for performance.

The above-described method allows associating master information with the bank state and the DRAM state described in the first exemplary embodiment and causing the display unit 2110 to display information obtained by such association.

A fourth exemplary embodiment is described with reference to FIG. 2, FIG. 4, FIG. 21, and FIG. 33. The fourth exemplary embodiment differs from the third exemplary embodiment in that the association unit 2103 for association of master information is included in the detection unit 101. More specifically, the system LS 200 is configured in such a way as to allow master information associated with an event to be discriminated based on a signal which the monitor 211 monitors.

Figure 33:
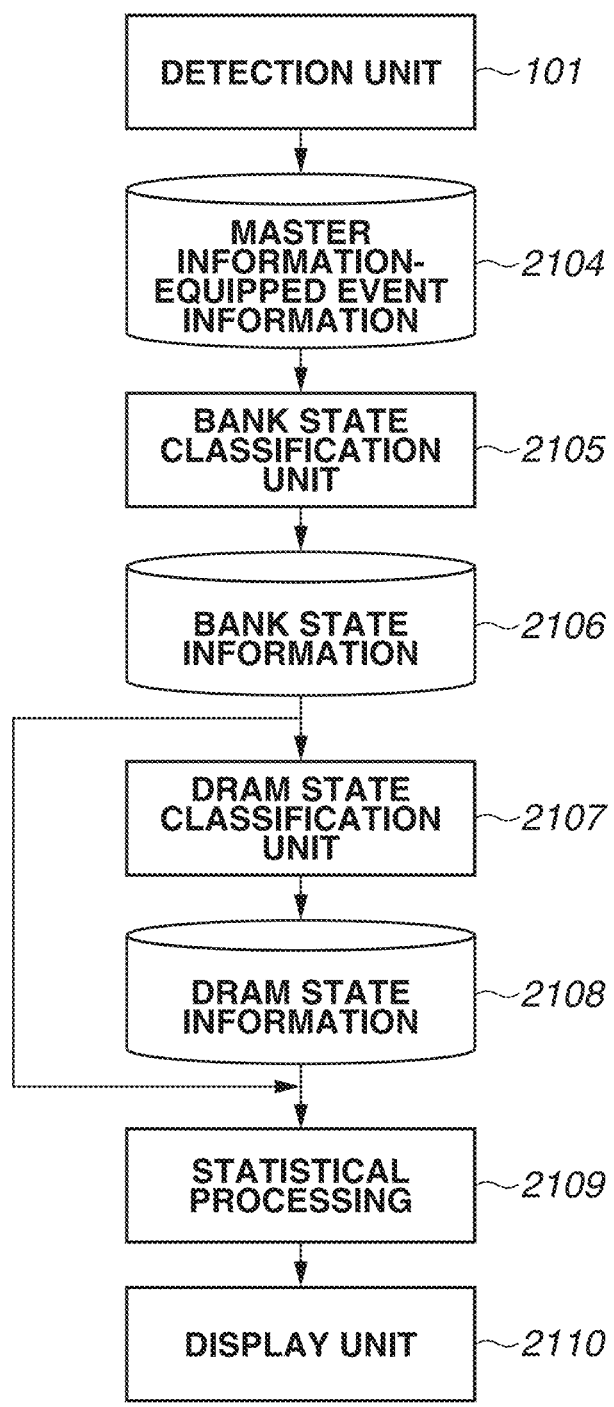
FIG. 33 is a processing concept diagram illustrating the whole of performance analysis processing and analysis result display processing according to a fourth exemplary embodiment.

From here, performance analysis processing and analysis result display processing in the fourth exemplary embodiment are described. FIG. 33 is a processing concept diagram illustrating the whole of performance analysis processing and analysis result display processing. Here, only a difference from the third exemplary embodiment is described. The difference from the third exemplary embodiment is that only the detection unit 101 is used to output the master information-equipped event information 2104 without use of the master event detection unit 2101 and the association unit 2103. A test bench configuration in the fourth exemplary embodiment is the same as that illustrated in FIG. 2 used in the first exemplary embodiment. However, the monitor 211 detects an event associated with master information. To associate maser information with an event, the monitor 211 not only monitors a hardware signal required for detecting an event but also monitors master information associated with such an event.

Prior to specifically describing a signal which is to be monitored, a mechanism in which the bus 208 illustrated in FIG. 2 returns a response to a master is described. In the description of the third exemplary embodiment, a configuration in which, to determine which slave a master accesses when a data access request is transmitted from the master to the slave, the bus 208 determines a slave serving as an access destination by analyzing a bus address has been described. Moreover, a configuration in which, for example, in the case of the AMBA 4 specification, a control signal between a master and the bus 208 is composed of four channels, i.e., an address channel, a write data channel, a write response channel, and a read data channel, has been described. The write response channel and the read data channel are used to notify a data access requestor of the completion of an access. The bus 208 has the role of communicating an access completion notification issued from a slave to a master serving as a data access requestor. For example, suppose that the CPU 201 issues a data access request A to the bus 208, the bus 208 analyzes the data access request A, and an access destination is found to be the memory controller 205. In this case, the bus 208 issues a data access request to the memory controller 205, and the data access request is referred to a data access request A'. Upon completing a data access to the DRAM 209, the memory controller 205 returns a data access completion notification to the bus 208. This data access completion notification is referred to as a data access completion notification B'. Upon receiving the data access completion notification B', the bus 208 analyzes the data access completion notification B' and then communicates a data access completion notification to the CPU 201. This data access completion notification is referred to as a data access completion notification B. Thus, the bus 208 receives the data access request A from the CPU 201, analyzes the data access request A, and issues the data access request A' to the memory controller 205, and, next, receives the data access completion notification B' from the memory controller 205, analyzes the data access completion notification B', and communicates the data access completion notification B to the CPU 201. This is a flow performed until a data access request issued from a master is completed vis the bus 208. While the bus 208 analyses the data access request A and then issues the data access request A', since the bus 208 is able to determine a data access request from an address channel of which master the data access request A is, the bus 208 is able to append master information to the data access request A'. For example, in the case of the AMBA 4 specification, the bus 208 is able to append master information to a data access request from the bus 208 to a slave by allocating master information to some bits of signal ARID or AWID or some bits of signal ARUSER or AWUSER. Thus, the slave is able to determine a request from which master the received data access request is.

A configuration in which, upon receiving the data access request, the slave analyzes attribute information appended thereto and thus becomes able to identify an access region in the slave has been described above in the third exemplary embodiment. In the memory controller 205, the bank number, the row address, and the column address of the DRAM 209 serve as an access region in the DRAM 209. Upon identifying the access region, the memory controller 205 issues a DRAM control command for use in access. For example, when the bank number=0 indicates a close state, upon identifying a read access to the bank number=0, the row address=0x0100, and the column address=0x0010, the memory controller 205 issues the following two commands. The first command is ACT command which specifies the bank number=0 and the row address=0x0100, and the second command is RD command which specifies the bank number=0 and the column address=0x0010. The memory controller 205 is able to discriminate master information about a requestor of the data access request and is, therefore, able to associate master information with the above-mentioned ACT and RD commands. If, at the timing when the bank number 0 is in an open state and the row address=0x0000 has been designated, a read access to the above-mentioned access region is identified, a page miss occurs, so that commands are issued in the order of PRE command, ACT command, and RD command. In this case, it is possible to also associate master information with PRE command. As explained in the above description, upon receiving a result obtained by analyzing a data access request and the state of DRAM (open or close of each bank), the memory controller 205 issues PRE and ACT commands. Thus, the memory controller 205 is able to identify based on which data access request the PRE and ACT commands have been issued, and is, therefore, able to associate information indicating from which master the commands have been issued with the commands. However, in some cases, master information is not necessarily associated with PRE command. For example, with respect to a command which is not able to be executed unless all of the banks are in a close state, such as REF command, the memory controller 205 issues PRE command, which closes a bank, before REF command. Since REF command is issued independently of a data access request, it is not necessary to associate master information with PRE command issued before REF command. While the above description is directed to PRE and ACT commands, the memory controller 205 is also able to similarly associate master information with RD and WR commands as in the above-described example. In the fourth exemplary embodiment, as with the third exemplary embodiment, commands other than RD, WR, PRE, and ACT commands are assumed to be issued independently from a data access request, so that the memory controller 205 does not associate master information with such other commands.

In the first to third exemplary embodiments, signals which are monitored by the monitor 211 are defined as DDR3-SDRAM interface signals illustrated in FIG. 4, and, therefore, master information is not able to be detected therefrom by the monitor 211. However, if the system LSI 200 is configured in such a manner that the memory controller 205 transfers master information received from the bus 208 to the PHY 207 and the DRAM 209, master information associated with an event is able to be detected by the monitor 211. Specifically, as described above, the memory controller 205 is configured to append master information when transferring the received master information-equipped data access request to the PHY 207. Additionally, the PHY 207 is similarly configured to append master information when issuing a command to DRAM upon receiving the master information-equipped data access request from the memory controller 205. With the above configuration employed, a signal indicating master information is made to be included in signals which are monitored by the monitor 211, so that a master information-equipped event is able to be output from the monitor 211.

Moreover, while, referring to FIG. 2, the monitor 211 monitors an interface between the PHY 207 and the DRAM 209, event detection can also be performed by monitoring an interface between the memory controller 205 and the PHY 207. Therefore, master information does not necessarily need to be present between the PHY 207 and the DRAM 209, but only needs to be present between the memory controller 205 and the PHY 207.

The bank state classification unit 2105, the DRAM state classification unit 2107, the statistical processing 2109, and the display unit 2110, which operate after the master information-equipped event information 2104 is output, are similar to those in the third exemplary embodiment, and are, therefore, omitted from description here.

The above-described method allows associating master information with the bank state and the DRAM state and causing the display unit 2110 to display information obtained by such association, as with the third exemplary embodiment.

A fifth exemplary embodiment is described with reference to FIG. 9, FIG. 27, FIG. 28, and FIG. 34. The fifth exemplary embodiment is configured to display master information, bank states, and DRAM states, which have been described in the third exemplary embodiment, with waveforms.

As mentioned above, waveform is a shape for time-serially displaying a change in a signal line in a system LSI and its peripheral circuit, and is generally used in developing system LSIs. Waveform is able to be displayed by a waveform display tool (a waveform viewer) which is provided by each of various electronic design automation (EDA) tool vendor companies. There are waveform file formats unique to respective companies to allow high-speed processing with a waveform viewer. For example, Value Change Dump (VCD) file format (defined by the IEEE standard 1364) is described in the American Standard Code for Information Interchange (ASCII) format, and is allowed to be displayed by any waveform viewer. The VCD file format is composed of four sections, i.e., a header section, a variable definition section, an initial value setting section, and a value change section. The header section describes, for example, file creation time and time unit definition. The variable definition section describes a signal and a port targeted for recording waveform changes. The initial value setting section describes initial values of variables defined. The value change section describes at which time which variable changes into what value. Describing these pieces of information according to the VCD file format allows performing displaying with a waveform viewer.

From here, processing for displaying master information, bank states, and DRAM states described in the third exemplary embodiment with waveforms is described. FIG. 28 illustrates pieces of master information associated with states of respective banks and pieces of master information associated with states of DRAM described in the third exemplary embodiment. The pieces of master information associated with states of respective banks illustrated in FIG. 28 are determined by the flow illustrated in FIG. 27. This flow determines at which cycle (time) the bank state and the master information associated therewith change, in the following steps.

Step 709 and step 2702 (operating state)
Step 712 and step 2703 (inoperative state)
Step 715 and step 2704 (inoperative state)
Step 718 and step 723 (pause state)
Step 721 and step 2705 (inoperative state)

Figure 34:
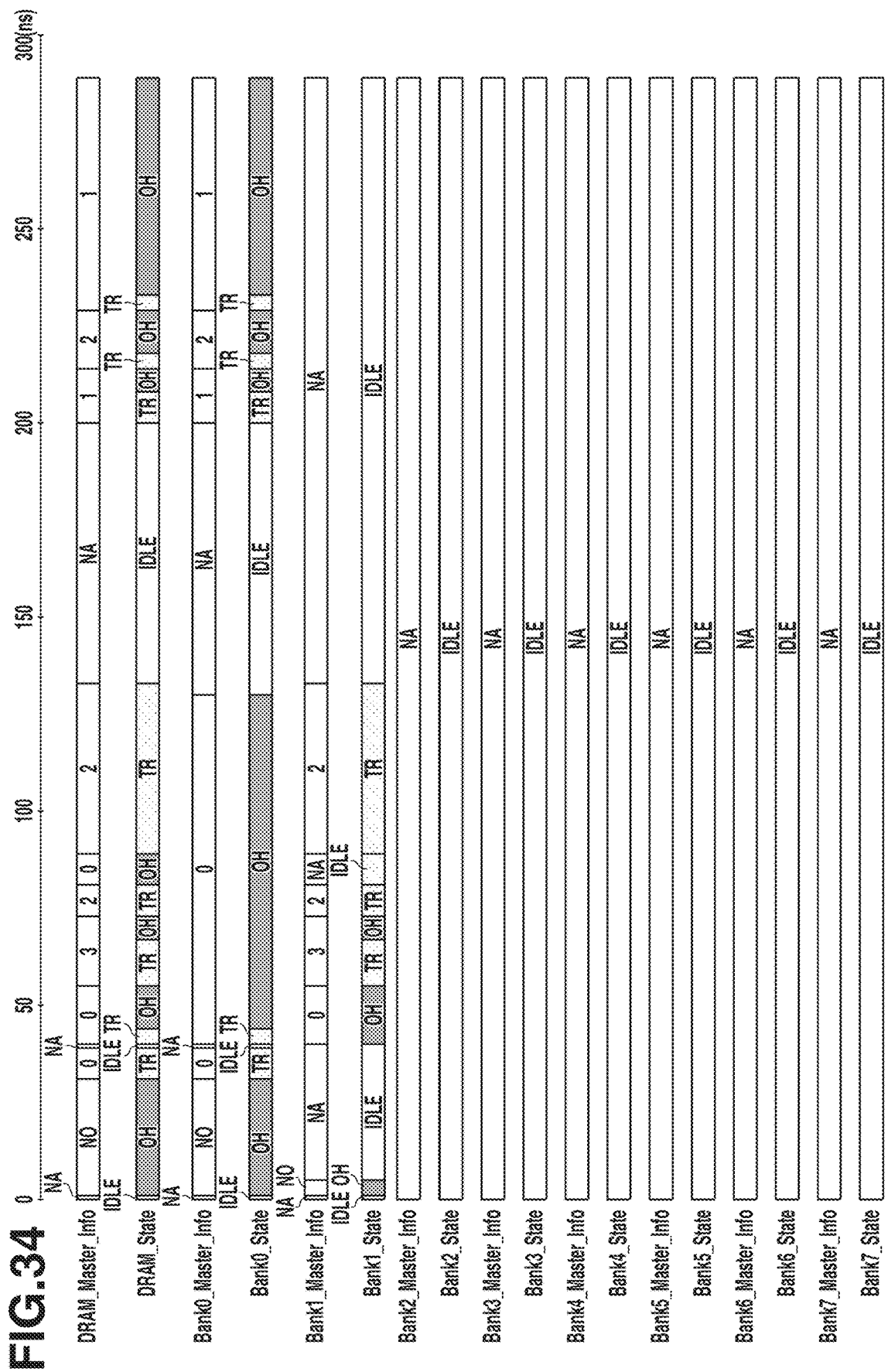
FIG. 34 is a diagram illustrating an example of waveform display about master information, banks states, and DRAM states in a fifth exemplary embodiment.

As mentioned above, the VCD file format requires information about variables to be recorded and about value changes thereof. Using the flow illustrated in FIG. 27 allows recording at which time the bank state and the master information associated therewith targeted for waveform display change into what values. According to a similar concept, step 904 (operating state), step 906 (inoperative state), and step 907 (pause state) in the flow illustrated in FIG. 9 allow recording at which time the DRAM state and the master information associated therewith change into what values. FIG. 34 illustrates an example in which the bank states and the master information associated therewith and the DRAM state and the master information associated therewith, illustrated in FIG. 28, are waveform-displayed by a waveform viewer. DRAM_State indicates a DRAM state, and DRAM_Master_Info indicates master information associated with the DRAM state at the same time. BankX_State (X=an integer of 0 to 7) indicates a state of each bank, and BankX_Master_Info (X=an integer of 0 to 7) indicates master information associated with the state of each bank at the same time. A general waveform viewer is able to convert the value of a variable into a character string and display the character string. In the fifth exemplary embodiment, each of DRAM_State and BankX_State (X=an integer of 0 to 7) is a 2-bit variable and is able to have a value of 0 to 3, in which "0" indicates an operating state, "1" indicates an inoperative state, "2" indicates a pause state, and "3" indicates non-use. The waveform viewer allocates a character string "TR" to "0", a character string "OH" to "1", and a character string "IDLE" to "2", and displays such character strings. Similarly, each of DRAM_Master_Info and BankX_Master_Info (X=an integer of 0 to 7) is a 16-bit variable and is able to have a value of 0 to xFFFF. A value of 0xFFFF indicates the absence of master information to be allocated, a value of 0xFFFE indicates master information in a pause state, and values of 0 to xFFFD indicate respective pieces of master information. In the fifth exemplary embodiment, the waveform viewer allocates a character string "NO" to "0xFFFF" and a character string "NA" to "0xFFFE", and displays such character strings. The waveforms illustrated in FIG. 34 represent results obtained by replacing numerical values by the above-mentioned character strings. Moreover, the waveform viewer is able to allocate colors used for displaying to the character strings or values. In the fifth exemplary embodiment, the waveform viewer allocates green to "TR", orange to "OH", and gray to "IDLE", thus displaying the states of respective banks and DRAM in a visually more understandable manner.

In the fifth exemplary embodiment, an example of generating waveform files has been described with the VCD file format taken as an example. However, even in a waveform file format other than the VCD file format, it is possible to record at which time a variable changes into what value, in conformity with the format, so that the fifth exemplary embodiment is not limited to the VCD file format.

Moreover, while, in the fifth exemplary embodiment, each of the state of each bank and the DRAM state includes three states, i.e., an operating state, an inoperative state, and a pause state, the inoperative state can be classified into more detailed inoperative states as described in the second exemplary embodiment and the respective detailed inoperative states can be displayed with waveforms.

The above-described method allows displaying master information, a bank state, and a DRAM state with waveforms.

A sixth exemplary embodiment is described with reference to FIG. 1, FIG. 2, FIG. 3, FIG. 6, FIG. 8, FIG. 35, FIG. 36, FIGS. 37A, 37B, 37C, 37D, 37E, 37F, and 37G, and FIG. 38.

In the first exemplary embodiment, after completion of processing performed by the detection unit 101, the bank state classification unit 103 performs processing, and, after completion of processing performed by the bank state classification unit 103, the DRAM state classification unit 105 performs processing. Additionally, after completion of processing performed by the DRAM state classification unit 105, the statistical processing 107 performs processing. On the other hand, in the sixth exemplary embodiment, the detection unit 101, the bank state classification unit 103, the DRAM state classification unit 105, and the statistical processing 107 perform respective processing operations in parallel, thus attaining high-speed processing to reduce a time required for these processing operations.

The sixth exemplary embodiment differs from the first exemplary embodiment in a configuration in which the detection unit 101, the bank state classification unit 103, the DRAM state classification unit 105, and the statistical processing 107, which are illustrated in FIG. 1, perform processing operations. Specifically, in the first exemplary embodiment, the processing operations are processed as software by the CPU 301 illustrated in FIG. 3. In the sixth exemplary embodiment, the monitor 211 illustrated in FIG. 2 contains, in addition to the function of the detection unit 101, which monitors commands, the functions of the bank state classification unit 103, the DRAM state classification unit 105, and the statistical processing 107. As a result, a series of analytical processing operations for DRAM state from the detection unit 101 to the statistical processing 107 is performed on simulation software as functions included in the monitor 211. Here, the monitor 211 is implemented with a hardware description language typified by Verilog, which is standardized as IEEE 1364. Accordingly, the monitor 211, i.e., a series of analytical processing operations for DRAM state from the detection unit 101 to the statistical processing 107, performs processing in synchronization with rising of a clock signal, which periodically occurs, similar to another circuit module included in the system LSI 200.

Moreover, the sixth exemplary embodiment differs from the first exemplary embodiment in a method of transferring an event information entry from the detection unit 101 to the bank state classification unit 103 and in the timing of processing performed by the bank state classification unit 103. More specifically, in the first exemplary embodiment, after the detection unit 101 outputs the event information 102 for all of the periods, the bank state classification unit 103 starts performing processing. On the other hand, in the sixth exemplary embodiment, the detection unit 101 and the bank state classification unit 103 perform processing operations in parallel. Specifically, each time the detection unit 101 outputs the event information 102, the bank state classification unit 103 reads the output event information 102 and performs bank state classification processing.

Moreover, the sixth exemplary embodiment differs from the first exemplary embodiment in a method of transferring a bank state information entry from the bank state classification unit 103 to the DRAM state classification unit 105 and in the timing of processing performed by the DRAM state classification unit 105. More specifically, in the first exemplary embodiment, after the bank state classification unit 103 outputs the bank state information 104 for the entire period, the DRAM state classification unit 105 starts performing processing. On the other hand, in the sixth exemplary embodiment, the bank state classification unit 103 and the DRAM state classification unit 105 perform processing operations in parallel. Specifically, each time the bank state classification unit 103 outputs the bank state information 104, the DRAM state classification unit 105 reads the output bank state information 104 and performs DRAM state classification processing. Here, there is a thing to be noted. This thing is that the first exemplary embodiment is not configured such that the bank state classification processing for each bank is able to determine the bank state at the same processing time. When performing classification into an operating state, at timing when RD and WR commands have been generated, the bank state classification unit 103 in the first exemplary embodiment classifies a state for four cycles subsequent to that timing. In other words, when the timing of generation of RD and WR commands is regarded as the point of origin, the bank state classification unit 103 classifies cycles subsequent to that timing into an operating state. On the other hand, when performing classification into an inoperative state or pause state, the bank state classification unit 103 compares a generation interval between two commands with constraints illustrated in FIG. 8, and, at timing when a subsequent command among the two commands has been generated, classifies a state for cycles previous to that timing. In other words, when the timing of generation of a subsequent command among the two commands is regarded as the point of origin, the bank state classification unit 103 classifies cycles previous to that timing into an inoperative state or pause state. In this way, since a bank state in a past period previous to the time when processing is actually being performed is determined at timing when a command has been generated with respect to the applicable bank, the timing when the bank state is determined differs for each bank. As a result, for the DRAM state classification unit 105 to perform processing in parallel with use of the bank state classification unit 103 in the first exemplary embodiment, the bank state information 104 has to be kept accumulated until the bank states for all of the banks are determined. If a command has not been generated at least once with respect to a predetermined bank, such a situation occurs that the bank state information for all of the banks is not determined for at least one cycle until the event information 102 for the entire period is processed, so that the bank state information 104 for the entire period has to be accumulated. As a result, parallel processing to be performed by the bank state classification unit 103 and the DRAM state classification unit 105 is not able to be implemented. Therefore, the bank state classification unit 103 in the sixth exemplary embodiment employs a different processing method. In the following description, the bank state classification unit 103 in the sixth exemplary embodiment is described.

Figure 35:
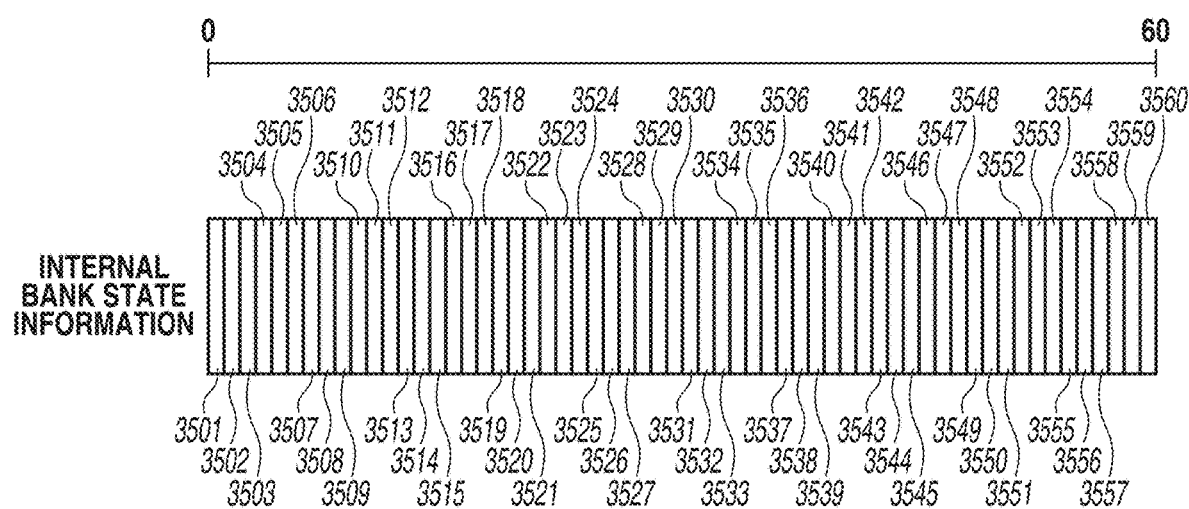
FIG. 35 is a configuration diagram of internal bank state information retained by the bank state classification unit in a sixth exemplary embodiment.

As mentioned above, when performing classification into an inoperative state or pause state, the bank state classification unit 103 in the first exemplary embodiment compares a generation interval between two commands with constraints illustrated in FIG. 8, and, at timing when a subsequent command among the two commands has been generated, classifies a state for cycles previous to that timing. Here, into which of the inoperative state and the pause state to classify the bank state is determined by the constraints illustrated in FIG. 8. For example, in a case where a preceding command is ACT command and a subsequent command is RD command in the same bank, if the command interval is 30 cycles, the bank state classification unit 103 classifies the command interval as an inoperative state, and, if the command interval is 31 cycles or more, the bank state classification unit 103 classifies the command interval as a pause state. This means that the bank state classification unit 103 performs classification of the bank state at timing when a subsequent RD command has been generated. Similarly, in a case where a preceding command is ACT command and a subsequent command is WR command in the same bank, the bank state classification unit 103 also performs classification of the bank state at timing when a subsequent WR command has been generated. Here, referring to the table illustrated in FIG. 8, it can be seen that, in a case where a preceding command is ACT command, there are no constraints caused by commands other than RD and WR commands in the same bank. In other words, this means that, in a case where a preceding command is ACT command and neither RD command nor WR command is generated after 30 cycles in the same bank, the bank is able to be classified as a pause state. Thus, this means that, at timing when, after a preceding command is generated, among constraint cycles of a subsequent command candidate group present in the row of a target command illustrated in FIG. 8, a period of cycles having the largest value has elapsed, the bank state classification unit 103 is able to classify the bank as one of an inoperative state and a pause state. Additionally, this means that, at timing when, among constraint cycles in the table illustrated in FIG. 8, a period of cycles having the largest value has elapsed, whichever command the preceding command is, the bank state classification unit 103 is able to classify the bank as one of an inoperative state and a pause state. Since the largest value among constraint cycles in the table illustrated in FIG. 8 is 60 cycles, in the sixth exemplary embodiment, when a period of 60 cycles has elapsed after any command is generated, the bank state classification unit 103 is able to classify the bank as one of an operating state, an inoperative state, and a pause state. The bank state classification unit 103 in the sixth exemplary embodiment determines a bank state using the above-described method. Specifically, at timing when a period of 60 cycles, which is the largest period of cycles among constraint cycles in the table illustrated in FIG. 8, has elapsed, the bank state classification unit 103 determines the bank state at the first cycle in all of the banks. As a result, 60 cycles after the bank state classification unit 103 starts performing processing, the bank state classification unit 103 becomes able to output bank state information for one cycle each time processing for one clock pulse is performed. However, since the bank state information to be output is information for one cycle obtained 60 cycles before, the DRAM state classification unit 105 performs parallel processing in the state of delaying 60 cycles. Accordingly, the bank state classification unit 103 needs to retain bank state information for 60 cycles therein. FIG. 35 is a configuration diagram of internal bank state information which the bank state classification unit 103 retains. In FIG. 35, information 3501 is bank state information for a period from one cycle before to the current time. Information 3502 is bank state information for a period of one cycle from two cycles before, and, similarly, pieces of information 3503 to 3560 are pieces of bank state information each for a period of one cycle from 3 cycles to 60 cycles before. Each of pieces of bank state information 3501 to 3560 is set, as a state thereof, to one of an operating state, an inoperative state, and a pause state. However, before a period of 60 cycles elapses, since the state may not be determined, such bank state information is set to one of four states including an undetermined state indicating that the state is not yet determined. States about pieces of bank state information 3501 to 3560 are updated for each one cycle by the bank state classification unit 103 in the sixth exemplary embodiment as described below. Accordingly, the state about bank state information 3560 for a period of one cycle from 60 cycles before is determined to be one of an operating state, an inoperative state, and a pause state, and is then output as the bank state information 104 to the DRAM state classification unit 105. After that, at the same time that one cycle has elapsed, information 3501 moves to information 3502. Similarly, pieces of information 3502 to 3559 move to pieces of information 3503 to 3560. As a result, the bank state information for a period of one cycle from 60 cycles before, which has been output to the DRAM state classification unit 105 and has thus become unnecessary, is deleted, and the other pieces of bank state information are shifted for each one cycle. Bank state information which is retained in the bank state classification unit 103 is controlled in the above-mentioned way.

Figures 36, 36A:
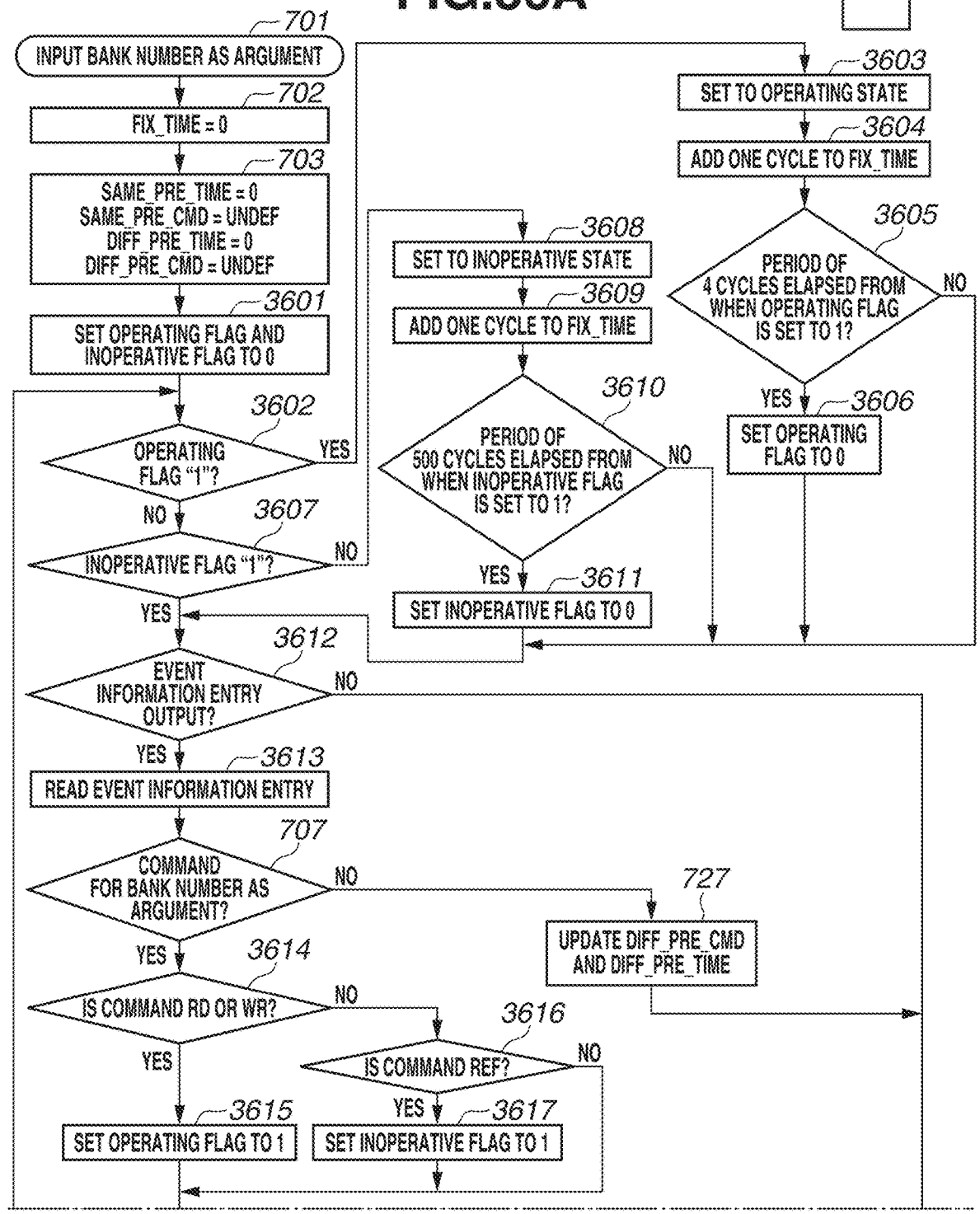
FIG. 36, which is composed of FIGS. 36A and 36B, is a flowchart illustrating processing which is performed by the bank state classification unit in the sixth exemplary embodiment.
Figure 36B:
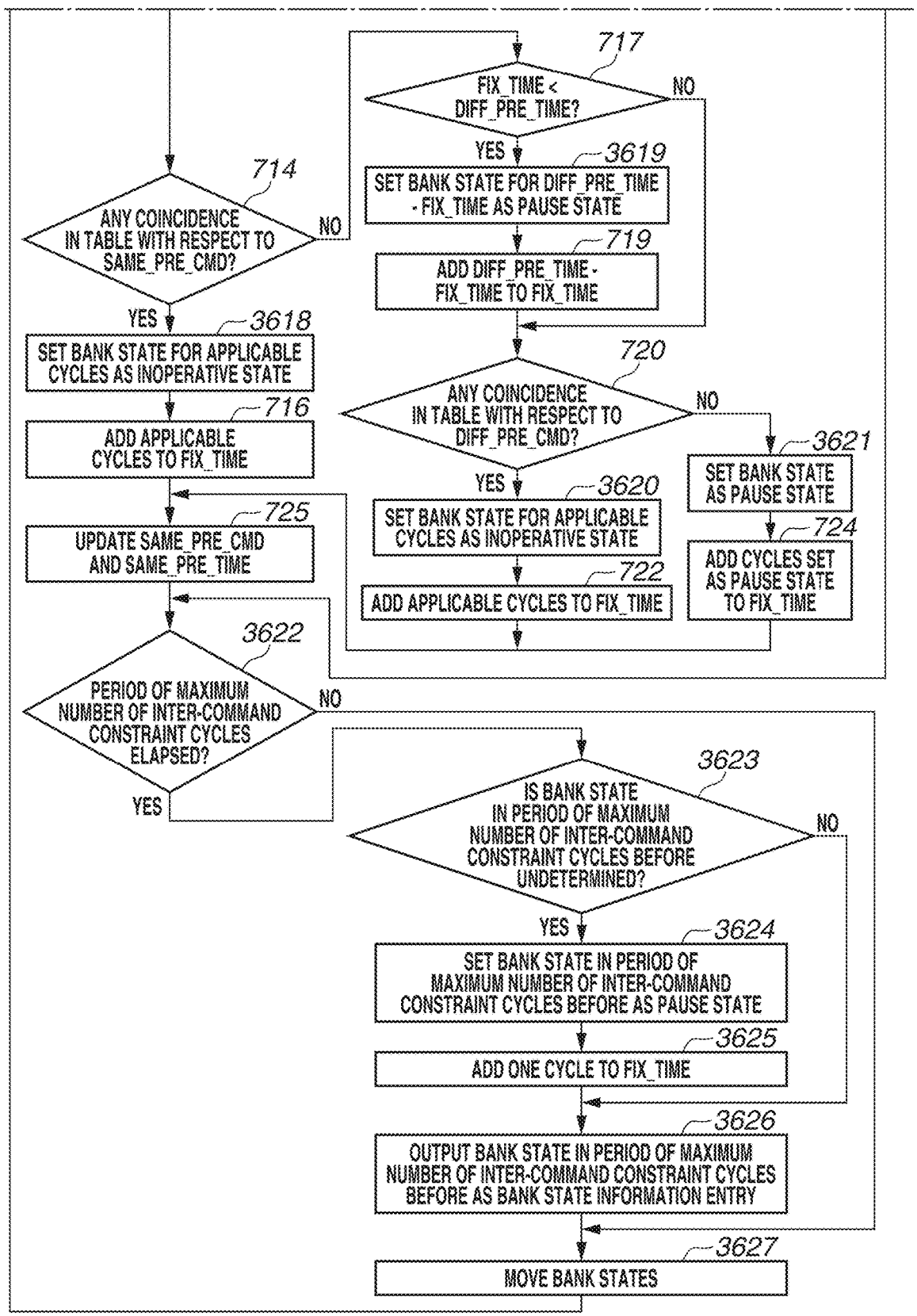

From here, the bank state classification unit 103 in the sixth exemplary embodiment is described with reference to FIG. 6, FIG. 36, and FIGS. 37A to 37G. The flowchart of FIG. 36, which is composed of FIGS. 36A and 36B, illustrates processing which is performed by the bank state classification unit 103 in the sixth exemplary embodiment, and is thus different from the flowchart of FIG. 7 described in the first exemplary embodiment. However, the same step numbers represent the respective same processing operations. In the sixth exemplary embodiment, the description of portions similar to those in the flowchart of FIG. 7 is omitted. First, in step 3601, the bank state classification unit 103 sets an operating flag and an inoperative flag to 0. The operating flag and the inoperative flag are described. The operating flag indicates a period in which the bank state is set as an operating state. Specifically, when receiving RD and WR commands, the bank state classification unit 103 sets the operating flag to 1. In a period in which the bank state is set as an operating state, the bank state classification unit 103 sets the operating flag to 1, and, in a period in which the bank state is not set as an operating state, the bank state classification unit 103 sets the operating flag to 0. The inoperative flag indicates a period in which the bank state is set as an inoperative state by REF command. In a period in which the bank state is set as an inoperative state, the bank state classification unit 103 sets the inoperative flag to 1, and, in a period in which the bank state is not set as an inoperative state, the bank state classification unit 103 sets the inoperative flag to 0. In step 3602, the bank state classification unit 103 determines whether the operating flag is currently set to 1. If it is determined that the operating flag is currently set to 1 (YES in 3602), the bank state classification unit 103 advances the processing to step 3603, and, if it is determined that the operating flag is not currently set to 1 (NO in 3602), the bank state classification unit 103 advances the processing to step 3607. In step 3603, the bank state classification unit 103 sets the internal bank state information in a period from one cycle before to the current time as an operating state, and, in step 3604, the bank state classification unit 103 adds a period of one clock cycle to FIX_TIME. In step 3605, the bank state classification unit 103 determines whether a period of four cycles has elapsed from when the operating flag is set to 1. If it is determined that a period of four cycles has elapsed (YES in step 3605), the bank state classification unit 103 determines that the operating state has ended and advances the processing to step 3606. If it is determined that a period of four cycles has not yet elapsed (NO in step 3605), the bank state classification unit 103 advances the processing to step 3612. In step 3606, the bank state classification unit 103 sets the operating flag to 0. Using the processing operations in steps 3602 to 3606, even when retaining only past bank state information, the bank state classification unit 103 is able to determine bank information obtained after an event information entry is received. In step 3607, the bank state classification unit 103 determines whether the inoperative flag is currently set to 1. If it is determined that the inoperative flag is currently set to 1 (YES in 3607), the bank state classification unit 103 advances the processing to step 3608, and, if it is determined that the inoperative flag is not currently set to 1 (NO in 3607), the bank state classification unit 103 advances the processing to step 3612. In step 3608, the bank state classification unit 103 sets the internal bank state information in a period from one cycle before to the current time as an inoperative state, and, in step 3609, the bank state classification unit 103 adds a period of one clock cycle to FIX_TIME. In step 3610, the bank state classification unit 103 determines whether a period of 500 cycles has elapsed from when the inoperative flag is set to 1. If it is determined that a period of 500 cycles has elapsed (YES in step 3610), the bank state classification unit 103 determines that the inoperative state caused by REF command has ended and advances the processing to step 3611. If it is determined that a period of 500 cycles has not yet elapsed (NO in step 3610), the bank state classification unit 103 advances the processing to step 3612. In step 3611, the bank state classification unit 103 sets the inoperative flag to 0. Using the processing operations in steps 3607 to 3611, even when retaining only past bank state information, the bank state classification unit 103 is able to determine bank information obtained after an event information entry is received. In step 3612, the bank state classification unit 103 determines whether the detection unit 101 has output the event information 102. If it is determined that the detection unit 101 has output the event information 102 (YES in step 3612), the bank state classification unit 103 advances the processing to step 3613, and, if the detection unit 101 has not output the event information 102 (NO in step 3612), the bank state classification unit 103 advances the processing to step 3622. Next, in step 3613, the bank state classification unit 103 reads the event information 102 detected in step 3612. Next, in step 707, the bank state classification unit 103 determines whether a bank address 603 of the read event information entry coincides with the bank number serving as an argument. If it is determined that a bank address 603 of the read event information entry does not coincide with the bank number serving as an argument (NO in step 707), the state transition of the target bank does not occur in the current event information entry. Therefore, in step 727, the bank state classification unit 103 updates DIFF_PRE_CMD and DIFF_PRE_TIME based on the command 602 and the occurrence time 601 of the current event information entry. In other words, the bank state classification unit 103 sets the command 602 of the current event information entry to DIFF_PRE_CMD and sets the occurrence time 601 of the current event information entry to DIFF_PRE_TIME. On the other hand, if it is determined that a bank address 603 of the read event information entry coincides with the bank number serving as an argument (YES in step 707), the bank state classification unit 103 advances the processing to step 3614. In step 3614, the bank state classification unit 103 determines whether the command is RD or WR command. If it is determined that the command is RD or WR command (YES in step 3614), the bank state classification unit 103 advances the processing to step 3615. If it is determined that the command is neither RD nor WR command (NO in step 3614), the bank state classification unit 103 advances the processing to step 3616. In step 3615, the bank state classification unit 103 sets the operating flag to 1. In step 3616, the bank state classification unit 103 determines whether the command is REF command. If it is determined that the command is REF command (YES in step 3616), the bank state classification unit 103 advances the processing to step 3617, and, if it is determined that the command is not REF command (NO in step 3616), the bank state classification unit 103 advances the processing to step 714. In step 3617, the bank state classification unit 103 sets the inoperative flag to 1. In step 714, the bank state classification unit 103 determines, using a just previous command with respect to a target bank, i.e., SAME_PRE_CMD, and the command 602 of the read event information entry, whether there is a coincidence with cycles set for the matching conditions in the table illustrated in FIG. 8. If the result of the determination is YES (YES in step 714), then in step 3618, the bank state classification unit 103 sets the bank state in a period of cycles from FIX_TIME in the internal bank state information to the current time as an inoperative state. Next, in step 716, the bank state classification unit 103 adds a difference between FIX_TIME and the occurrence time 601 of the current event information entry to FIX_TIME, thus updating time at which the state has been fixed. On the other hand, if, in step 714, no constraint is set in the table illustrated in FIG. 8 or the set constraint and a period from SAME_PRE_TIME to the occurrence time 601 of the current event information entry do not coincide with each other (NO in step 714), the bank state classification unit 103 advances the processing to step 717. In step 717 and subsequent steps, in the same manner in which, in step 714 to step 716, the bank state classification unit 103 has checked a constraint from a just previous command with respect to a target bank, the bank state classification unit 103 checks a constraint from a just previous command with respect to other than a target bank. Before checking a constraint, the bank state classification unit 103 checks whether the occurrence time of a just previous command with respect to other than a target bank, i.e., DIFF_PRE_TIME, is later than FIX_TIME. If the result of determination in step 717 is YES, then in step 3619, the bank state classification unit 103 sets the bank state in the internal bank state information in a period from FIX_TIME to DIFF_PRE_TIME as a pause state. Furthermore, if, in step 717, the state of FIX_TIME<DIFF_PRE_TIME is not obtained and after processing in step 719 is performed, the bank state classification unit 103 advances the processing to step 720. In step 720, the bank state classification unit 103 determines, using a just previous command with respect to other than a target bank, i.e., DIFF_PRE_CMD, and the command 602 of the current event information entry, whether there is a coincidence with cycles set for the matching conditions in the table illustrated in FIG. 8. If the result of the determination is YES (YES in step 720), then in step 3620, the bank state classification unit 103 sets the bank state in a period of cycles from FIX_TIME in the internal bank state information to the current time as an inoperative state. Then, in step 722, the bank state classification unit 103 adds a difference between FIX_TIME and the occurrence time 601 of the current event information entry to FIX_TIME, thus updating time at which the state has been fixed. If the result of the determination is NO (NO in step 720), then in step 3621, the bank state classification unit 103 sets the bank state in a period of cycles from FIX_TIME to the current time as a pause state. Then, in step 724, the bank state classification unit 103 adds a difference between FIX_TIME and the occurrence time 601 of the current event information entry to FIX_TIME, thus updating time at which the state has been fixed. As a result, the state of FIX_TIME=occurrence time 601 of the current event information entry is obtained. In step 3622, the bank state classification unit 103 determines whether a period of the maximum number of inter-command constraint cycles, i.e., a period of 60 cycles, has elapsed from when the bank state classification unit 103 starts performing processing. If it is determined that a period of the maximum number of inter-command constraint cycles has elapsed (YES in step 3622), since this means that, as mentioned above, the bank state classification unit 103 is able to output bank state information delayed for 60 cycles, the bank state classification unit 103 advances the processing to step 3623. If it is determined that a period of the maximum number of inter-command constraint cycles has not elapsed (NO in step 3622), since this means that the bank state classification unit 103 is not able to output bank state information, the bank state classification unit 103 advances the processing to step 3627. In step 3623, the bank state classification unit 103 determines whether the bank state in a period of one cycle before 60 cycles is not yet determined. If it is determined that the bank state is not yet determined (YES in step 3623), the bank state classification unit 103 advances the processing to step 3624. If it is determined that the bank state is already determined (NO in step 3623), the bank state classification unit 103 advances the processing to step 3626. In step 3624, the bank state classification unit 103 sets the bank state in a period of 60 cycles before as a pause state, and, in step 3625, the bank state classification unit 103 adds a period of one clock cycle to FIX_TIME. In step 3626, the bank state classification unit 103 outputs the bank state in a period of one cycle before 60 cycles as a bank state information entry to the DRAM state classification unit 105. In step 3627, as mentioned above, the bank state classification unit 103 moves pieces of bank state information in the respective cycles of the internal bank state information on a cycle-by-cycle basis. Processing in steps 3602 to 3627 is performed for each one cycle and is thus completed within one cycle.

FIGS. 37A to 37G are diagrams illustrating states obtained before the bank state classification unit 103 performs processing in step 3627 on the internal bank state information. FIGS. 37A, 37B, 37C, 37D, 37E, 37F, and 37G illustrate states obtained at points of time of 1000 ps, 2000 ps, 30000 ps, 31000 ps, 60000 ps, 61000 ps, and 190000 ps, respectively. In FIGS. 37A to 37G, information 3701 is bank state information in a period from one cycle before to the current time. Information 3702 is bank state information in a period of one cycle from two cycles before, and, similarly, pieces of information 3703 to 3760 are pieces of bank state information each in a period of one cycle from 3 cycles to 60 cycles before.

In the following description, processing which is performed by the bank state classification unit 103 is described with reference to FIG. 36 and FIGS. 37A to 37G with a case where the event information illustrated in FIG. 6 has been actually input taken as an example. In this example, one clock cycle=1000 ps is premised. In the following description, processing on the event information entries 610 to 638 is described with reference to processing results thereof. First, with respect to the bank 220, i.e., the bank number 0, processing which is performed by the bank state classification unit 103 is specifically described with a case where the event information entries 610 to 638 illustrated in FIG. 6 have been actually input taken as an example.

Processing which is performed after the elapse of one clock cycle from starting of processing, i.e., at a point of time of 1000 ps, is described. Since the operating flag and the inoperative flag are set to 0, the results of determination in step 3602 and step 3607 are NO. The detection unit 101 outputs the event information entry 610. Accordingly, the result of determination in step 3612 is YES. Next, in step 3613, the bank state classification unit 103 reads the event information entry 610. Since the command 602 of the event information entry 610 is ACT command and the bank address 603 thereof is 0, the result of determination in step 707 is YES and the results of determination in step 3614 and step 3616 are NO. Moreover, since SAME_PRE_CMD at this point of time is UNDEF, the result of determination in step 714 is NO. Additionally, since, at this point of time, FIX_TIME=0, DIFF_PRE_TIME=0, and DIFF_PRE_CMD=UNDEF are set, the results of determination in step 717 and step 720 are NO. As a result, in step 3621, the bank state classification unit 103 classifies a period of one cycle from the current time as a pause state, as in information 3701 illustrated in FIG. 37A. Next, in step 724, the bank state classification unit 103 sets FIX_TIME to 1000. After that, the result of determination in step 3622 is NO, and, in step 3627, the bank state classification unit 103 moves the retained bank state information for all of the cycles on a cycle-by-cycle basis. After completion of step 3627, the bank state classification unit 103 ends the processing performed at the present time.

Next, after the elapse of two clock cycles from starting or processing, i.e., at a point of time of 2000 ps, no event information entry is input. Accordingly, the results of determination in step 3602, step 3607, and step 3612 are NO. As a result, the bank state classification unit 103 retains bank state information as illustrated in FIG. 37B. Moreover, the result of determination in step 3622 is NO, and, in step 3627, the bank state classification unit 103 moves the retained bank state information for all of the cycles on a cycle-by-cycle basis. After completion of step 3627, the bank state classification unit 103 ends the processing performed at the present time. Next, even after the elapse of 2 to 30 clock cycles from starting of processing, the bank state classification unit 103 performs similar processing. Furthermore, the bank state information obtained after the elapse of 30 clock cycles from starting or processing, i.e., at a point of time of 30000 ps, is as illustrated in FIG. 37C.

Next, processing which is performed after the elapse of 31 clock cycles from starting of processing, i.e., at a point of time of 31000 ps, is described. Since the operating flag and the inoperative flag are set to 0, the results of determination in step 3602 and step 3607 are NO. The detection unit 101 outputs the event information entry 612. Accordingly, the result of determination in step 3612 is YES. Next, in step 3613, the bank state classification unit 103 reads the event information entry 612. Since the command 602 of the event information entry 612 is RD command and the bank address 603 thereof is 0, the results of determination in step 707 and step 3614 are YES. Next, in step 3615, the bank state classification unit 103 sets the operating flag to 1. Moreover, since, at this point of time, SAME_PRE_CMD=ACT and FIX_TIME=1000 are set, the result of determination in step 714 is YES. As a result, in step 3618, the bank state classification unit 103 classifies a period of 30 cycles from the current time as an inoperative state, as in pieces of information 3701 to 3730 illustrated in FIG. 37D. Next, in step 716, the bank state classification unit 103 sets FIX_TIME to 31000. After that, in step 725, the bank state classification unit 103 sets SAME_PRE_CMD=RD and SAME_PRE_TIME=31000. After that, the result of determination in step 3622 is NO, and, in step 3627, the bank state classification unit 103 moves the retained bank state information for all of the cycles on a cycle-by-cycle basis. After completion of step 3627, the bank state classification unit 103 ends the processing performed at the present time.

Next, even after the elapse of 32 to 59 clock cycles from starting of processing, the bank state classification unit 103 performs processing similar to that described above.

Next, after the elapse of 60 clock cycles from starting or processing, i.e., at a point of time of 60000 ps, the detection unit 101 does not output any event information entry. Accordingly, the results of determination in step 3602, step 3607, and step 3612 are NO. As a result, the bank state classification unit 103 retains bank state information as illustrated in FIG. 37E. Next, the result of determination in step 3622 is YES. Since information 3760 illustrated in FIG. 37E indicates a pause state, the result of determination in step 3623 is NO. Next, in step 3626, the bank state classification unit 103 outputs the information 3760 illustrated in FIG. 37E as a bank state information entry to the DRAM state classification unit 105. In step 3627, the bank state classification unit 103 moves the retained bank state information for all of the cycles on a cycle-by-cycle basis. After completion of step 3627, the bank state classification unit 103 ends the processing performed at the present time.

Figure 37F:
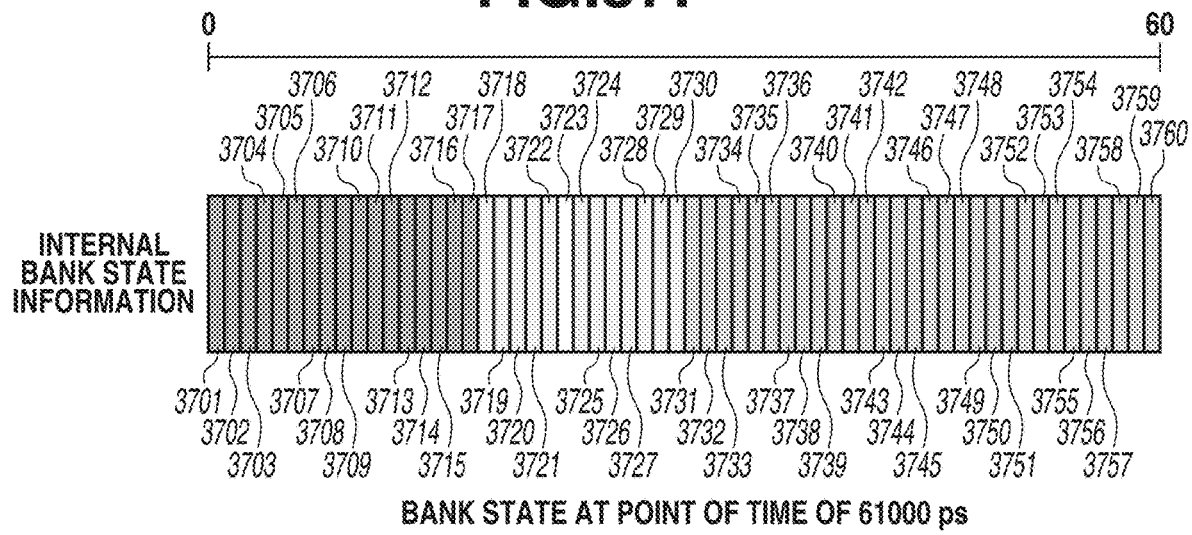
Figure 37G:
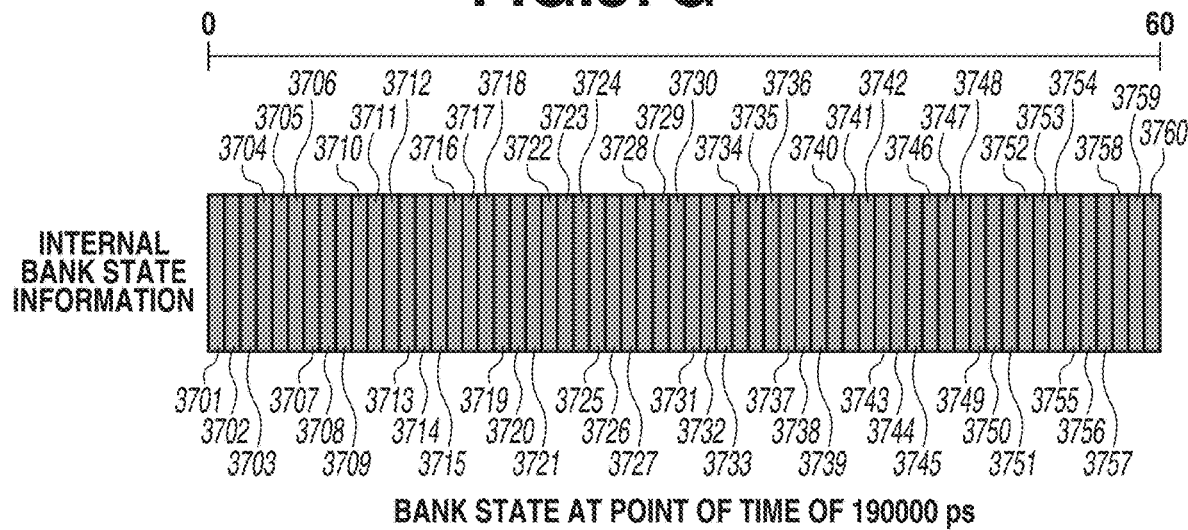

Next, after the elapse of 61 clock cycles from starting or processing, i.e., at a point of time of 61000 ps, the detection unit 101 does not output any event information entry. Accordingly, the results of determination in step 3602, step 3607, and step 3612 are NO. As a result, the bank state classification unit 103 retains bank state information as illustrated in FIG. 37F. Next, the result of determination in step 3622 is YES. Since the bank state in a period of one cycle from 60 cycles before is an inoperative state as in the information 3760 illustrated in FIG. 37F, the result of determination in step 3623 is NO. Next, in step 3626, the bank state classification unit 103 outputs the information 3760 illustrated in FIG. 37F obtained 60 cycles before as a bank state information entry to the DRAM state classification unit 105. In step 3627, the bank state classification unit 103 moves the retained bank state information for all of the cycles on a cycle-by-cycle basis. After completion of step 3627, the bank state classification unit 103 ends the processing performed at the present time.

Next, even after the elapse of 62 to 189 clock cycles from starting of processing, the bank state classification unit 103 performs processing similar to that described above.

Next, after the elapse of 190 clock cycles from starting or processing, i.e., at a point of time of 190000 ps, the detection unit 101 does not output any event information entry. Accordingly, the results of determination in step 3602, step 3607, and step 3612 are NO. Next, the result of determination in step 3622 is YES. Since the bank state in a period of one cycle from 60 cycles before is an undetermined state, the result of determination in step 3623 is YES, and, in step 3624, the bank state classification unit 103 sets the bank state in a period of one cycle from 60 cycles before as a pause state as in information 3760 illustrated in FIG. 37G. Next, in step 3626, the bank state classification unit 103 outputs the bank state information 3760 illustrated in FIG. 37G as a bank state information entry to the DRAM state classification unit 105. In step 3627, the bank state classification unit 103 moves the retained bank state information for all of the cycles on a cycle-by-cycle basis. After completion of step 3627, the bank state classification unit 103 ends the processing performed at the present time.

The bank state classification unit 103 performs subsequent processing operations similar to those described above. Moreover, with respect to the banks 221 to 227, the bank state classification unit 103 also performs processing operations in a way similar to those described above with respect to the bank 220.

This allows the detection unit 101 and the bank state classification unit 103 to perform parallel processing.

Next, the DRAM state classification unit 105 in the sixth exemplary embodiment is described with reference to FIG. 6, FIG. 8, FIG. 10, and FIG. 38. The flowchart of FIG. 38 differs from the flowchart of FIG. 9 used in the first exemplary embodiment in that steps 908, 909, and 910 for checking and reading the presence or absence of bank state transition in the bank state information 104 for all of the banks are deleted, and steps for enabling the bank state classification unit 103 and the DRAM state classification unit 105 to perform parallel processing are added. In the sixth exemplary embodiment, the description of portions similar to those in the flowchart of FIG. 9 is omitted, and only the added steps are described. In step 3801, the DRAM state classification unit 105 determines whether a period of the maximum number of cycles among inter-command constraint cycles in the table illustrated in FIG. 8, i.e., a period of 60 cycles, has elapsed. If it is determined that a period of the maximum number of cycles has not yet elapsed (NO in step 3801), since no bank state information entry is output from the bank state classification unit 103, the DRAM state classification unit 105 does not start performing subsequent processing. After the elapse of 60 cycles (YES in step 3801), then step 3802, the DRAM state classification unit 105 reads a bank state information entry from the bank state classification unit 103 and thus sets the states of the respective banks. After that, in steps 903 to 907, the DRAM state classification unit 105 compares the bank states of all of the banks with each other and thus sets the DRAM state. Since the DRAM state information has been determined for a period of one cycle, in step 3803, the DRAM state classification unit 105 adds a period of one cycle to FIX_TIME. The DRAM state classification unit 105 performs processing operations in steps 903 to 907 and steps 3801 to 3803 for each one clock cycle and completes the processing operations within one clock cycle.

Figure 38:
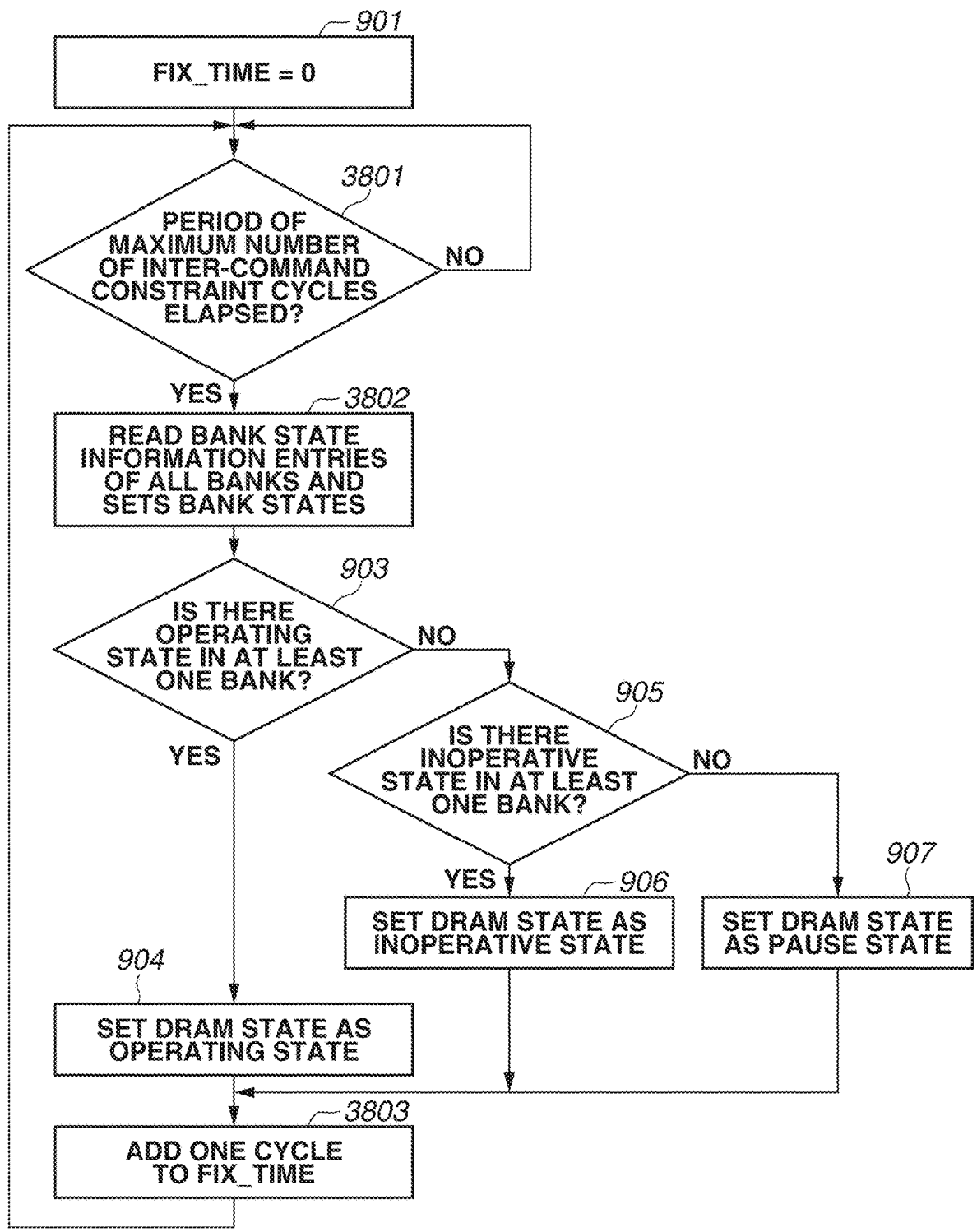
FIG. 38 is a flowchart illustrating processing which is performed by the DRAM state classification unit in the sixth exemplary embodiment.

When processing is performed based on the flowchart of FIG. 38, although the processing is performed on a cycle-by-cycle basis, the DRAM state information 106 similar to that illustrated in FIG. 10 is output.

This allows parallel processing which is performed by the bank state classification unit 103 and the DRAM state classification unit 105 and deletion of processing for the DRAM state classification unit 105 to check and read the presence or absence of bank state transition in the bank state information 104.

The statistical processing 107 performs processing in parallel with the bank state classification unit 103 and the DRAM state classification unit 105. Processing which is performed by the statistical processing 107 is similar to that performed in the first exemplary embodiment and is, therefore, omitted from description here.

As with the first exemplary embodiment, after the bank state classification unit 103, the DRAM state classification unit 105, and the statistical processing 107 complete the respective processing operations, the display unit 108 performs processing. Processing which is performed by the display unit 108 is similar to that performed in the first exemplary embodiment and is, therefore, omitted from description here.

While, in the sixth exemplary embodiment, an example in which, after the bank state classification unit 103, the DRAM state classification unit 105, and the statistical processing 107 complete the respective processing operations, the display unit 108 performs processing has been described, the display unit 108 can perform processing in parallel with those.

While, in the sixth exemplary embodiment, the master information is not associated with the bank state and the DRAM state, such association can be performed by detecting a master information-equipped event as in the third exemplary embodiment and inserting a master associating step into the flowcharts of FIG. 36 and FIG. 38.

The above-described method allows the detection unit 101, the bank state classification unit 103, the DRAM state classification unit 105, and the statistical processing 107 to perform parallel processing, thus attaining high-speed processing to reduce a time required for processing operations which are performed by the detection unit 101 to the statistical processing 107. Moreover, the above-described method allows the DRAM state classification unit 105 to omit bank state information checking processing and reduce a required processing amount.

A seventh exemplary embodiment is described with reference to FIG. 1 to FIG. 3, FIG. 6, FIG. 7, FIG. 9, FIG. 21, FIG. 23, FIG. 24, FIG. 27, and FIG. 39. The seventh exemplary embodiment provides a configuration of determining timing for starting analysis of the DRAM state and timing for ending analysis of the DRAM state in addition to the configurations of the first and third exemplary embodiments. Specifically, the seventh exemplary embodiment is configured to control starting and ending of analysis of the DRAM state by identifying a start factor and an end factor in the performance analysis processing illustrated in FIG. 1.

In the case of performing performance analysis for DRAM in actual digital equipment, it is necessary to perform the performance analysis not only in a micro unit but also in a macro unit. For example, in the case of a digital television set or a digital video camera, as one of examples of analyzing the DRAM state, there is a case of setting the DRAM state for one-frame processing as an analysis object. Even in the case of analyzing processing for one frame, it is necessary to perform simulation with respect to processing operations including processing other than the analysis object, such as pre-processing and post-processing. Here, if an analysis period for the DRAM state is not designated and the entire simulation period is set to an analysis period for the DRAM state, an extra time is required for analysis processing. Additionally, an extra amount of data is also required for the event information 102, the bank state information 104, the DRAM state information 106, and the master event information 2102, which are needed for analysis of the DRAM state, so that the storage capacity of the HDD 306 may be occupied by such an extra amount of data. On the other hand, limiting a period for analyzing the DRAM state to one frame of an analysis object allows not only reducing the analysis time for the DRAM state but also reducing the data amounts of the event information 102, the bank state information 104, the DRAM state information 106, and the master event information 2102, which are needed for such processing.

From here, a method of determining starting and ending of analysis of the DRAM state in the seventh exemplary embodiment is described. As mentioned above, the method controls starting and ending of analysis using a start factor and an end factor. Examples of the method of identifying each factor include at least a method of designating time, a method of performing control using software which is executed by the CPU 201, and a method of detecting a signal variation of a specific circuit included in the test bench 212.

In the case of a method of designating time, there is a method of controlling starting and ending of analysis of the DRAM state by directly designating time in a simulation. Moreover, there is a case in which, when an operating system (OS) is operating in the CPU 201, elapsed clock time is managed based on an interrupt signal which is periodically generated, called a clock tick, within such software. There is also a method of controlling, by software, starting and ending of analysis of the DRAM state using the CPU 201 based on elapsed clock time managed by the OS. Specifically, within software, programming is performed in such a way as to perform a predetermined operation at timing for starting and timing for ending analytical processing for the DRAM state. Starting and ending are controlled by detecting a predetermined operation set within the test bench 212.

In the case of a method of performing control using software which is executed by the CPU 201, the method is implemented in a way similar to that in the case of using elapsed clock time managed by the OS using the CPU 201. However, start timing and end timing are set not by being designated by time but by being interlocked with predetermined processing within control software for the system LSI 200.

In the case of a method of detecting a signal variation of a specific circuit included in the test bench 212, starting and ending of analysis of the DRAM state are controlled by detecting a single signal variation, a combination of a plurality of signal variations, or a result corresponding to a protocol internally used in a circuit. The protocol is a system of rules which are used to perform communication between functional blocks included in a test bench, and, as mentioned above, includes, for example, the protocol of the AMBA 4 specification (AMBA being a registered trademark of ARM Ltd.). From here, an example of a signal variation of a specific circuit is described. For example, a variation of an external input signal to the system LSI 200 can be set as a factor. Moreover, a rising variation of a periodic signal for starting periodic processing inside the system LSI 200 can also be set as a factor. Moreover, a variation of the register value of a specific circuit can also be set as a factor. The register is a storage element which stores data inside the system LSI 200. Moreover, a variation of an interrupt signal which a specific circuit communicates to the CPU 201 can also be set as a factor. Moreover, a change of the protocol which is used inside the system LSI 200 into a predetermined state can also be set as a factor. FIG. 39 is a diagram illustrating signals obtained by adding write data channel signals to some signals in the AMBA 4 specification illustrated in FIG. 22. As with the address channel signals, a case where each of a signal wready 3901 and a signal wvalid 3902 is 1 at rising of the clock signal 2201 means that a write data request has been issued. The factor of starting and ending of analysis of the DRAM state can include each of a combination of two requests, i.e., a write access request and a write data request, having been issued under a specific condition. For example, a case where the address for a write access request (awaddr 2208) is 0x10000000 and the data for a write data request (wdata 3903) is 0x00000001 is set as a start factor, and a case where the address for a write access request is 0x10000000 and the data for a write data request is 0x00000002 is set as an end factor. The above-mentioned predetermined operation performed by the CPU 201 can be efficiently implemented by applying detection of a result corresponding to this protocol. Thus, this method is a method of issuing an access to a desired address at timing of starting and ending of analysis of the DRAM state from the CPU 201.

Factors of starting and ending of analysis of the DRAM state can also be defined by respective different methods. For example, there is a combination of the method of directly designating time being set as a start factor and the method of using the protocol used in the system LSI 200 changing into a predetermined state being set as an end factor. Moreover, each factor can also be defined by a combination of a plurality of conditions. For example, both a condition A and a condition B being satisfied can be defined as each factor. Moreover, either a condition A or a condition B being satisfied can also be set as each factor.

In the description up to this point, the analysis of the DRAM state which is performed with use of simulation is premised. However, it is also possible to cause a circuit having the function of analyzing the DRAM state to be included in the system LSI 200. For example, the detection unit 101 is equivalent to the monitor 211 illustrated in FIG. 2, and the monitor 211 has the function of monitoring a hardware signal to detect a predetermined event. Additionally, as described in the sixth exemplary embodiment, not only mounting a circuit having the function of the detection unit 101 in the monitor 211 but also mounting a circuit having the functions of the bank state classification unit 103 and the DRAM state classification unit 105 in the system LSI 200 allows implementing a system LSI having the function of analyzing the DRAM state. In this case, an electronic apparatus which is equipped with the system LSI 200 and is controlled thereby (for example, a digital television set or a digital video camera) itself is able to analyze the DRAM state. Even in a case where the DRAM state is analyzed by such an electronic apparatus itself, it is possible to similarly control starting and ending of analytical processing for the DRAM state using the above-described method. However, the method of directly designating simulation time is able to be applied to only the case of simulation.

From here, how to apply the above-mentioned start factor and end factor of analysis of the DRAM state to the first exemplary embodiment is described. With respect to the first exemplary embodiment, the start factor and end factor of analysis of the DRAM state are defined by the method of directly designating time, and these factors are used by the detection unit 101. For example, if the start factor is defined as 30000 ps and the end factor is defined as 240000 ps, the event information illustrated in FIG. 6 becomes information starting with the entry 612 and ending with the entry 636. While, here, the method of directly designating time has been described as an example, it is also possible to control the detection unit 101 by detecting a variation of a specific hardware signal as mentioned above. Limiting event information to be detected by the detection unit 101 in the above-described way allows saving resources used for subsequent processing operations (a processing time taken by the CPU 301, the RAM 303, and the HDD 306). While, here, the method of limiting a time range for detection by using a start factor and an end factor with respect to the detection unit 101 has been described, each factor can be used in the bank state classification unit 103 or the DRAM state classification unit 105. In a case where the start and end factors are used with respect to the bank state classification unit 103, FIX_TIME which is designated in step 702 illustrated in FIG. 7 can be set as time obtained at the time of satisfaction of a condition for the start factor and whether FIX_TIME is later than time obtained at the time of satisfaction of a condition for the end factor can be checked immediately before step 726. Moreover, in a case where the start and end factors are used with respect to the DRAM state classification unit 105, FIX_TIME which is designated in step 901 illustrated in FIG. 9 can be set as time obtained at the time of satisfaction of a condition for the start factor and whether FIX_TIME is later than time obtained at the time of satisfaction of a condition for the end factor can be checked immediately after step 909.

From here, how to apply the above-mentioned start factor and end factor to the third exemplary embodiment is described. With respect to the third exemplary embodiment, the start factor and end factor are defined by the method of designating time, and these factors are used by the detection unit 101 and the master event detection unit 2101 illustrated in FIG. 21. For example, if the start factor is defined as 30000 ps and the end factor is defined as 240000 ps similarly to the above-mentioned case, the master event information illustrated in FIG. 24 becomes information starting with the entry 2414 and ending with the entry 2420. While, here, the method of limiting a time range for detection by using a start factor and an end factor with respect to the detection unit 101 and the master event detection unit 2101 illustrated in FIG. 21 has been described, each factor can be used in the association unit 2103, the bank state classification unit 2105, or the DRAM state classification unit 2107. In a case where the start and end factors are used with respect to the association unit 2103, whether the occurrence time is greater than or equal to the start factor and is less than the end factor is determined when the master event information entry is read in step 2302 illustrated in FIG. 23, and, if the occurrence time is outside the range defined by the start factor and the end factor, step 2303 can be skipped. Similarly, whether the time of the event information entry to be read is present within the range is determined in step 2306, and, if the occurrence time is outside the range, steps 2307 to 2317 can be skipped. Moreover, in a case where the start and end factors are used with respect to the bank state classification unit 2105, FIX_TIME which is designated in step 701 illustrated in FIG. 27 can be set as time obtained at the time of satisfaction of a condition for the start factor and whether FIX_TIME becomes greater than or equal to time obtained at the time of satisfaction of a condition for the end factor can be checked immediately before step 714, step 716, and step 720 performed after FIX_TIME is updated.

If a start factor and an end factor of analysis of the DRAM state are used, it may be impossible or at least not possible to determine the DRAM states obtained immediately after the start factor and immediately before the end factor. This is because, as mentioned in the first exemplary embodiment, according to an interval between an earlier detected command and a later detected command, the DRAM state obtained at the time equal to or later than the time of the earlier detected command is determined. In this case, for example, if, with respect to a period targeted for analysis of the DRAM state, predetermined times are added before and after the period as extra analysis target periods, the DRAM state obtained in a desired period can be analyzed. However, this method requires event information 102 or master event information 2102 obtained at the time earlier than the time of the start factor of analysis of the DRAM state. In this case, irrespective of the presence or absence of the start factor, the detection unit 101 or the master event detection unit 2101 can store these pieces of event information, retain pieces of information for the above-mentioned extra analysis target periods, and discard event information falling outside the analysis target range. Moreover, the above-mentioned method also requires event information 102 or master event information 2102 obtained at the time later than the time of the end factor of analysis of the DRAM state. With regard to the event information obtained after the end factor, the event information in a predetermined period after detection of the end factor can be accumulated. If predetermined times are not able to be secured before and after a desired analysis target period, a bank state or DRAM state which is not able to be determined can be regarded as a specially defined state or can be regarded as a pause state.

Moreover, if information about times of a start factor and end factor of analysis of the DRAM state is previous retained, the display unit 108, which operates after the statistical processing 107, is able to designate start time and end time serving as a display target and display only a period to be targeted for analysis.

An eighth exemplary embodiment is described with reference to FIG. 7 and FIG. 8. The eighth exemplary embodiment provides a configuration of detecting an error when a command for controlling the DRAM 209 has been generated in violation of a predetermined constraint in such a manner that the banks 220 to 227 of the DRAM 209 come into an inoperative state, in addition to the configuration of the first exemplary embodiment. Detecting such an error allows readily finding a failure of the memory controller 205 or a setting failure for the memory controller 205.

As mentioned in the description of the first exemplary embodiment, the inoperative state is a state of waiting due to the impossibility of read or write data access to a bank caused by a predetermined constraint. For example, while the predetermined constraint includes a period of 500 clock cycles after issuance of REF command, if ACT command occurs before the elapse of the period of 500 clock cycles, the DDR3-SDRAM standard is violated. Such a case is detected as an error. While the table illustrated in FIG. 8 shows constraints defined between ACT, PRE, RD, and WR commands, there are many other commands and there are also restraints between such commands.

Specifically, the bank state classification unit 103 detects, as an error, a case where the interval in time between two commands targeted for analysis is shorter than the above-explained constraint. While FIG. 7 illustrates the processing flow which is performed by the bank state classification unit 103, there are steps for referring to the table showing constraints between commands illustrated in FIG. 8 before determining an inoperative state in the processing flow. Specifically, such steps are step 714 and step 720. In these steps, the bank state classification unit 103 detects, as an error, a case where the above-mentioned interval in time is smaller than a numerical value in the table showing constraints between commands illustrated in FIG. 8. For example, the bank state classification unit 103 detects, as an error, a case where, when two commands are generated in the same bank and the preceding command is ACT command and the subsequent command is RD command, the interval in time between the two commands is 20 cycles, because the period of 20 cycles is less than "30" in the constraints defined in the table illustrated in FIG. 8.

Processing which is performed after an error is detected includes, for example, a method of displaying error information on the display 307, a method of storing error information in the HDD 306, a method of stopping performance analysis processing for the DRAM state itself, and a method of causing a specific signal variation to occur in the test bench 212. While a plurality of methods for error notification has been described above, the error notification method is not limited to the above-mentioned ones.

OTHER EMBODIMENTS

Embodiment(s) of the present disclosure can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may include one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random access memory (RAM), a read-only memory (ROM), a storage of distributed computing systems, an optical disk (such as a compact disc (CD), digital versatile disc (DVD), or Blu-ray Disc (BD)™), a flash memory device, a memory card, and the like.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2019-083241 filed Apr. 24, 2019, which is hereby incorporated by reference herein in its entirety.

What is claimed is:

1. An information processing apparatus comprising:
a processor and a memory in communication with each other and to perform operations including:
detecting an event which causes a state of at least one bank constituting dynamic random access memory (DRAM) to transition,
classifying, as a first classification, the state of the at least one bank based on the detected event,
classifying, as a second classification, a state of the DRAM based on the state of the at least one bank, and
causing statistical information that is based on the state of the at least one bank or the state of the DRAM to be displayed with respect to a predetermined unit time,
wherein the state of the at least one bank and the state of the DRAM each includes at least one of the following:
an operating state, in which data is being transferred, an inoperative state, in which transfer of data is not possible due to a predetermined constraint, or a pause state, in which, although there is no constraint, data is not being transferred.

2. The information processing apparatus according to claim 1,
wherein, in a case where the at least one bank is in the operating state, the second classification classifies the state of the DRAM as the operating state,
wherein, in a case where no bank included in the at least one bank is in the operating state and the at least one bank is in the inoperative state, the second classification classifies the state of the DRAM as the inoperative state, and
wherein, in a case where each bank included in the at least one bank are in the pause state, the second classification classifies the state of the DRAM as the pause state.

3. The information processing apparatus according to claim 1,
wherein the first classification sets, as the operating state, a period in which a data signal related to a control command occupies, and
wherein the period is from timing at which the control command issued to a predetermined bank included in the at least one bank has been detected.

4. The information processing apparatus according to claim 1,
wherein the first classification sets, as the inoperative state, a period in which a command related to a control command is not able to be issued, and
wherein the period is from timing at which the control command issued to a predetermined bank included in the at least one bank has been detected.

5. The information processing apparatus according to claim 1, wherein, in a case where, with respect to a predetermined bank included in the at least one bank, a preceding first control command and a subsequent second control command are detected, and there is a constraint requiring that only a predetermined period be interposed between the preceding first control command and the subsequent second control command, the first classification sets, as the inoperative state, a period from the preceding first control command to the subsequent second control command.

6. The information processing apparatus according to claim 1, wherein, in a case where, with respect to a predetermined bank included in the at least one bank, (i) three or more control commands are detected, (ii) control commands included in the three or more control commands occur in a previously defined order, and (iii) there is a constraint requiring that only a predetermined period be interposed between all of successive two control commands, the first classification sets, as the inoperative state, a period from a control command first detected to a control command last detected.

7. The information processing apparatus according to claim 1, wherein, in a case where control commands issued to two different predetermined banks included in the at least one bank are detected, and there is a constraint requiring that only a predetermined period be interposed between a preceding first control command and a subsequent second control command, the first classification sets, as the inoperative state, a period from the preceding first control command to the subsequent second control command.

8. The information processing apparatus according to claim 1, wherein, in a case where (i) three or more control commands issued to two or more banks included in the at least one bank are detected, (ii) control commands included in the three or more control commands occur in a previously defined order, and (iii) there is a constraint requiring that only a predetermined period be interposed between all of successive two control commands, the first classification sets, as the inoperative state, a period from a control command first detected to a control command last detected.

9. The information processing apparatus according to claim 1, wherein the statistical information which is caused to be displayed includes numbers of occurrences of the state of the at least one bank and the state of the DRAM.

10. The information processing apparatus according to claim 1, wherein the statistical information which is caused to be displayed includes periods of occurrences or numbers of clock cycles of the state of the at least one bank and the state of the DRAM.

11. The information processing apparatus according to claim 1, wherein causing the statistical information to be displayed includes causing time-series variations of the state of the at least one bank and the state of the DRAM to be displayed with waveforms.

12. The information processing apparatus according to claim 1,
wherein the operations further include performing association,
wherein, in a case where detecting includes detecting an event of a master of a bus, performing association includes associating the event which causes the state of the at least one bank to transition and the event of the master of the bus with each other, and
wherein the first classification classifies the state of the at least one bank based on the association performed.

13. The information processing apparatus according to claim 1,
wherein detecting includes detecting an event of at least one master of a bus, and performing association to associate the event which causes the state of the at least one bank to transition and the event of the master of the bus with each other, and
wherein the first classification classifies the state of the at least one bank based on the association performed.

14. The information processing apparatus according to claim 12, wherein the statistical information which is caused to be displayed includes numbers of occurrences of the state of the at least one bank and the state of the DRAM for at least one master of the bus.

15. The information processing apparatus according to claim 12, wherein the statistical information which is caused to be displayed includes periods of occurrences or numbers of clock cycles of the state of the at least one bank and the state of the DRAM for at least one master of the bus.

16. The information processing apparatus according to claim 12, wherein causing the statistical information to be displayed includes causing time-series variations of information about the master of the bus.

17. The information processing apparatus according to claim 1,
wherein the operating state includes a state of read or a state of write for data, and
wherein the inoperative state includes at least one of the following: a refresh inoperative state, a Read-to-Write switching inoperative state, a Write-to-Read switching inoperative state, an activate inoperative state, a precharge inoperative state, a Write-to-Precharge inoperative state, or a Read-to-Precharge inoperative state.

18. The information processing apparatus according to claim 1, wherein, based on designation of timing, detecting includes controlling detection start and detection end, the first classification unit controls classification start and classification end, the second classification controls classification start and classification end, and causing the statistical information to be displayed includes limiting a time range of displaying.

19. The information processing apparatus according to claim 1, wherein, in a case where the first classification detects, as an error, a case where, with respect to a predetermined bank included in the at least one bank, a preceding first control command and a subsequent second control command are detected, there is a constraint requiring that only a predetermined period be interposed between the preceding first control command and the subsequent second control command, and the subsequent second control command has been detected in a period shorter than the predetermined period for the constraint.

20. A method for an information processing apparatus, the method comprising:
detecting an event which causes a state of at least one bank constituting dynamic random access memory (DRAM) to transition;
classifying, as a first classification, the state of the at least one bank based on the detected event;
classifying, as a second classification, a state of the DRAM based on the state of the at least one bank; and
causing statistical information that is based on the state of the at least one bank or the state of the DRAM to be displayed with respect to a predetermined unit time,
wherein the state of the at least one bank and the state of the DRAM each includes at least one of the following: an operating state, in which data is being transferred, an inoperative state, in which transfer of data is not possible due to a predetermined constraint, or a pause state, in which, although there is no constraint, data is not being transferred.

* * * * *